United States Patent
Iwai et al.

(10) Patent No.: US 12,255,080 B2
(45) Date of Patent: Mar. 18, 2025

(54) SEMICONDUCTOR MANUFACTURING APPARATUS AND METHOD OF MANUFACTURING SEMICONDUCTOR DEVICE USING THE SAME, AND SEMICONDUCTOR DEVICE

(71) Applicant: Mitsubishi Electric Corporation, Tokyo (JP)

(72) Inventors: Takamasa Iwai, Tokyo (JP); Yuichiro Suzuki, Tokyo (JP); Akitoshi Shirao, Tokyo (JP); Akira Kosugi, Tokyo (JP); Junji Fujino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 476 days.

(21) Appl. No.: 17/636,650

(22) PCT Filed: Sep. 29, 2020

(86) PCT No.: PCT/JP2020/036886
§ 371 (c)(1),
(2) Date: Feb. 18, 2022

(87) PCT Pub. No.: WO2021/070677
PCT Pub. Date: Apr. 15, 2021

(65) Prior Publication Data
US 2022/0293434 A1   Sep. 15, 2022

(30) Foreign Application Priority Data
Oct. 7, 2019 (JP) .................. 2019-184617

(51) Int. Cl.
*H01L 21/56* (2006.01)
*H01L 21/48* (2006.01)
(Continued)

(52) U.S. Cl.
CPC ...... *H01L 21/565* (2013.01); *H01L 21/67126* (2013.01); *H01L 23/293* (2013.01);
(Continued)

(58) Field of Classification Search
CPC ............ H01L 21/565; H01L 21/67126; H01L 23/49575
See application file for complete search history.

(56) References Cited

U.S. PATENT DOCUMENTS 6,002,166 A * 12/1999 Noda ................ H01L 23/49575
257/691
8,349,661 B2   1/2013 Okada et al.
(Continued)

FOREIGN PATENT DOCUMENTS

DE   112017007135 T5   11/2019
JP   H02109343 A    4/1990
(Continued)

OTHER PUBLICATIONS

International Search Report (PCT/ISA/210) with translation and Written Opinion (PCT/ISA/237) mailed on Dec. 15, 2020, by the Japan Patent Office as the International Searching Authority for International Application No. PCT/JP2020/036886. (13 pages).
(Continued)

*Primary Examiner* — Erik Kielin
(74) *Attorney, Agent, or Firm* — Buchanan Ingersoll & Rooney PC

(57) ABSTRACT

A mold die includes a resin injection gate through which fluid resin serving as mold resin is injected toward a cavity, a resin reservoir to store the fluid resin flowing through the cavity, and a resin reservoir gate. The resin reservoir is provided on the side opposite to the side on which the resin injection gate is arranged with the cavity interposed. The resin reservoir gate communicatively connects the cavity and the resin reservoir. The opening cross-sectional area of the resin reservoir gate is smaller than the opening cross-sectional area of the resin injection gate.

18 Claims, 42 Drawing Sheets

(51) Int. Cl.
  *H01L 21/67* (2006.01)
  *H01L 23/00* (2006.01)
  *H01L 23/29* (2006.01)
  *H01L 23/31* (2006.01)
  *H01L 23/495* (2006.01)
  *H01L 23/498* (2006.01)

(52) U.S. Cl.
  CPC ........ *H01L 23/3142* (2013.01); *H01L 23/315* (2013.01); *H01L 23/49575* (2013.01); *H01L 23/49861* (2013.01); *H01L 21/4839* (2013.01); *H01L 23/49513* (2013.01); *H01L 23/49568* (2013.01); *H01L 24/32* (2013.01); *H01L 24/48* (2013.01); *H01L 24/73* (2013.01); *H01L 2224/32245* (2013.01); *H01L 2224/48137* (2013.01); *H01L 2224/48245* (2013.01); *H01L 2224/73265* (2013.01); *H01L 2924/1811* (2013.01); *H01L 2924/182* (2013.01); *H01L 2924/183* (2013.01); *H01L 2924/186* (2013.01)

(56) References Cited

U.S. PATENT DOCUMENTS

| 2002/0020929 | A1* | 2/2002 | Kasuga | H01L 21/565 257/692 |
| 2011/0133329 | A1* | 6/2011 | Takahashi | H01L 23/13 438/122 |
| 2012/0018906 | A1* | 1/2012 | Mino | H01L 23/3107 257/E23.116 |
| 2012/0178220 | A1* | 7/2012 | Okada | H01L 23/3128 257/E21.502 |
| 2016/0343644 | A1* | 11/2016 | Kawashima | H01L 23/4334 |
| 2017/0004981 | A1* | 1/2017 | Sakamoto | H01L 23/49575 |
| 2019/0371625 | A1 | 12/2019 | Sakamoto | |

FOREIGN PATENT DOCUMENTS

| JP | H05218122 A | 8/1993 |
| JP | H05326594 A | 12/1993 |
| JP | H07112453 B2 | 5/1995 |
| JP | 2007042709 A | 2/2007 |
| JP | 2010263066 A | 11/2010 |
| JP | 2012146799 A | 8/2012 |
| JP | 2013207083 A | 10/2013 |
| JP | 2019-009184 A | 1/2019 |

OTHER PUBLICATIONS

Office Action issued in corresponding Japanese Patent Application No. 2021-551305, mailed Jan. 24, 2023, 6 pages including 3 pages of English translation.

Office Action dated Apr. 25, 2024, issued in the corresponding German Patent Application No. 11 2020 004 809.8, 18 pages including 9 pages of English Translation.

Office Action issued in corresponding Japanese Patent Application No. 2021-551305, mailed on Nov. 15, 2022, 16 pages including 8 pages of English Translation.

First Office Action dated Dec. 6, 2024, issued in the corresponding Chinese Patent Application No. 202080069138.0, 14 pages including 7 pages of English Translation.

* cited by examiner

SEMICONDUCTOR MANUFACTURING APPARATUS AND METHOD OF MANUFACTURING SEMICONDUCTOR DEVICE USING THE SAME, AND SEMICONDUCTOR DEVICE

TECHNICAL FIELD

The present disclosure relates to a semiconductor manufacturing apparatus and a method of manufacturing a semiconductor device using the same, and a semiconductor device.

BACKGROUND ART

Power semiconductor devices have been widely used in all sorts of products ranging from industrial devices to home appliances and information terminals. Modules mounted on especially home appliances are required to be downsized. Power semiconductor devices handle high voltage and large current and thus generates much heat. In order to allow a fixed amount of current to flow, it is necessary to efficiently dissipate heat to the outside and keep electrical insulation from the outside.

In a power semiconductor device, a lead frame including a die pad having a power semiconductor element and the like thereon is sealed together with the power semiconductor element with a sealing material. Transfer molding is employed for sealing with a sealing material. In transfer molding, a lead frame is arranged in a mold die, and a sealing material is injected into the mold die to seal the power semiconductor element and the like.

In a power semiconductor device, heat produced from the power semiconductor element need to be dissipated to the outside efficiently. The die pad having the power semiconductor element is therefore arranged such that the thickness of the sealing material covering the side opposite to the side having the power semiconductor element is smaller than the thickness of the sealing material covering the side having the power semiconductor element.

When a lead frame is arranged in a mold die, the distance (height) of a lower region from the side opposite to the side having the power semiconductor element in the die pad to the lower die (the bottom surface of the cavity) is shorter than the distance (height) of an upper region from the side having the power semiconductor element in the die pad to the upper die (the upper surface of the cavity).

CITATION LIST

Patent Literature

PTL 1: Japanese Patent Laying-Open No. H5-326594

SUMMARY OF INVENTION

Technical Problem

When a sealing material is injected into a mold die, air bubbles are more likely to be trapped in the lower region in which the distance in the height direction is relatively short, compared with the upper region in which the distance in the height direction is relatively long, and voids may remain in the sealing material. If voids remain, electrical insulation properties of the sealing material may deteriorate, and the reliability of the power semiconductor device may deteriorate. Measures against it have been taken (for example, PTL 1).

The present disclosure is made in view of such a situation. One object of the present disclosure is to provide a semiconductor manufacturing apparatus that suppress voids remaining in the sealing material. Another object is to provide a method of manufacturing a semiconductor device using such a semiconductor manufacturing apparatus. Yet another object is to provide a semiconductor device manufactured by such a manufacturing method.

Solution to Problem

A semiconductor manufacturing apparatus according to the present disclosure is a semiconductor manufacturing apparatus in which a cavity extending in a first direction is formed with a mold die including a lower die and an upper die, a lead frame provided with a semiconductor element is arranged in the cavity, and a sealing material is injected into the cavity to seal the lead frame together with the semiconductor element. The semiconductor manufacturing apparatus includes a sealing material injection gate, at least one sealing material reservoir, and a sealing material reservoir gate. The sealing material injection gate allows the sealing material to be injected into the cavity. The at least one sealing material reservoir is arranged on the other side at a distance in the first direction from one side on which the sealing material injection gate is arranged with the cavity interposed. The sealing material reservoir stores the sealing material flowing through the cavity. The sealing material reservoir gate communicatively connects the cavity and the sealing material reservoir. The sealing material injection gate has a first opening cross-sectional area. The sealing material reservoir gate has a second opening cross-sectional area. The second opening cross-sectional area is smaller than the first opening cross-sectional area.

A method of manufacturing a semiconductor device according to the present disclosure includes the following steps. A lead frame is prepared. A semiconductor element is mounted on the lead frame. A mold die is prepared that includes a lower die and an upper die and has a cavity formed with the lower die and the upper die. The lead frame provided with the semiconductor element is arranged in the mold die.

A sealing material is injected into the cavity. The mold die is detached. The step of preparing a mold die includes the step of preparing the mold die including a sealing material injection gate, at least one sealing material reservoir, and a sealing material reservoir gate. The sealing material injection gate allows a sealing material to be injected toward the cavity. The at least one sealing material reservoir is provided on a second side opposite to a first side on which the sealing material injection gate is arranged with the cavity interposed. The sealing material reservoir stores the sealing material flowing through the cavity. The sealing material reservoir gate communicatively connects the cavity and the sealing material reservoir. The step of injecting the sealing material into the cavity includes the step of injecting the sealing material until the sealing material filling the cavity flows into the sealing material reservoir.

A semiconductor device according to the present disclosure includes a lead terminal, a die pad, a semiconductor element, and a sealing material. The die pad is connected to the lead terminal. The semiconductor element is mounted on the die pad. The sealing material seals the die pad and the semiconductor element such that a part of the lead terminal is exposed. The sealing material has a first side portion and a second side portion opposed to each other at a distance from each other in a first direction. The first side portion has a first sealing material trace. The second side portion has at least one second sealing material trace.

Advantageous Effects of Invention

In the semiconductor manufacturing apparatus according to the present disclosure, a mold die includes a sealing material injection gate, at least one sealing material reservoir, and a sealing material reservoir gate. This configuration can suppress voids remaining in the sealing material injected into the cavity.

In the method of manufacturing a semiconductor device according to the present disclosure, a mold die including a sealing material injection gate, at least one sealing material reservoir, and a sealing material reservoir gate is used to suppress voids remaining in the sealing material.

In the semiconductor device according to the present disclosure, the semiconductor manufacturing apparatus including the mold die described above is used to suppress voids remaining in the sealing material and improve electrical insulation.

DESCRIPTION OF EMBODIMENTS

First Embodiment

A semiconductor device and a semiconductor manufacturing apparatus according to a first embodiment will be described.
(Semiconductor Device)

Figure 1:
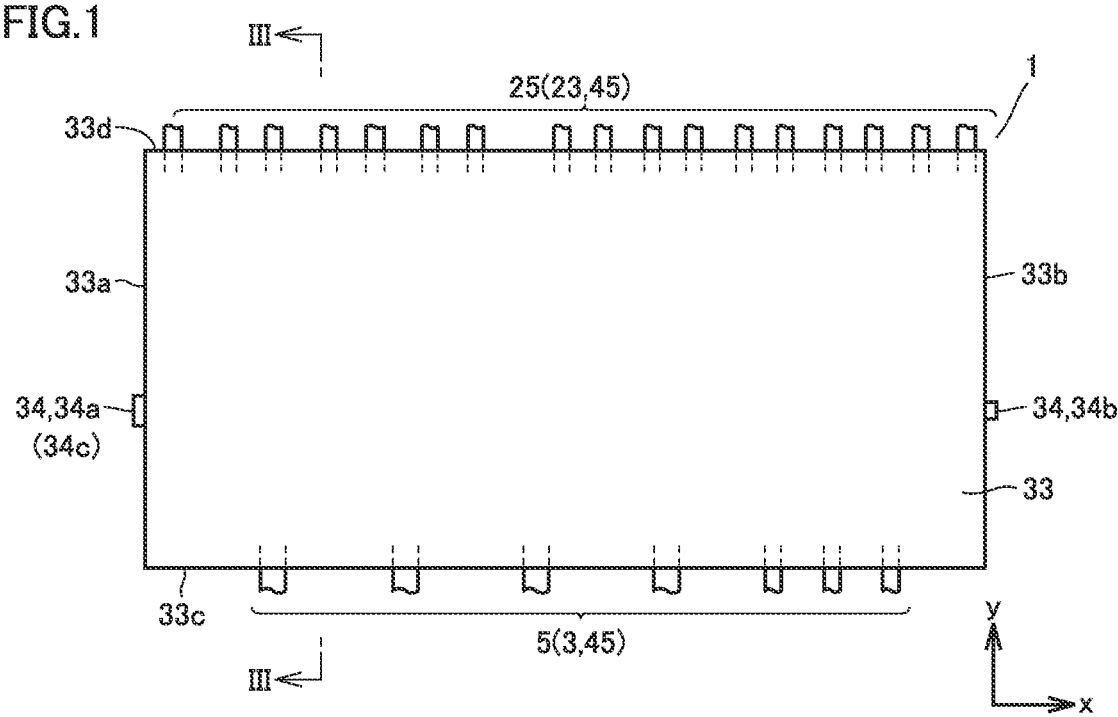
FIG. 1 is a first plan view of an example of the appearance of a semiconductor device according to a first embodiment.
Figure 2:
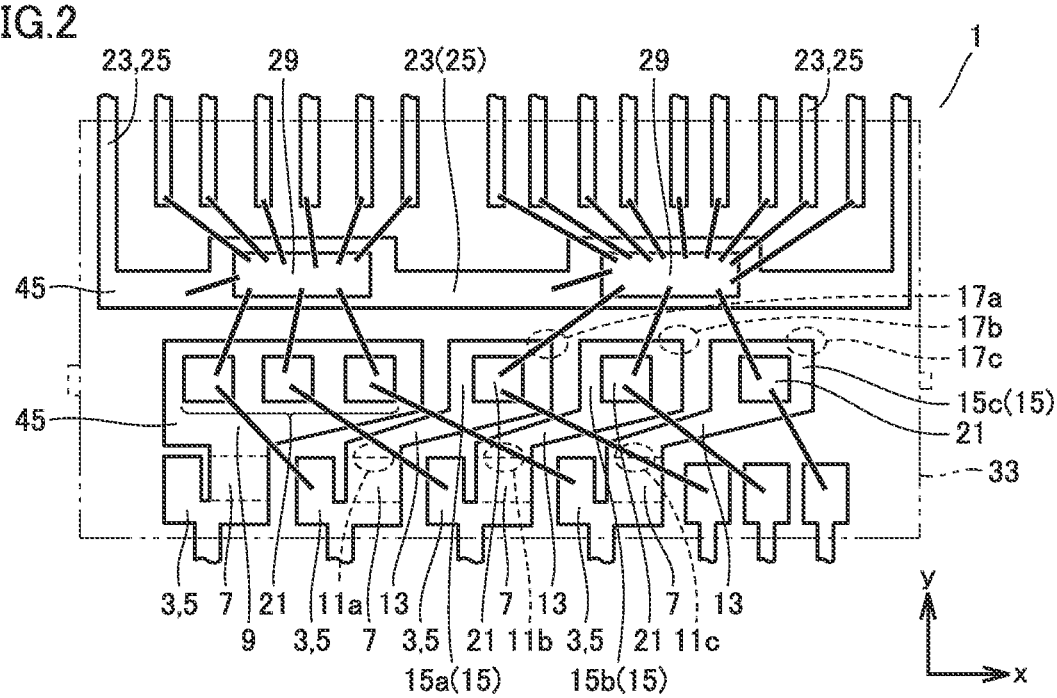
FIG. 2 is a plan view of an internal structure of the semiconductor device shown in FIG. 1 in the same embodiment.
Figure 3:
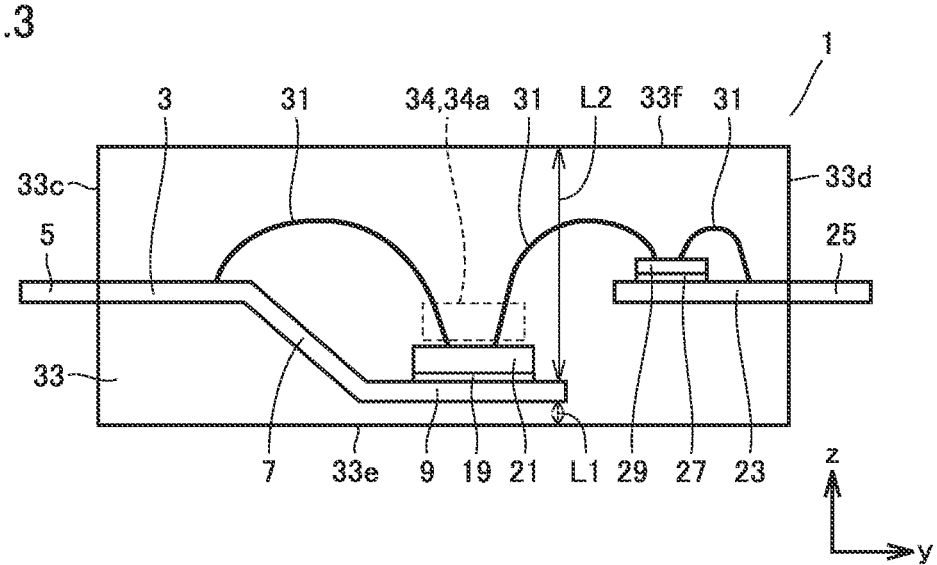
FIG. 3 is a cross-sectional view taken along line III-III shown FIG. 1 in the same embodiment.

First of all, a semiconductor device manufactured by a semiconductor manufacturing apparatus will be described. As shown in FIG. 1, FIG. 2, and FIG. 3, in a semiconductor device 1 as a power semiconductor device, power semiconductor elements 21 and IC elements 29 are mounted as semiconductor elements on a lead frame 45. Lead frame 45 is sealed together with power semiconductor elements 21 and the like with a mold resin 33 as a sealing material.

Mold resin 33 has a first side portion 33a, a second side portion 33b, a third side portion 33c, a fourth side portion 33d, a first main surface 33e, and a second main surface 33f. First side portion 33a and second side portion 33b are opposed to each other at a distance from each other in the X-axis direction and each extend in the Y-axis direction. Third side portion 33c and fourth side portion 33d are opposed to each other at a distance from each other in the Y-axis direction and each extend in the X-axis direction. First main surface 33e and second main surface 33f are opposed to each other at a distance from each other in the Z-axis direction.

On a surface of mold resin 33, a resin trace 34 is left as a result of injection of fluid resin serving as mold resin 33 into a mold die. First side portion 33a has a resin injection trace 34a as a first sealing material trace. As will be described later, resin injection trace 34a is a resin trace left at a position corresponding to a resin injection gate through which a mold resin (fluid resin) is injected.

Second side portion 33b has a resin reservoir trace 34b as a second sealing material trace. As will be described later, resin reservoir trace 34b is a resin trace left at a position corresponding to a resin reservoir gate. Here, resin reservoir trace 34b is at a position opposed to resin injection trace 34a in the X-axis direction in the second side portion. The area of resin reservoir trace 34b is smaller than the area of resin injection trace 34a.

Figure 45:
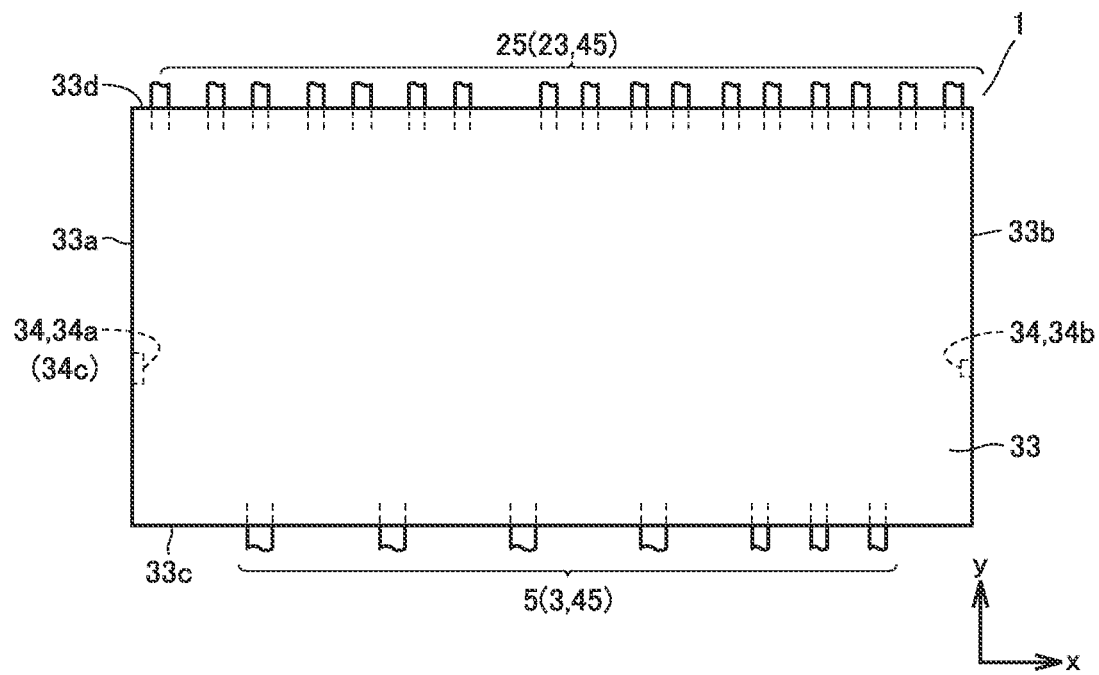
FIG. 45 is a plan view of another example of the appearance of a semiconductor device in the embodiments.
Figure 46:
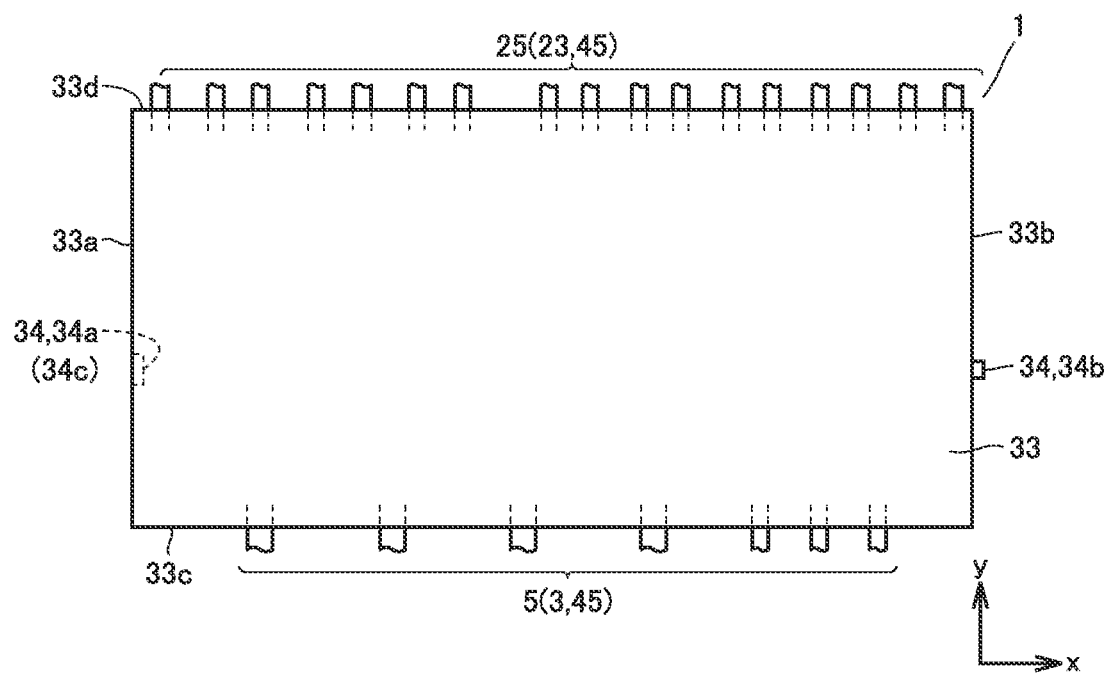
FIG. 46 is a plan view of yet another example of the appearance of a semiconductor device in the embodiments.

FIG. 1 shows convex resin trace 34 protruding from a surface of mold resin 33. Resin trace 34 may be concave resin trace 34 depressed from a surface of mold resin 33, depending on how mold resin 33 is detached from the mold die. In this case, as shown in FIG. 45, concave resin injection trace 34a is left on first side portion 33a. Concave resin reservoir trace 34b is left on second side portion 33b. Furthermore, as shown in FIG. 46, for example, concave resin injection trace 34a may be left on first side portion 33a, and convex resin reservoir trace 34b may be left on second side portion 33b. Convex resin injection trace 34a may be left, and concave resin reservoir trace 34b may be left (not shown).

Lead frame 45 includes power lead terminals 5, power leads 3, lead step portions 7, a large die pad 9, small die pads 15 (15a, 15b, 15c), IC leads 23, and IC lead terminals 25. Small die pads 15 include three small die pads 15a, 15b, and 15c. Large die pad 9 and the like on which power semiconductor elements 21 are mounted are arranged at a position lower than the position (height) in the Z-axis direction of power lead 3. Large die pad 9 and the like are arranged on a side closer to first main surface 33e in mold resin 33 relative to the position in the Z-axis direction of power lead 3.

The distance from large die pad 9 to first main surface [11e] 33e is defined as distance L1. The distance from large die pad 9 to second main surface 33f is defined as distance L2. Distance L1 is shorter than distance L2. More specifically, the thickness of a portion of mold resin 33 covering the side (first surface) opposite to the side on which power semiconductor element 21 is mounted in large die pad 9 is smaller than the thickness of a portion of mold resin 33 covering the side (second surface) on which power semiconductor element 21 is mounted in large die pad 9. As will be described later, a mold die has a resin reservoir gate and a resin reservoir in order to prevent voids in a portion of mold resin 33 covering the first main surface of large die pad 9.

For example, three power semiconductor elements 21 are mounted on large die pad 9. Each of three power semiconductor elements 21 is bonded to large die pad 9 by conductive adhesive 19. For example, one power semiconductor element 21 is mounted on each of small die pads 15a, 15b, and 15c. One power semiconductor element 21 is bonded to each of small die pads 15a, 15b, and 15c by conductive adhesive (not shown).

Power semiconductor element 21 is, for example, an insulated gate bipolar transistor (IGBT) or a metal-oxide-semiconductor field-effect transistor (MOSFET). For example, solder or silver paste is employed as conductive adhesive 19.

Large die pad 9 is connected to power lead 3 through lead step portion 7. Each of small die pads 15a, 15b, and 15c has a bending portion 13. Bending portion 13 has an X-direction component and a Y-direction component and extends obliquely.

It is preferable that the value of the X coordinate of a distal end 17a of small die pad 15a is greater than the value of the X coordinate of a terminal end 11a of lead step portion 7. It is preferable that the value of the X coordinate of a distal end 17b of small die pad 15b is greater than the value of the X coordinate of a terminal end 11b of lead step portion 7. It is preferable that the value of the X coordinate of a distal end 17c of small die pad 15c is greater than the value of the X coordinate of a terminal end 11c of lead step portion 7.

Because of bending portion 13, even when the space to the side (the X-axis negative direction) of large die pad 9 is relatively narrow, one power semiconductor element 21 can be mounted on each of three small die pads 15a, 15b, and 15c while three power semiconductor elements 21 are mounted on large die pad 9. With this configuration, power semiconductor elements 21 can be arranged efficiently in a limited capacity of semiconductor device 1, contributing to size reduction of semiconductor device 1.

Each of small die pads 15a, 15b, and 15c is connected to power lead 3 through bending portion 13 and lead step portion 7 of small die pad 15. Power lead 3 is connected to power lead terminal 5. Power lead terminal 5 protrudes outward from third side portion 33c of mold resin 33.

For example, two IC elements 29 are mounted on IC lead 23. Each of two IC elements 29 is bonded to IC lead 23 by conductive adhesive 27. IC lead 23 is connected to IC lead terminal 25. IC lead terminal 25 protrudes outward from fourth side portion 33d of mold resin 33.

The corresponding power semiconductor element 21 and IC element 29 are electrically connected by wire 31. The corresponding power semiconductor element 21 and power lead 3 are electrically connected by wire 31. The corresponding IC element 29 and IC lead 23 are electrically connected by wire 31.

Wire 31 is formed of metal such as gold, silver, copper, or aluminum. In this way, an electrical circuit is formed on lead frame 45. The material or the thickness of wire 31 can be changed according to a portion to connect. The portion connected to wire 31 may be processed, for example, coated for increasing the bonding strength of wire 31.

Figure 4:
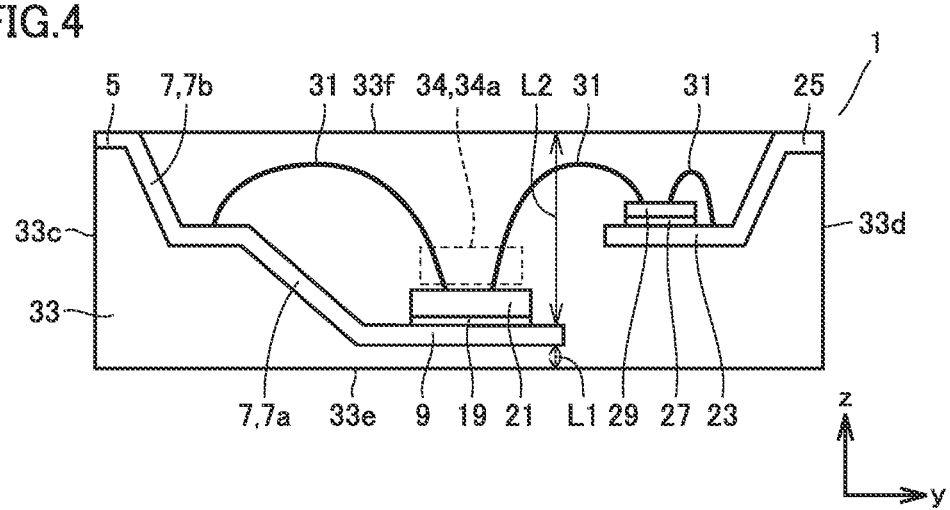
FIG. 4 is a cross-sectional view of the semiconductor device according to a first modification in the same embodiment.

In semiconductor device 1 described above, the structure in which power lead terminal 5 and IC lead terminal 25 protrude from mold resin 33 has been illustrated by example. As shown in FIG. 4, semiconductor device 1 may have a structure in which power lead terminal 5 and IC lead terminal 25 are exposed on a surface of mold resin 33 such that they do not protrude from mold resin 33. In this case, in order to connect wire 31, it is preferable that two steps including a lead step portion 7a and a lead step portion 7b are formed as lead step portion 7 connected to large die pad 9.

Figure 5:
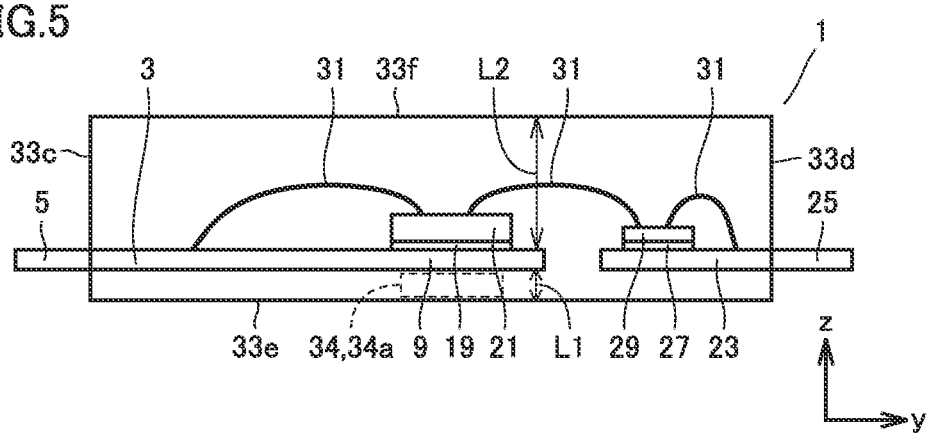
FIG. 5 is a cross-sectional view of the semiconductor device according to a second modification in the same embodiment.

As shown in FIG. 5, in a case of semiconductor device 1 in which a relatively low voltage is applied to power lead terminal 5, the position in the height direction of power lead terminal 5 may be the same position as the position in the height direction of large die pad 9. A voltage applied to power lead terminal 5 is relatively low, for example, when the voltage is 24 V. In this case, the step of forming lead step portion 7 in the lead frame is not necessary, thereby contributing to reduction in production cost.

As will be described later, a mold die has a plurality of cavities into which mold resin is injected. In some mold dies, the cavities include, for example, a first cavity and a second cavity. The first cavity and the second cavity are connected through a runner. The mold resin injected into the first cavity is injected to the second cavity through the runner. Part of the mold resin injected into the second cavity flows through the resin reservoir gate to the resin reservoir.

Figure 6:
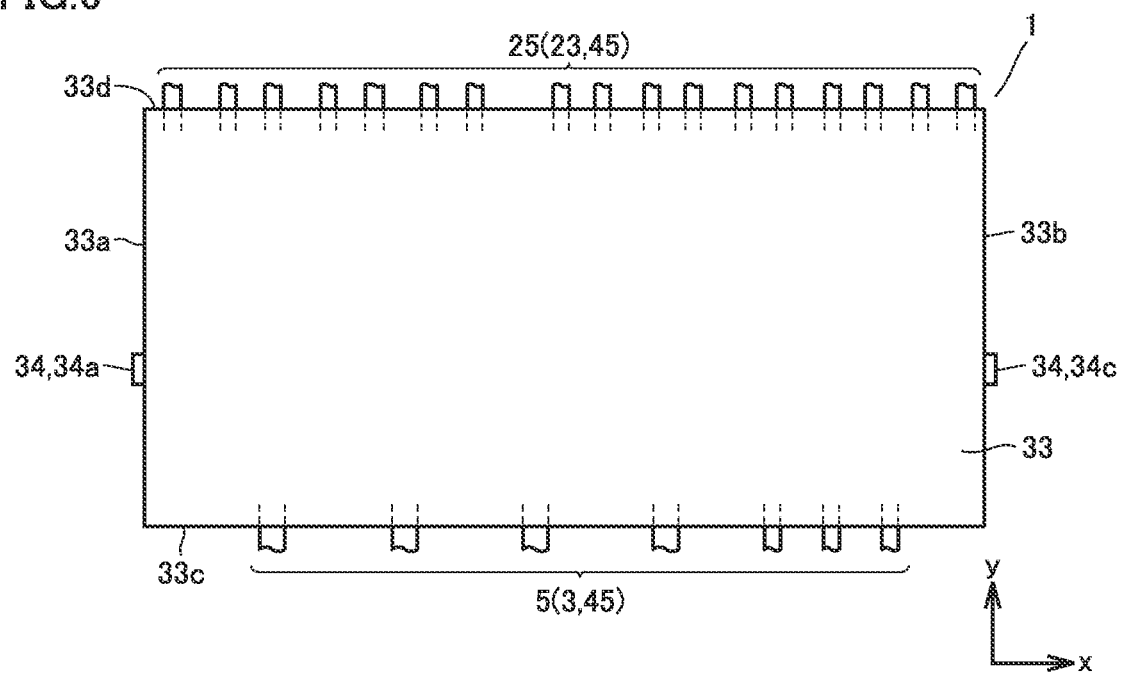
FIG. 6 is a second plan view of the appearance of the semiconductor device in the same embodiment.

A resin trace attributable to the resin injection gate and a resin trace attributable to the runner are left on a surface of the semiconductor device sealed with the mold resin injected to the first cavity. As shown in FIG. 6, resin injection trace 34a is left as resin trace 34 attributable to the resin injection gate. A runner trace 34c is left as resin trace 34 attributable to the runner. The area of resin injection trace 34a and the area of runner trace 34c are substantially the same.

A resin trace attributable to the runner and a resin trace attributable to the resin reservoir gate are left on a surface of the semiconductor device sealed with the mold resin injected to the second cavity. As shown in FIG. 1, resin injection trace 34a is left as resin trace 34 attributable to the runner trace. Resin reservoir trace 34b is left as resin trace 34 attributable to the resin reservoir gate.

Since the mold resin is injected from the runner into the second cavity, runner trace 34c can be regarded as resin injection trace 34a. The area of resin reservoir trace 34b is smaller than the area of runner trace 34c (resin injection trace 34a). The mold die serving as a semiconductor manufacturing apparatus will now be described.

(Mold Die)

Figure 7:
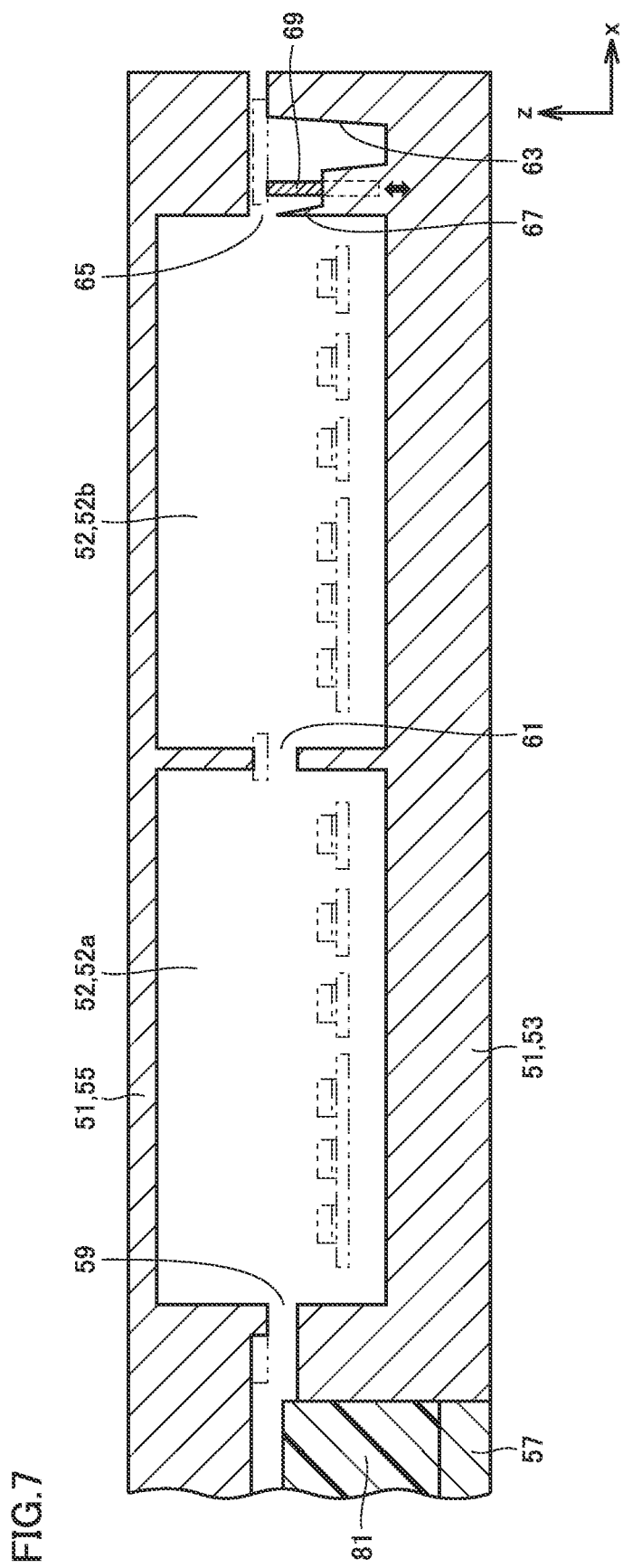
FIG. 7 is a cross-sectional view of a mold die including a lower die and an upper die in the same embodiment.
Figure 8:
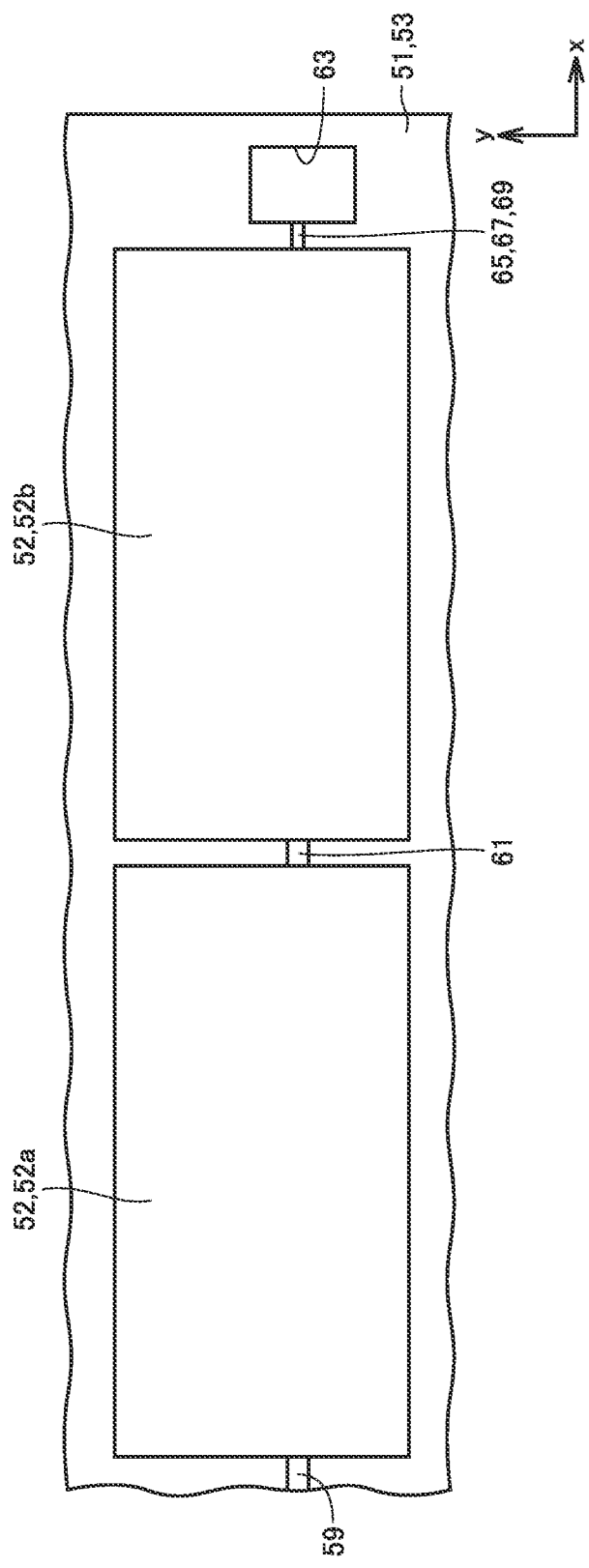
FIG. 8 is a plan view of an internal structure of the lower die in the same embodiment.
Figure 9:
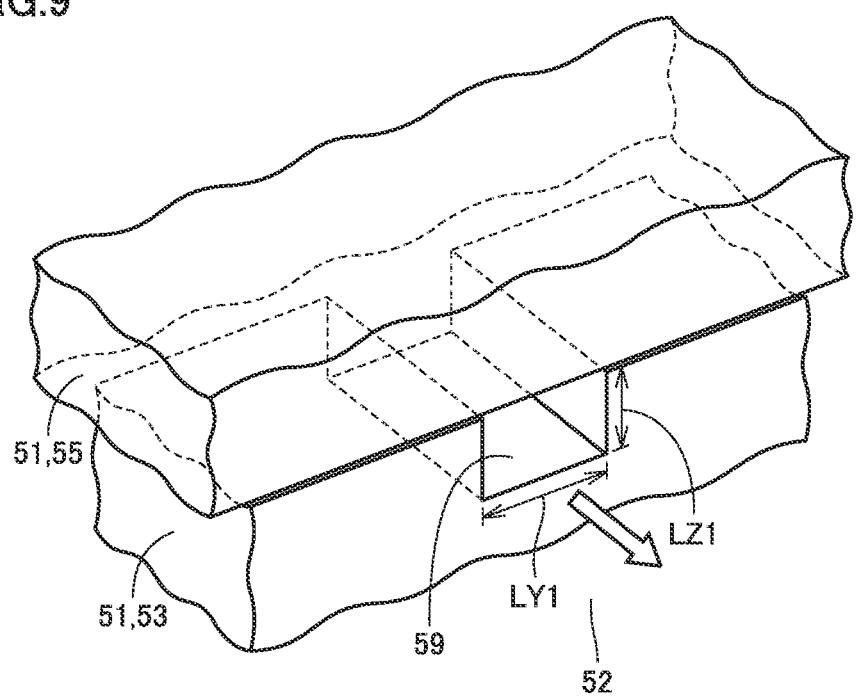
FIG. 9 is a partially-enlarged cross-sectional perspective view of a rein injection gate in the mold die in the same embodiment.

As shown in FIG. 7 and FIG. 8, mold die 51 has an upper die 53 and a lower die 55. Mold die 51 has a cavity 52. Cavity 52 extends in the X-axis direction as a first direction. Cavity 52 includes, for example, a first cavity 52a and a second cavity 52b. As shown in FIG. 7 and FIG. 9, mold die 51 has a resin injection gate 59 through which mold resin is injected into first cavity 52a. Mold die 51 has a runner 61 communicatively connecting first cavity 52a and second cavity 52b. The mold resin injected into first cavity 52a is also injected into second cavity 52b through runner 61.

Figure 10:
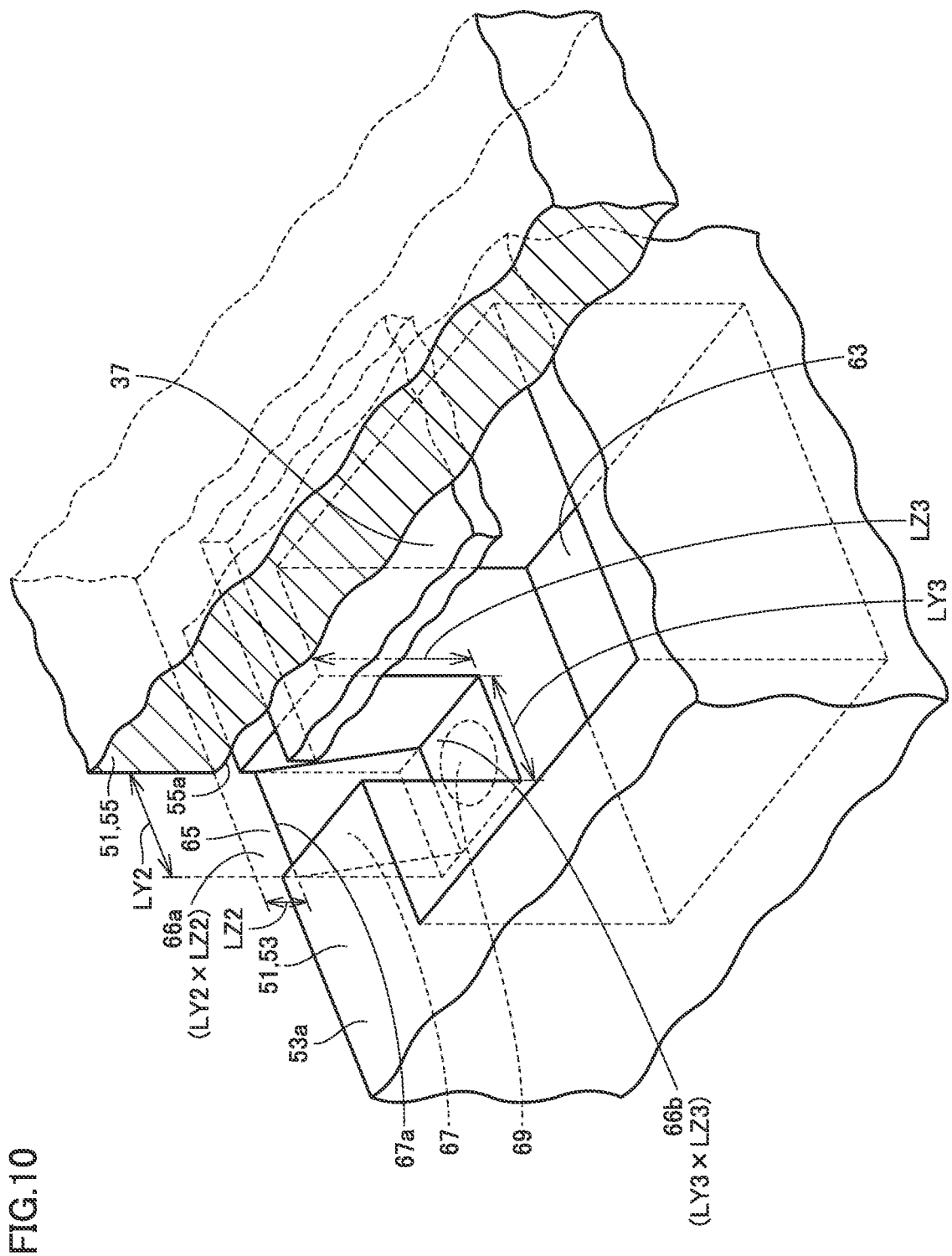
FIG. 10 is a first partially-enlarged cross-sectional perspective view of a resin reservoir gate in the mold die in the same embodiment.

As shown in FIG. 7 and FIG. 10, mold die 51 has a resin reservoir 63 into which part of fluid resin serving as mold resin injected into second cavity 52b flows. Mold die 51 has a resin reservoir gate 65 communicatively connecting second cavity 52b and resin reservoir 63. As shown in FIG. 8 and the like, resin reservoir 63 and resin reservoir gate 65 are formed, fur example, in lower die 53.

Resin reservoir 63 is arranged on the other side at a distance in the X-axis direction from one side on which resin injection gate 59 is arranged with cavity 52 interposed. Resin reservoir gate 65 includes an inclined portion 67 and a movable pin 69 serving as a shutter. Movable pin 69 is movable in the vertical direction (the Z-axis direction).

As shown in FIG. 9 and FIG. 10, the opening cross-sectional area (for example, width LY2×height LZ2) as a second opening cross-sectional area at a portion where inclined portion 67 is located in resin reservoir gate 65 is set to be smaller than the opening cross-sectional area (for example, width LY1×height LZ1) as a first opening cross-sectional area of resin injection gate 59.

In a state in which movable pin 69 is accommodated in lower die 53, the distal end portion of movable pin 69 is at the same position as the surface of lower die 53. Movable pin 69 can move in such a manner as to protrude in the height direction (the Z-axis direction) from the state in which it is accommodated in lower die 53. It is required that wear of movable pin 69 moving in the Z-axis direction should be suppressed. Movable pin 69 is also required to have a function as a shutter to block the flow of mold resin. It is therefore preferable that the distal end of movable pin

69 in a protruding state is, for example, about 50 μm away from a frame 37 (lower surface).

Figure 11:
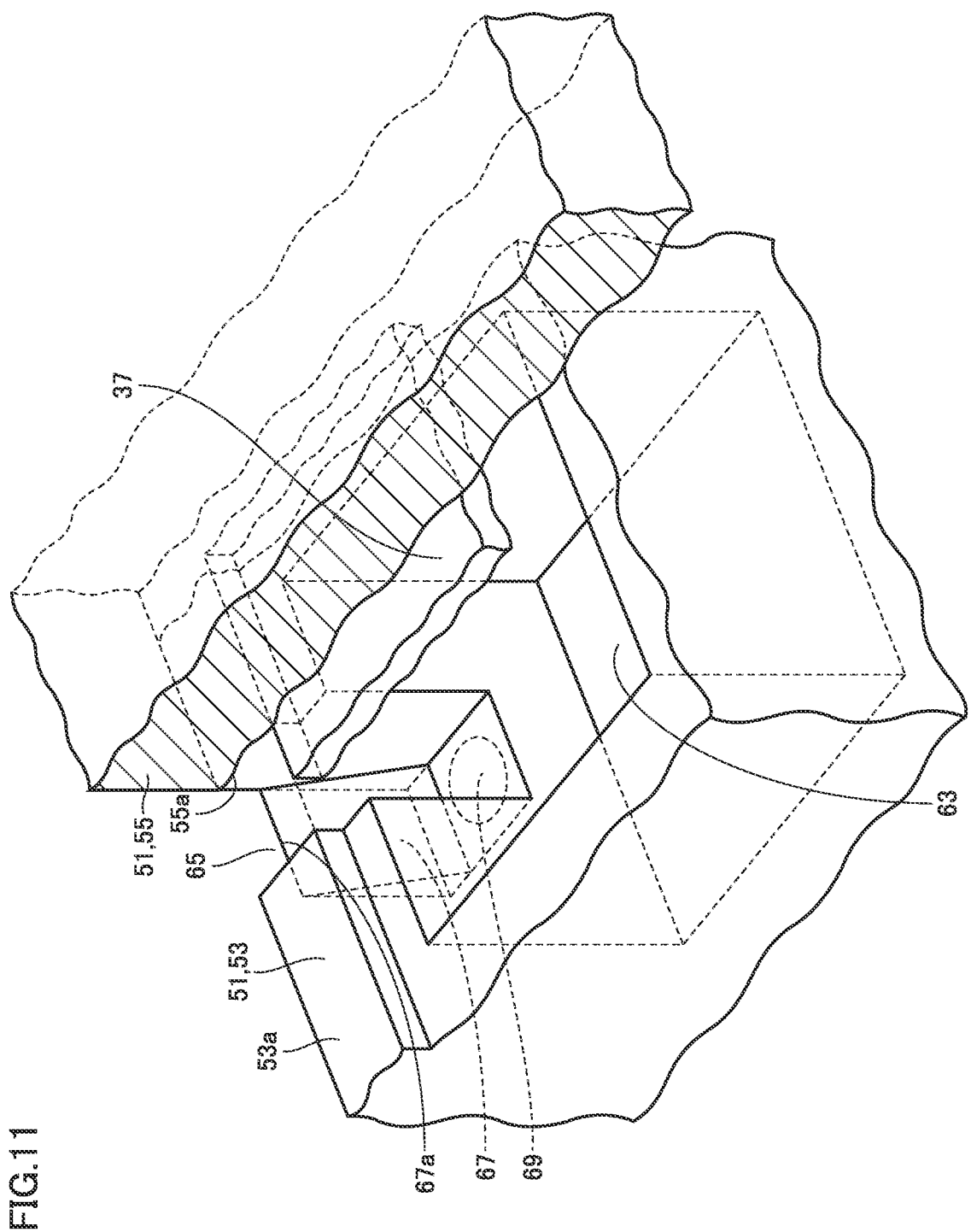
FIG. 11 is a second partially-enlarged cross-sectional perspective view of the resin reservoir gate in the mold die in the same embodiment.

FIG. 10 shows mold die 51 in such a manner that a gap corresponding to the thickness of frame 37 is formed between lower die 53 (upper surface 53*a*) and the upper die (lower surface 55*a*) in a state in which frame 37 in the lead frame is held between lower die 53 and upper die 55. Mold die 51 is not limited to such a manner and, as shown in FIG. 11, for example, mold die 51 may have a portion where lower die 53 (upper surface 53*a*) and upper die 55 (lower surface 55*a*) abut on each other.

Figure 12:
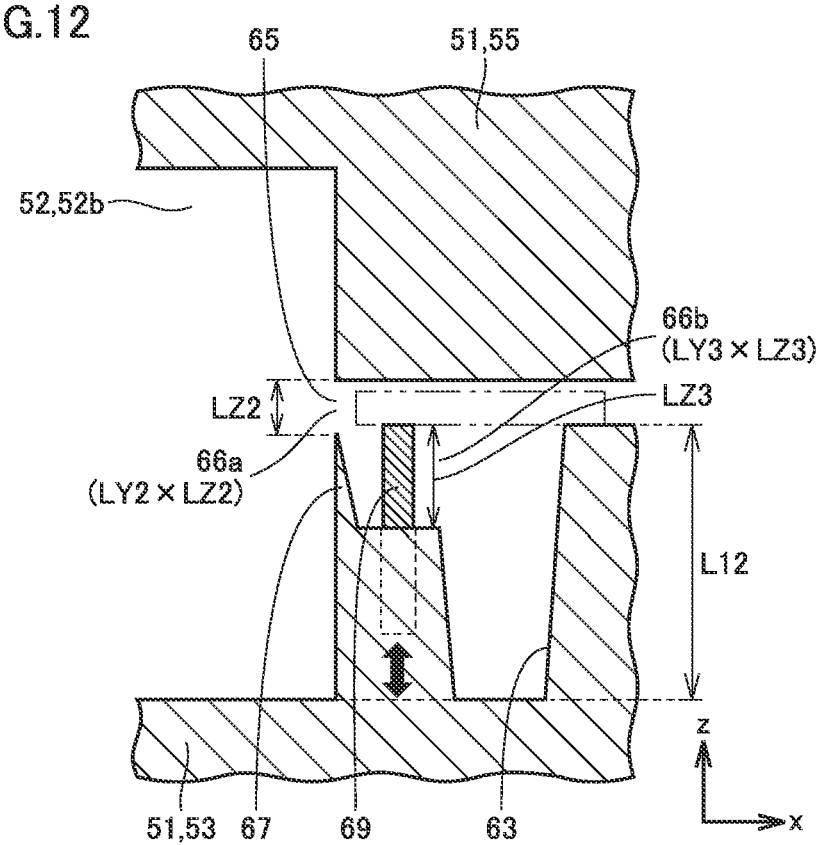
FIG. 12 is a partially-enlarged cross-sectional view of the resin reservoir gate in the mold die in the same embodiment.

The structure of resin reservoir gate 65 and the like will be described in more detail. As shown in FIG. 10 and FIG. 12, inclined portion 67 is inclined so as to descend from a top portion 67*a* toward resin reservoir 63. The opening cross-sectional area (for example, LY3×LZ3) as a third opening cross-sectional area immediately before the flow into resin reservoir 63 in resin reservoir gate 65 is set to be larger than the opening cross-sectional area (for example, LY2×LZ2) of a portion where inclined portion 67 is located in resin reservoir gate 65. As will be described later, the provision of inclined portion 67 facilitates release of the hardened mold resin from lower die 53.

A portion 66*a* having the second opening cross-sectional area (LY2×LZ2) corresponds to a first part of the sealing material reservoir gate. A portion 66*b* having the third opening cross-sectional area (LY3×LZ3) corresponds to a second part of the sealing material reservoir gate.

In the step of sealing with mold resin, it is necessary that the mold resin (fluid resin) attempting to flow into resin reservoir 63 should not be left in resin reservoir 63. In order to suppress wear or breakage of movable pin 69, it is also necessary to reduce the distance by which movable pin 69 slides to upper die 55. Specifically, the height LZ2 (see FIG. 10) of a portion where inclined portion 67 is located is preferably, for example, about 300 to 500 μm. The height LZ3 (see FIG. 10) of a portion of resin reservoir gate 65 immediately before the mold resin flows into resin reservoir 63 is preferably about twice the height LZ2, preferably, for example, about 600 to 1000 μm.

Figure 13:
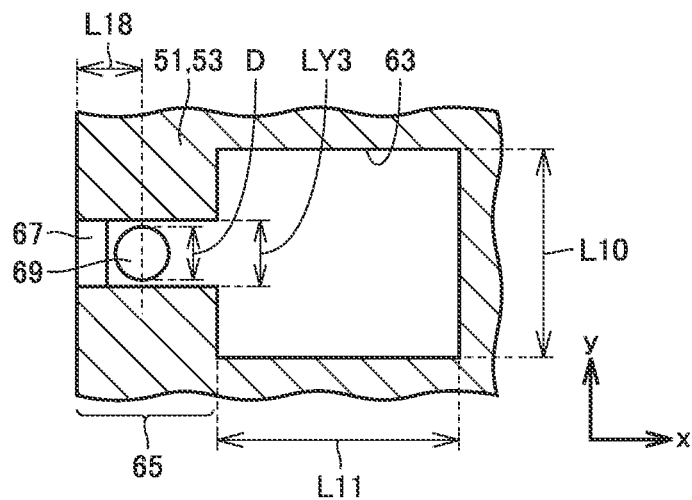
FIG. 13 is a partially-enlarged plan view of the resin reservoir gate in the mold die in the same embodiment.

It is required that sliding friction of movable pin 69 against lower die 53 during movement in the vertical direction should be reduced. As shown in FIG. 13, therefore, the cross-sectional shape (X-Y plane) of movable pin 69 is preferably, for example, circular or oval. The diameter D of movable pin 69 is preferably smaller than the width W in the Y direction of resin reservoir gate 65, for example, by about 30 μm so that the flow of the mold resin is minimized when movable pin 69 protrudes to the height immediately before coming into abutment with the frame.

The distance L18 from top portion 67*a* of inclined portion 67 to the center of movable pin 69 in resin reservoir gate 65 is preferably as short as possible within a distance in which movable pin 69 does not overlap inclined portion 67. When movable pin 69 is compared with the thrust valve described in PTL 1, movable pin 69 has a smaller diameter and is circular in cross section, whereby the sliding friction can be reduced, and movable pin 69 is less likely to be broken.

The width LY3 (the Y direction) of resin reservoir gate 65 is preferably as small as possible, preferably equal to or smaller than half the width LY1 (see FIG. 9) of resin injection gate 59 and the width of runner 61. The width LY3 of resin injection gate 59 is preferably, for example, about 0.5 to 1.5 mm since it is necessary to keep a cross section to some extent in order to release the mold resin flowing into resin reservoir 63 from lower die 53. On the other hand, the width W of resin reservoir gate 65 is preferably 500 μm or more so that the mold resin flowing into resin reservoir 63 is not left in lower die 53.

Compared with a structure according to a comparative example in which the width corresponding to the resin reservoir gate is the same as the width of the semiconductor device, the flow of the mold resin into resin reservoir 63 is suppressed, and cavity 52 can be reliably filled with the mold resin while the mold resin flowing into resin reservoir 63 is minimized. The capacity of resin reservoir 63 is adjusted by the length L11 (the X-axis direction), the length L10 (the Y-axis direction), and the length L12 (the Z-axis direction).

Figure 14:
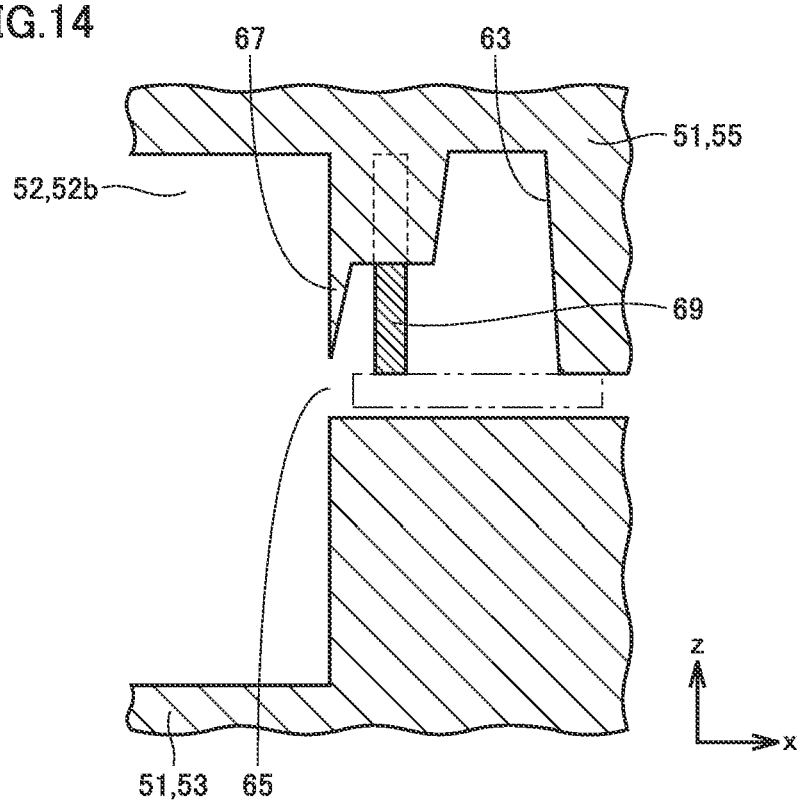
FIG. 14 is a partially-enlarged cross-sectional view of the resin reservoir gate in the mold die according to a modification in the same embodiment.

In mold die 51 described above, resin reservoir gate 65 and resin reservoir 63 are formed in lower die 53. As shown in FIG. 14, resin reservoir gate 65 and resin reservoir 63 may be formed in upper die 55 of mold die 51. In this case, movable pin 69 protrudes to a position immediately before coming into contact the frame from the state in which it is accommodated in upper die 55.

(Method of Manufacturing Semiconductor Device)

A method of manufacturing a semiconductor device using the mold die described above will now be described. First, lead frame 45 (see FIG. 15) is formed by etching a metal plate or blanking a metal plate. Large die pad 9, small die pads 15, IC leads 23, and the like are formed in lead frame 45. Next, a bending die is used to bend lead frame 50 to form lead step portion 7 (see FIG. 15).

Figure 15:
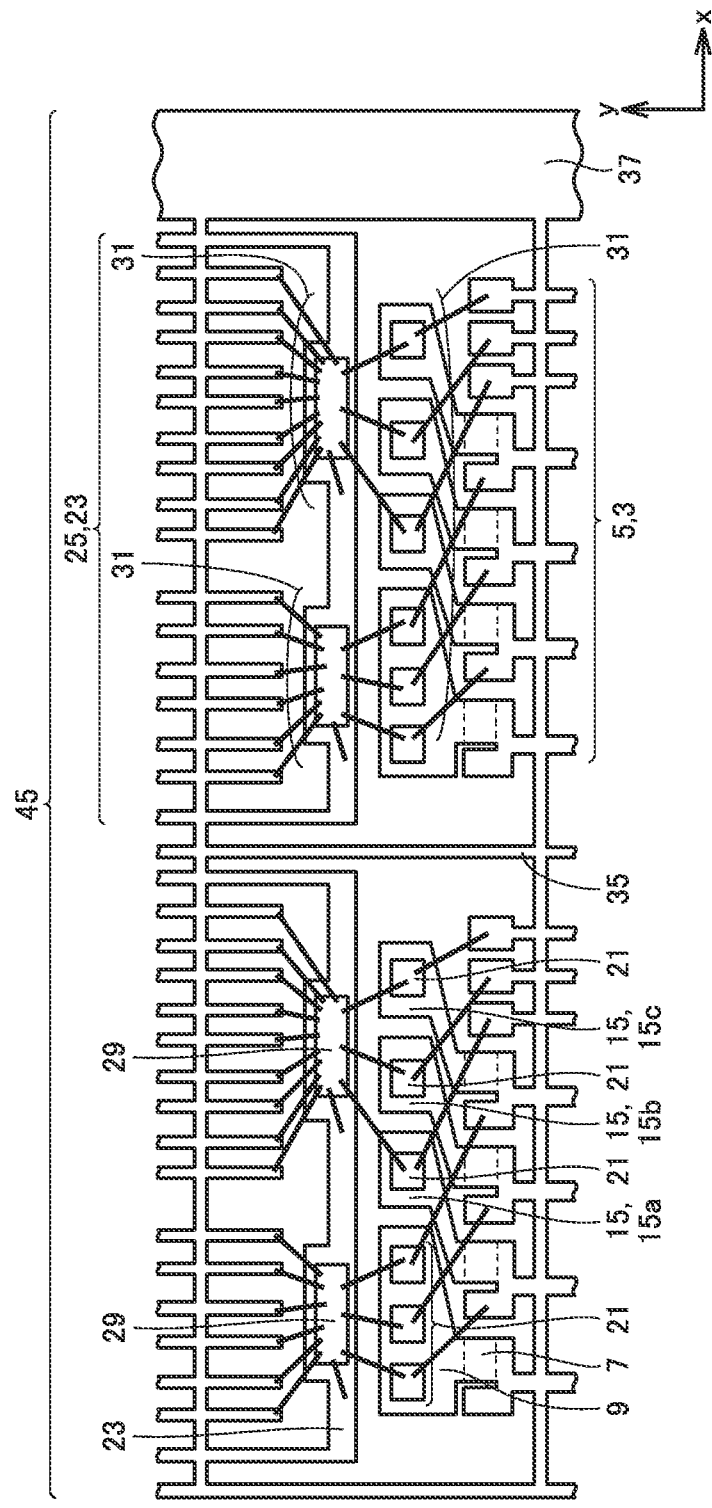
FIG. 15 is a plan view showing a step of a method of manufacturing a semiconductor device in the same embodiment.

Power semiconductor element 21 is bonded to each of large die pad 9 and small die pads 15 by conductive adhesive (see FIG. 15). IC elements 29 are bonded to IC leads 23 by conductive adhesive (see FIG. 15). Next, wires 31 are connected. In this way, as shown in FIG. 15, a plurality of semiconductor devices including lead frame 45 having power semiconductor elements 21 and the like mounted thereon before sealed with mold resin are formed. One semiconductor device (on the left side of lead frame 45) and the other semiconductor device (on the right side of lead frame 45) arranged in the X-axis direction are connected by a tie bar 35.

Figure 16:
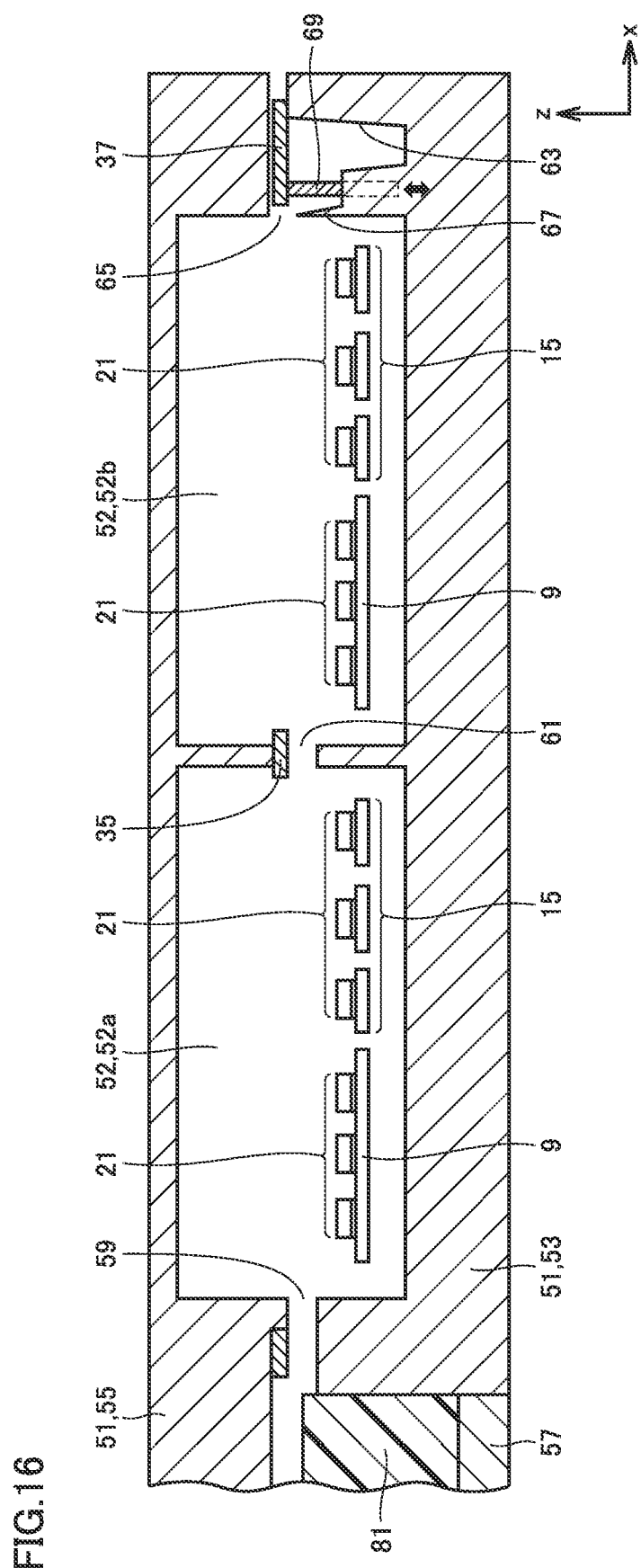
FIG. 16 is a cross-sectional view showing a step performed after the step shown in FIG. 15 in the same embodiment.

Next, the semiconductor devices are sealed with mold resin by transfer molding. As shown in FIG. 16, mold die 51 including upper die 55 and lower die 53 is prepared. Lead frame 45 (see FIG. 15) having power semiconductor elements 21 and the like mounted thereon is arranged between lower die 53 and upper die 55. It is preferable that resin injection gate 59 is located on the side closer to large die pad 9 than to small die pad 15 in lead frame 45.

The area of large die pad 9 is larger than the area of small die pad 15. Because of this, a region between large die pad 9 and lower die 53 (the bottom surface of cavity 52) is sometimes less filled with the mold resin. Then, resin injection gate 59 is arranged closer to large die pad 9 to ensure that the region between large die pad 9 and lower die 53 (the bottom surface of cavity 52) is filled with fluid resin serving as mold resin with a low viscosity.

In addition, in order to efficiently fill the region with mold resin (fluid resin), it is preferable that the position (the Y-axis direction) of resin injection gate 59 and the position (the Y-axis direction) of runner 61 are closer to the center position (the Y-axis direction) of large die pad 9. The position (the Y-axis direction) of resin injection gate 59 and the position (the Y-axis direction) of runner 61 are almost the same position.

Resin reservoir 63 and second cavity 52*b* are connected through resin reservoir gate 65. At this point of time, movable pin 69 is located above, and resin reservoir gate 65 is closed.

Next, a tablet resin 81 is loaded in a plunger 57. After lower die 53 and upper die 55 are clamped, plunger 57 is elevated while tablet resin 81 is melted, whereby the melted fluid resin serving as mold resin is injected from resin injection gate 59 into cavity 52 (52*a*). The injected fluid resin fills the first cavity 52*a* and then reaches runner 61.

Figure 17:
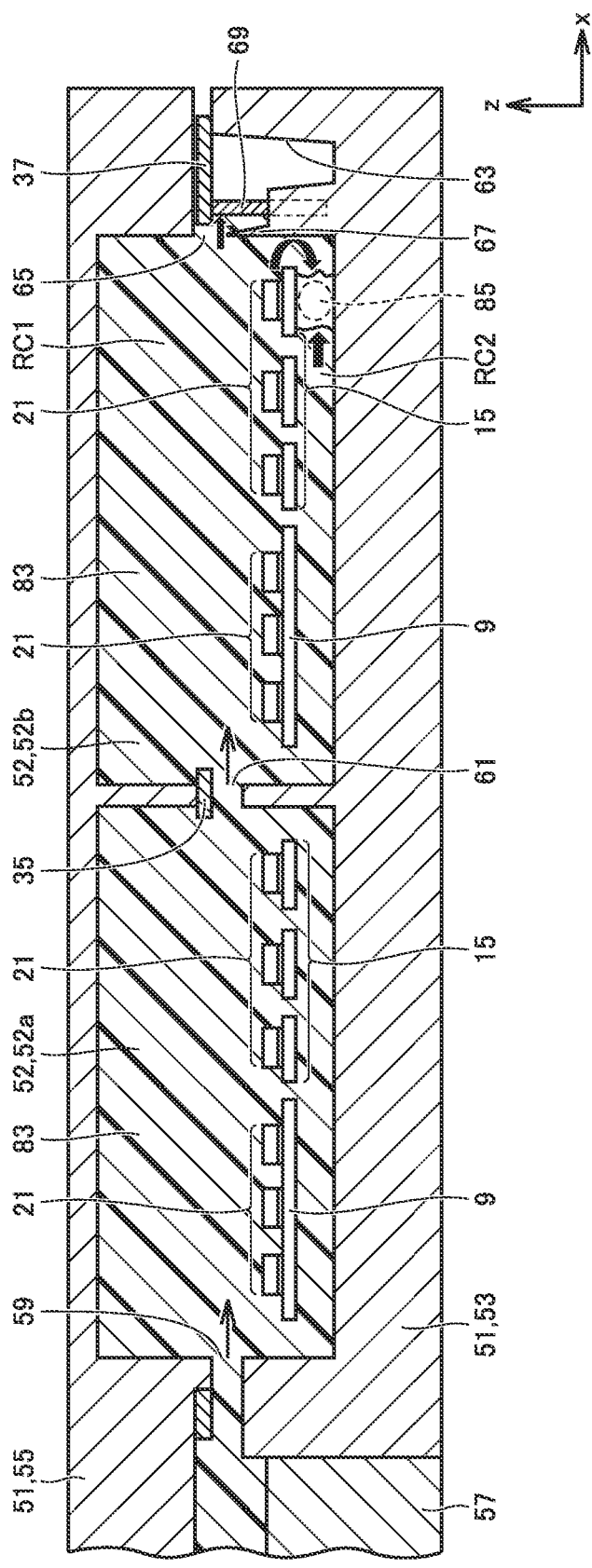
FIG. 17 is a cross-sectional view showing a step performed after the step shown in FIG. 16 in the same embodiment.

As shown in FIG. 17, the fluid resin reaching runner 61 flows through runner 61 and is injected into second cavity 52*b*. The distance from large die pad 9 and small die pads 15 to upper die 55 (the upper surface of second cavity 52*b*) is longer than the distance from large die pad 9 and small die pads 15 to lower die 53 (the bottom surface of second cavity 52*b*).

Fluid resin 83 therefore flows more easily to a region RC1 of cavity 52 above large die pad 9 and small die pads 15 than to a region RC2 of cavity 52 below large die pad 9 and small die pads 15. Accordingly, fluid resin 83 flowing through region RC1 finally flows from region RC1 into region RC2 and ultimately merges with fluid resin 83 flowing through region RC2 at a position 87 (region 85) below small die pad 15 (15C).

Figure 18:
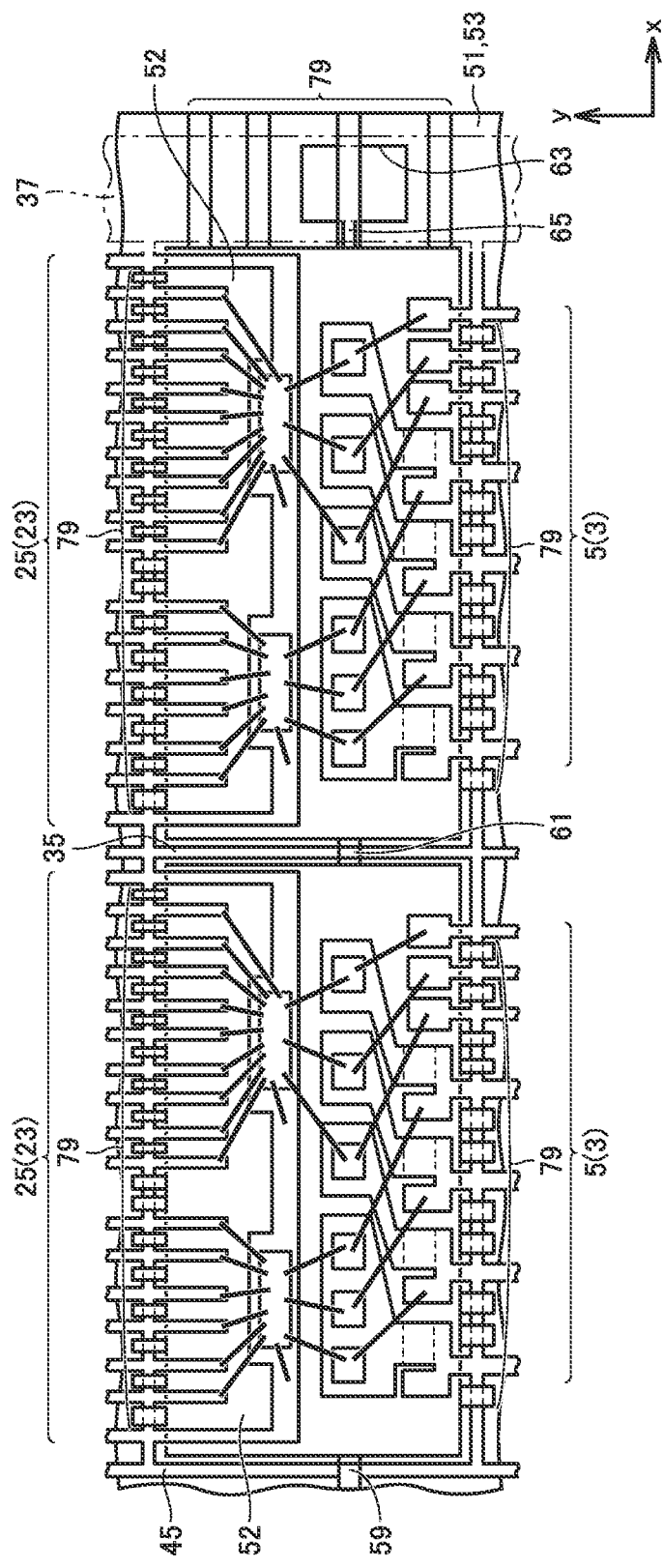
FIG. 18 is a plan view of an example of an air vent arrangement structure in the same embodiment.

While cavity 52 is gradually filled with fluid resin 83, the air in cavity 52 is discharged from air vents 79 provided in cavity 52. As shown in FIG. 18, air vents 79 are arranged on the periphery of cavity 52. Air vents 79 are formed with, for example, depressions with a depth of about 100 μm provided in upper die 55 or lower die 53. Air vents 79 will be described in more detail later.

Figure 19:
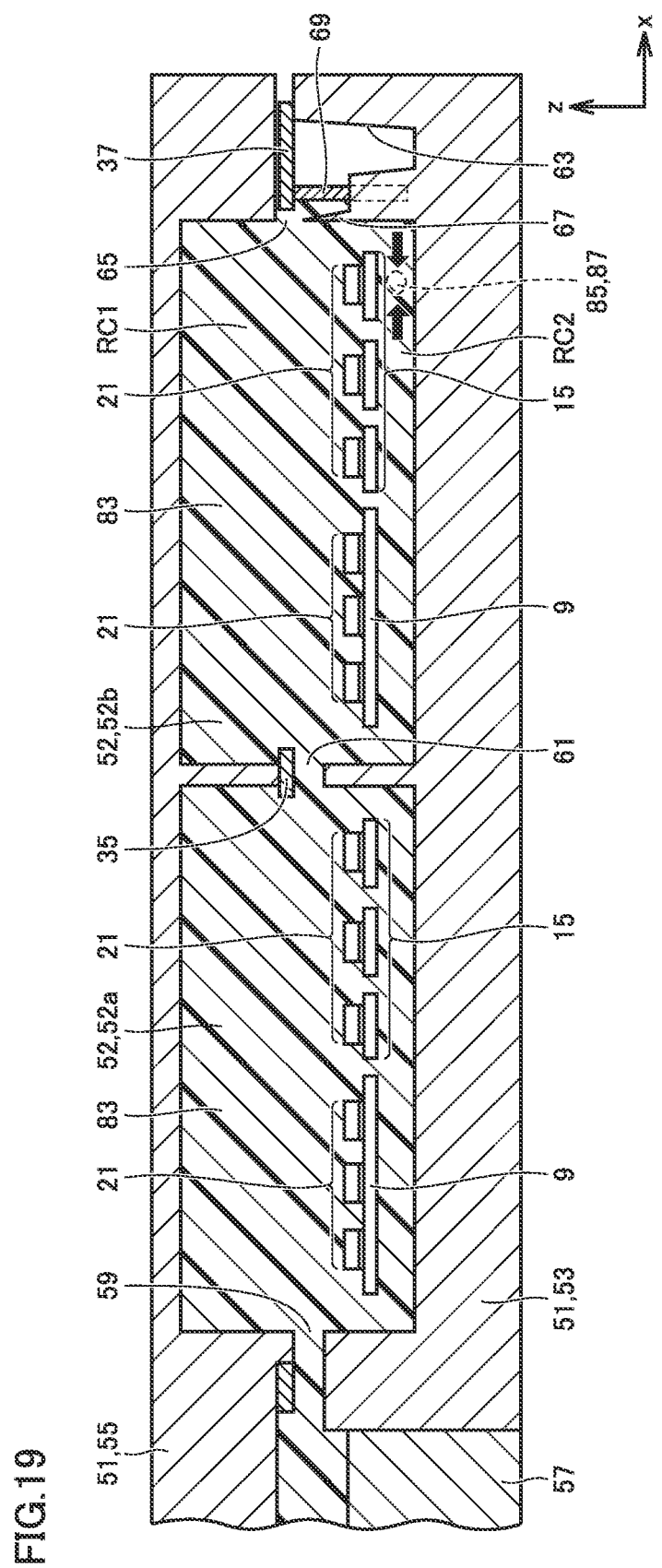
FIG. 19 is a cross-sectional view showing a step performed after the step shown in FIG. 17 in the same embodiment.

As shown in FIG. 19, when fluid resin 83 flowing through region RC1 and fluid resin 83 flowing through region RC2 merge at region 85 below small die pad 15 (15C), the air tends to be trapped in fluid resin 83. Movable pin 69 is located above and resin reservoir gate 65 is closed until fluid resins 83 merge at region 85 (position 87). When the trapped air is not collapsed, it may remain as voids in fluid resin 83 (mold resin).

Figure 20:
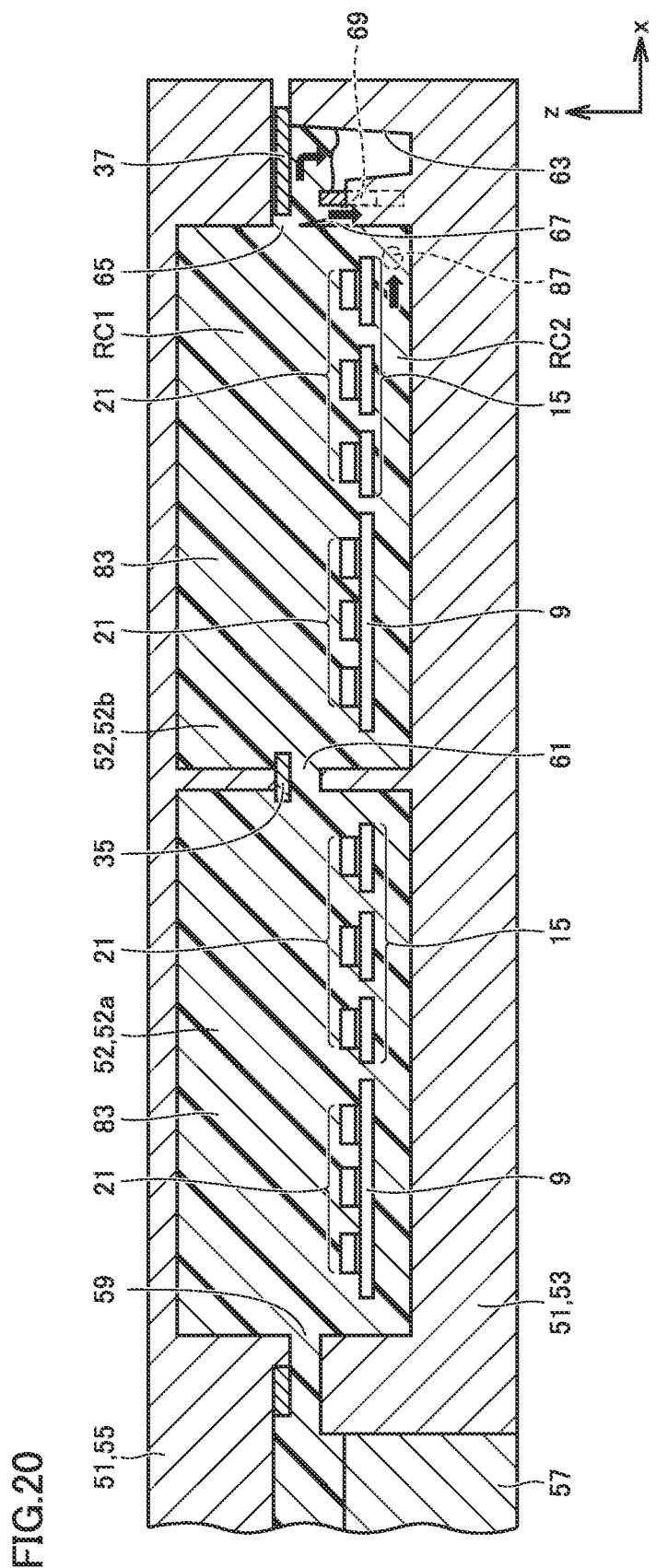
FIG. 20 is a cross-sectional view showing a step performed after the step shown in FIG. 19 in the same embodiment.
Figure 21:
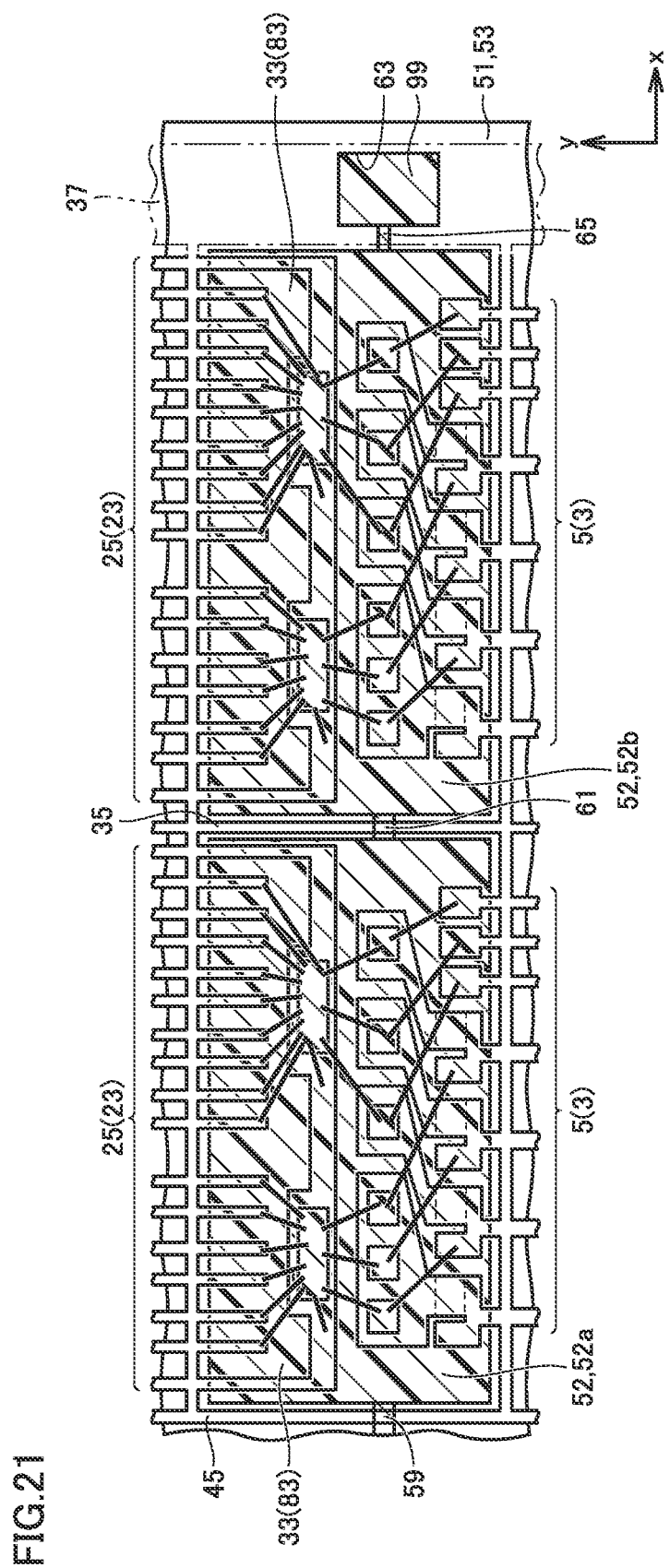
FIG. 21 is a plan view in the step shown in FIG. 20 in the same embodiment.

Then, a process (step) of preventing voids from remaining in fluid resin 83 is performed. As shown in FIG. 20 and FIG. 21, movable pin 69 descends to open resin reservoir gate 65. With resin reservoir gate 65 opened, fluid resin 83 in second cavity 52*b* attempts to flow into resin reservoir 63 through resin reservoir gate 65. In FIG. 21, a portion of frame 37 is depicted by a dashed-two dotted line to show the structure of lower die 53. In the following drawings, a portion of frame 37 is depicted by a dashed-two dotted line, if necessary.

At this time, a portion of fluid resin 83 located at region 85 below small die pad 15 (15C) also flows toward resin reservoir gate 65. Thus, even if voids remain in a portion of fluid resin 83 located at region 85, the voids are eliminated from region RC2. This ensures the electrical insulation on the first main surface 33*e* side in mold resin 33 (see FIG. 3 and the like).

Figure 22:
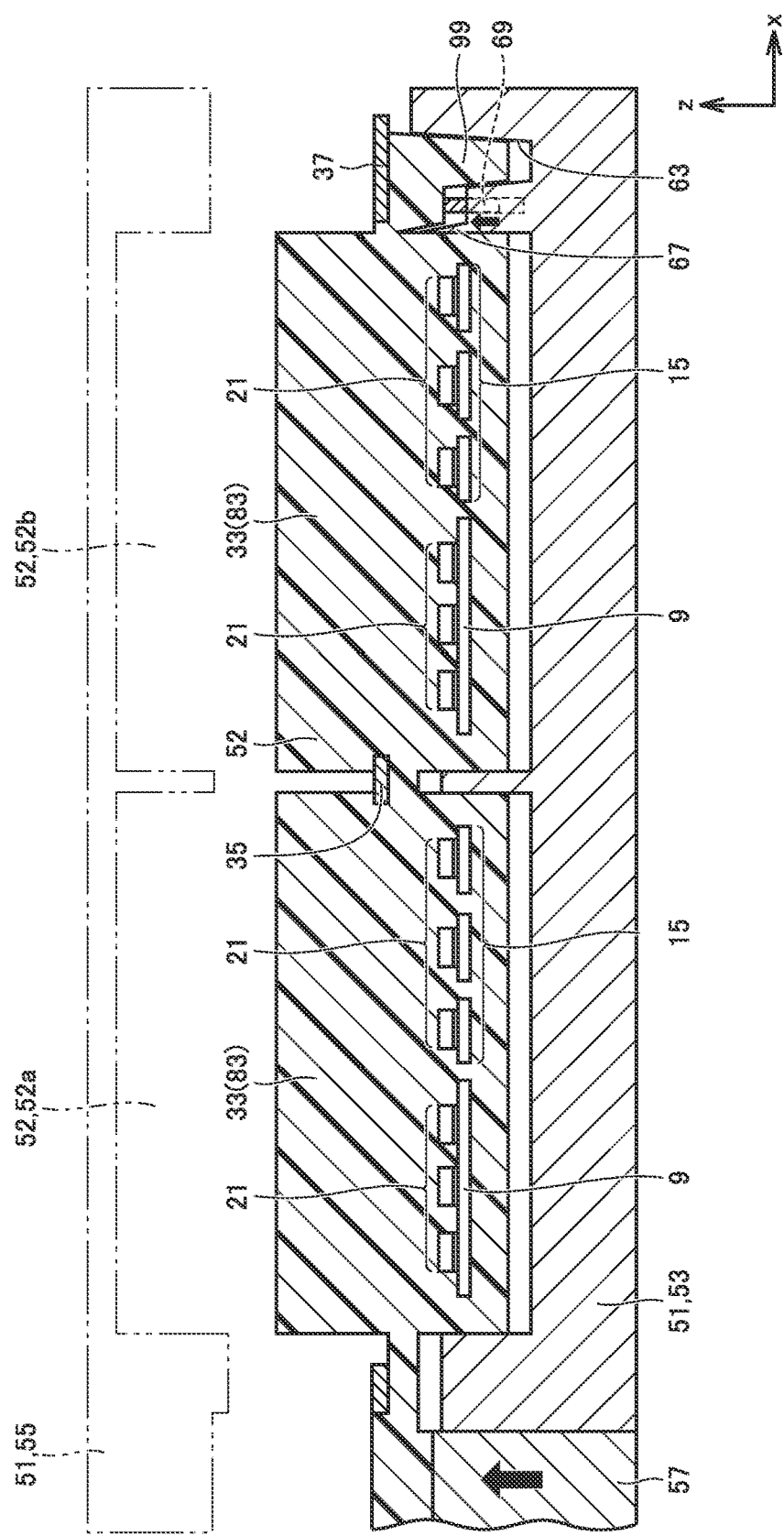
FIG. 22 is a cross-sectional view showing a step performed after the step shown in FIG. 20 and FIG. 21 in the same embodiment.

Next, a process (step) of detaching mold die 51 is performed. As shown in FIG. 22, plunger 57 is pushed upward (see the arrow). Mold resin 33 sealing power semiconductor elements 21 and the like is thus separated from lower die 53. At this time, mold resin 99 flowing into resin reservoir 63 and hardened may fail to be detached from lower die 53.

Figure 23:
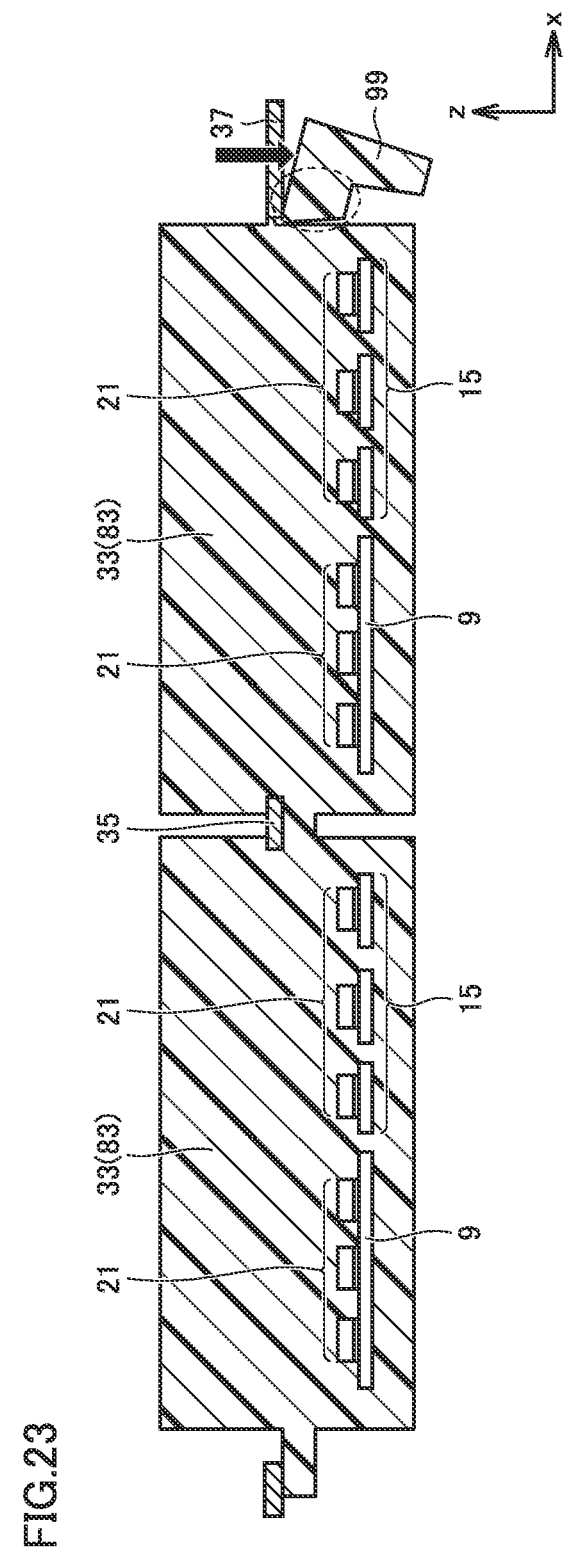
FIG. 23 is a cross-sectional view showing a step performed after the step shown in FIG. 22 in the same embodiment.

Then, movable pin 69 is also pushed upward (see the arrow) together with plunger 57. Pushing movable pin 69 upward ensures that mold resin 99 is removed from lower die 53. Next, as shown in FIG. 23, mold resin 99 removed from lower die 53 is removed from frame 37 by a die punch (not shown). Further, a portion of the mold resin located at the runner and a portion of the mold resin located at the resin injection gate are separated by a die punch (not shown). In this way, semiconductor device 1 sealed with mold resin 33 shown in FIG. 1 to FIG. 3 is manufactured.

In semiconductor device 1 described above, the electrical insulation on the first main surface 33*e* side in mold resin 33 (see FIG. 3 and the like) can be ensured. This will be explained in comparison with a method of manufacturing a semiconductor device according to a comparative example.

Figure 24:
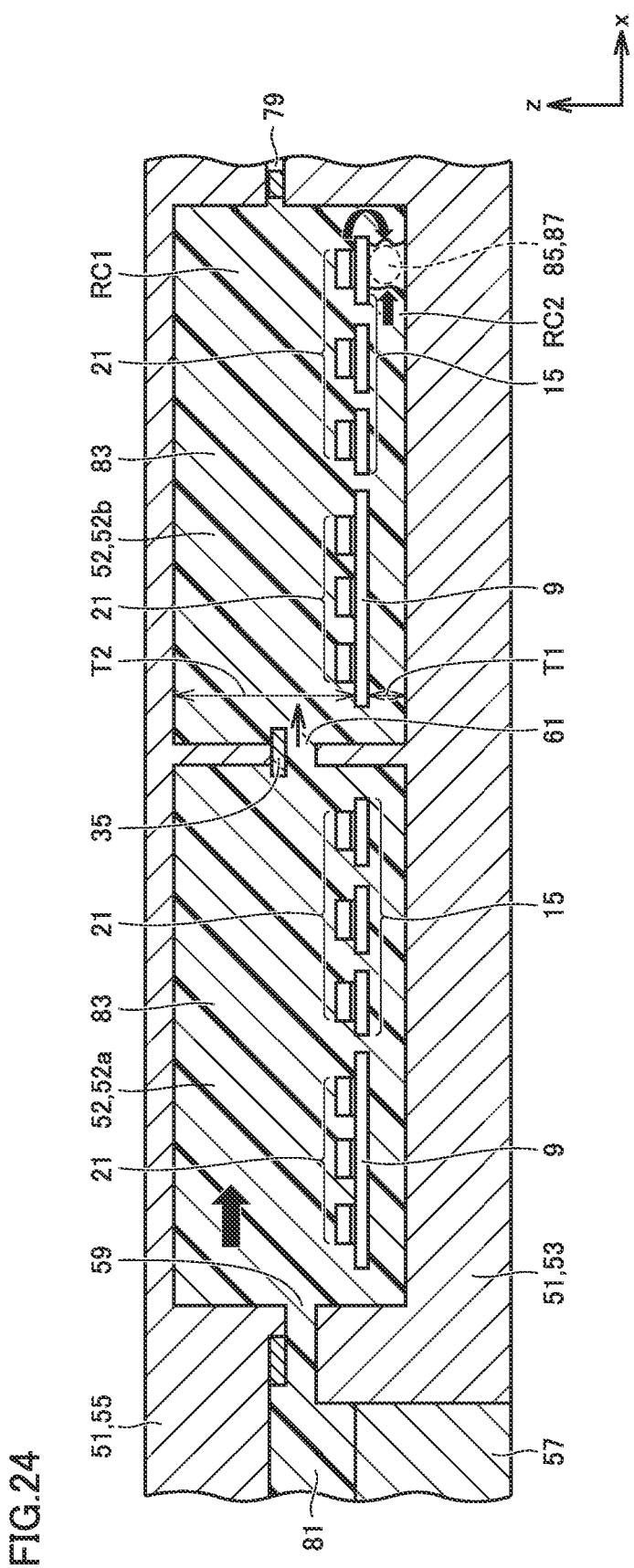
FIG. 24 is a cross-sectional view showing a step of a method of manufacturing a semiconductor device according to a comparative example.

As shown in FIG. 24, in the method of manufacturing a semiconductor device according to a comparative example, air vent 79 is located at a portion opposed to runner 61 with second cavity 52*b* interposed in mold die 51. Air vent 79 is one air vent among a plurality of air vents arranged on the periphery of cavity 52. The same members as those of mold die 52 according to the embodiment are denoted by the same reference signs and will not be further elaborated unless necessary.

Fluid resin 83 injected from resin injection gate 59 into first cavity 52*a* is injected into second cavity 52*b* through runner 61. In second cavity 52*b*, fluid resin 83 flowing through region RC1 and fluid resin 83 flowing through region RC2 merge at region 85 (position 87) below small die pad 15 (15C). At this time, the air tends to be trapped in fluid resin 83. A plurality of air vents including air vent 79 are arranged in mold die 51, and the air in fluid resin 83 is discharged from the air vents.

However, the air trapped in fluid resin 83 is less discharged at region 85 where fluid resins 83 merge. In particular, when a large volume of air is trapped, the trapped air is not discharged from the air vents and sometimes remains as voids in fluid resin 83. Therefore, in the completed semiconductor device, the remaining voids may deteriorate the electrical insulation on the first main surface 33*e* side of mold resin 33 (see FIG. 3 and the like).

In comparison with the method of manufacturing a semiconductor device according to the comparative example, in the method of manufacturing a semiconductor device according to the first embodiment, after fluid resin 83 flowing through region RC1 and fluid resin 83 flowing through region RC2 merge at region 85 (position 87), fluid resin 83 attempts to flow into resin reservoir 63 through resin reservoir gate 65. Thus, even if voids remain in a portion of fluid resin 83 located at region 85, the voids are eliminated from region RC2. As a result, the electrical insulation on the first main surface 33*e* side in mold resin 33 (see FIG. 3 and the like) can be ensured.

In the completed semiconductor device, the portions of the mold resin located at resin injection gate 59, runner 61, and resin reservoir gate 65 (see FIG. 7 and the like) are separated, so that resin trace 34 (see FIG. 1 and FIG. 6) having a coarser surface than the other portions is left on the surface of mold resin 33 of semiconductor device 1 as described at the beginning.

In particular, in the semiconductor device (see FIG. 1) sealed in second cavity 52*b*, runner trace 34*c* is left on first side portion 33*a*, and resin reservoir trace 34*b* is left on second side portion 33*b*. Since the cross-sectional area of the runner is equal to the cross-sectional area of the resin injection gate and fluid resin is injected from the runner, runner trace 34*c* can be regarded as resin injection trace 34*a*.

On the other hand, in the semiconductor device (see FIG. 6) sealed in first cavity 52*a*, resin injection trace 34*a* is left on first side portion 33*a*, and runner trace 34*c* is left on second side portion 33*b*. The area of resin injection trace 34*a* and the area of resin reservoir trace 34*b* are substantially the same.

Figure 25:
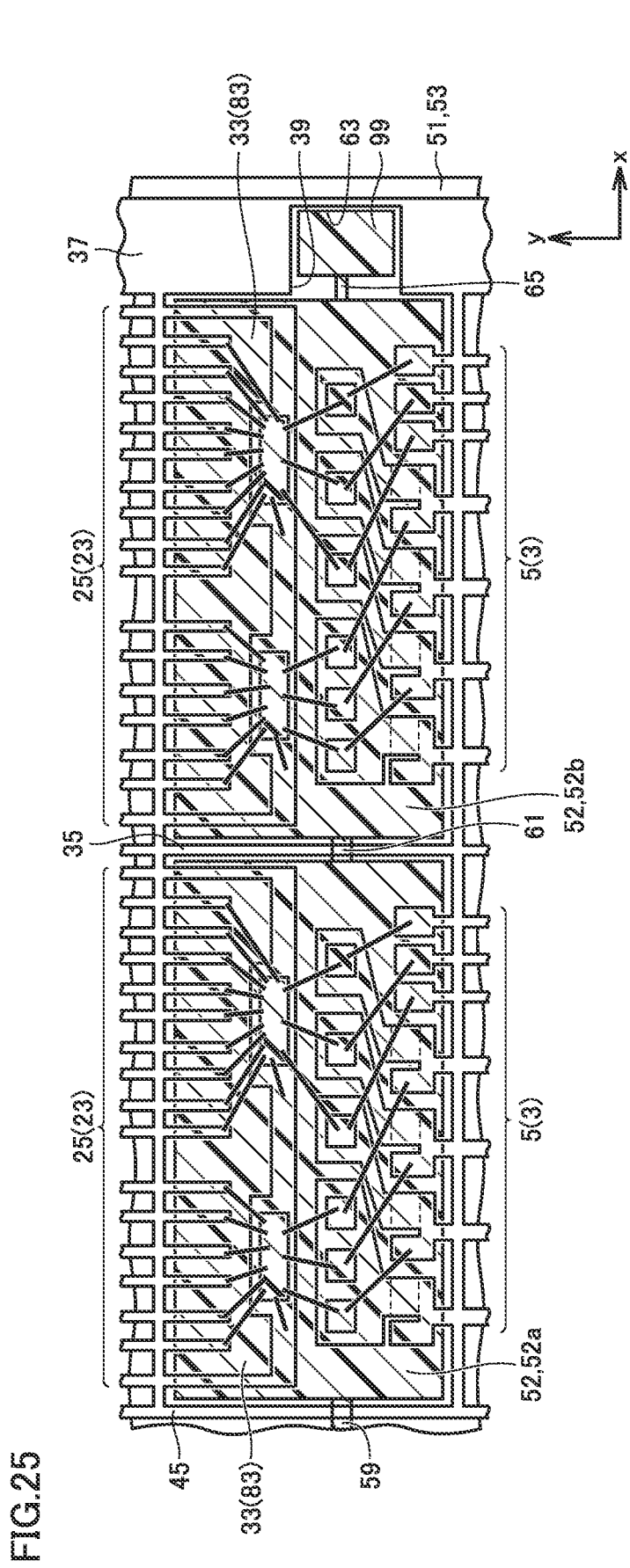
FIG. 25 is a plan view showing a step of the method of manufacturing a semiconductor device according to a modification in the same embodiment.

In the method of manufacturing a semiconductor device described above, in the step shown in FIG. 23, mold resin 99 removed from lower die 53 is removed by a die punch from frame 37 and mold resin 33 serving as a semiconductor device. As shown in FIG. 25, a notch 39 may be provided in frame 37 to efficiently remove mold resin 99 from mold resin 33.

Notch 39 is formed so as to expose resin reservoir 63 in a state in which lead frame 45 is arranged in mold die 51 (lower die 53). With this, when mold resin 99 is removed from mold resin 33 by a die punch, the die punch can be brought into direct abutment with mold resin 99 to efficiently remove it.

When lead frame 45 having such a notch 39 is employed, it is preferable that the distal end of movable pin 69 protrudes to a position about 50 μm away from the lower surface of upper die 55 in a state in which resin reservoir gate 65 is closed.

In the method of manufacturing a semiconductor device described above, resin reservoir gate 65 is arranged at a position closest to resin injection gate 59. Specifically, mold die 51 in which the position (the Y-axis direction) of resin reservoir gate 65 and the position (the Y-axis direction) of runner 61 (resin injection gate 59) are the same position has been described. Resin reservoir gate 65 may be arranged at a position (the Y-axis direction) away from the position (the Y-axis direction) of runner 61 (resin injection gate 59).

Figure 26:
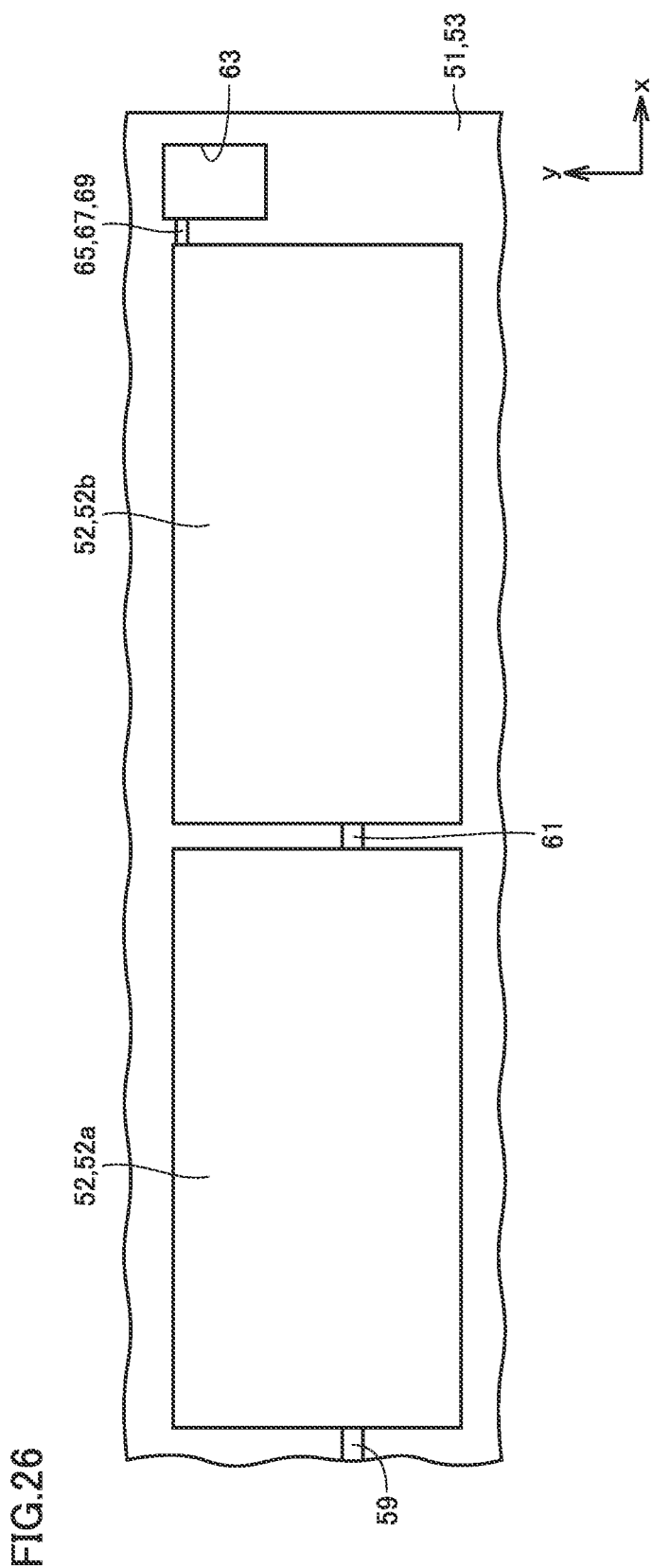
FIG. 26 is a plan view of a structure of the lower die in the mold die according to a first modification in the same embodiment.

As shown in FIG. 26, mold die 51 (lower die 53) in which resin reservoir gate 65 is arranged, for example, at a position (the Y-axis direction) away from the position (the Y-axis direction) of runner 61 in the Y-axis positive direction may be employed. In this case, the time taken for fluid resin 83 injected from runner 61 to reach resin reservoir gate 65 is longer.

Figure 27:
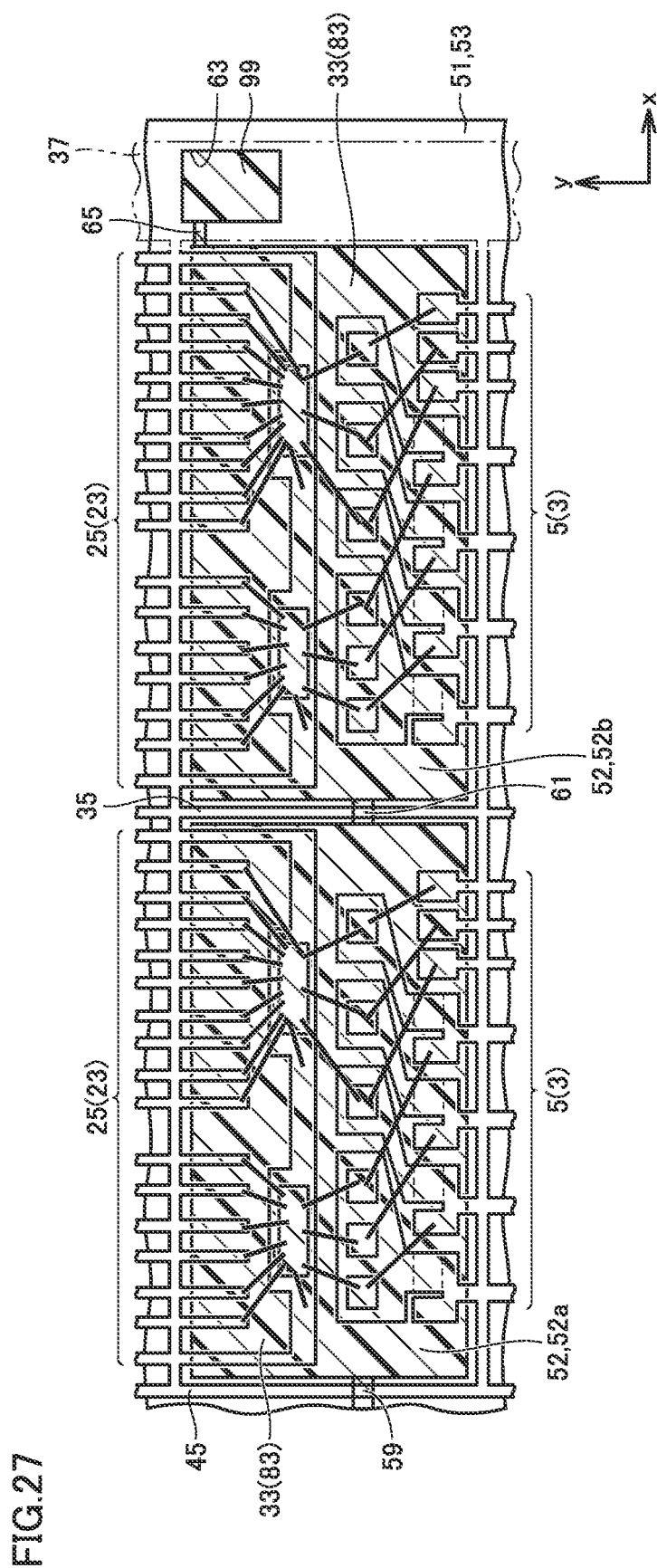
FIG. 27 is a plan view showing a step of the method of manufacturing a semiconductor device using the mold die shown in FIG. 26 in the same embodiment.

Therefore, in the step of injecting fluid resin 83 into cavity 52 shown in FIG. 27, even if voids remain in a portion of fluid resin 83 located at region 85 (see FIG. 18 and the like), the voids are eliminated from region 85 (region RC2) before fluid resin 83 reaches resin reservoir gate 65 and attempts to flow into resin reservoir 63. As a result, the electrical insulation on the first main surface 33*e* side in mold resin 33 (see FIG. 3 and the like) can be ensured.

Figure 28:
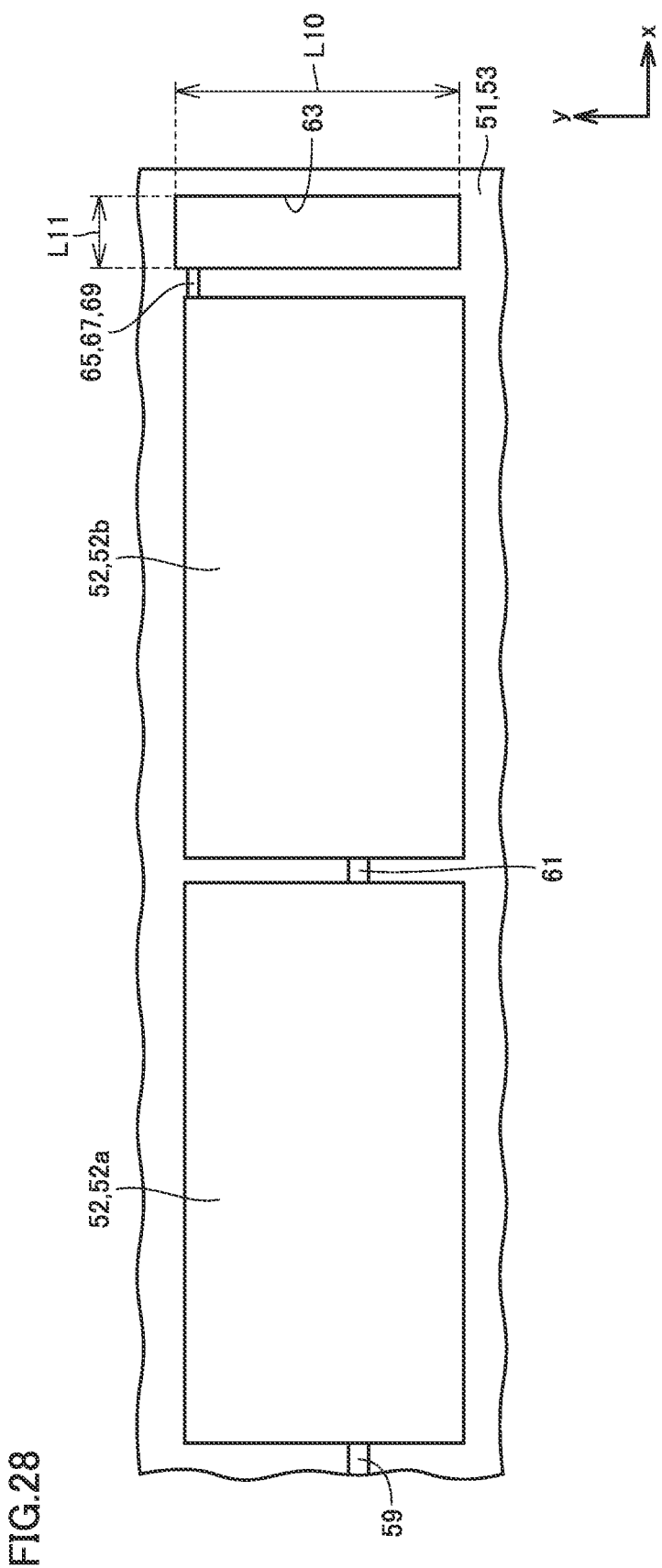
FIG. 28 is a plan view of a structure of the lower die in the mold die according to a second modification in the same embodiment.

Furthermore, the capacity of resin reservoir 63 is preferably as large as possible to ensure that region 85 (see FIG. 18 and the like) is filled with fluid resin 83. To increase the capacity of resin reservoir 63, as shown in FIG. 28, for example, it is preferable that the length L10 in the Y-axis direction is set to be long while the length L11 in the X-axis direction of resin reservoir 63 is kept.

Figure 29:
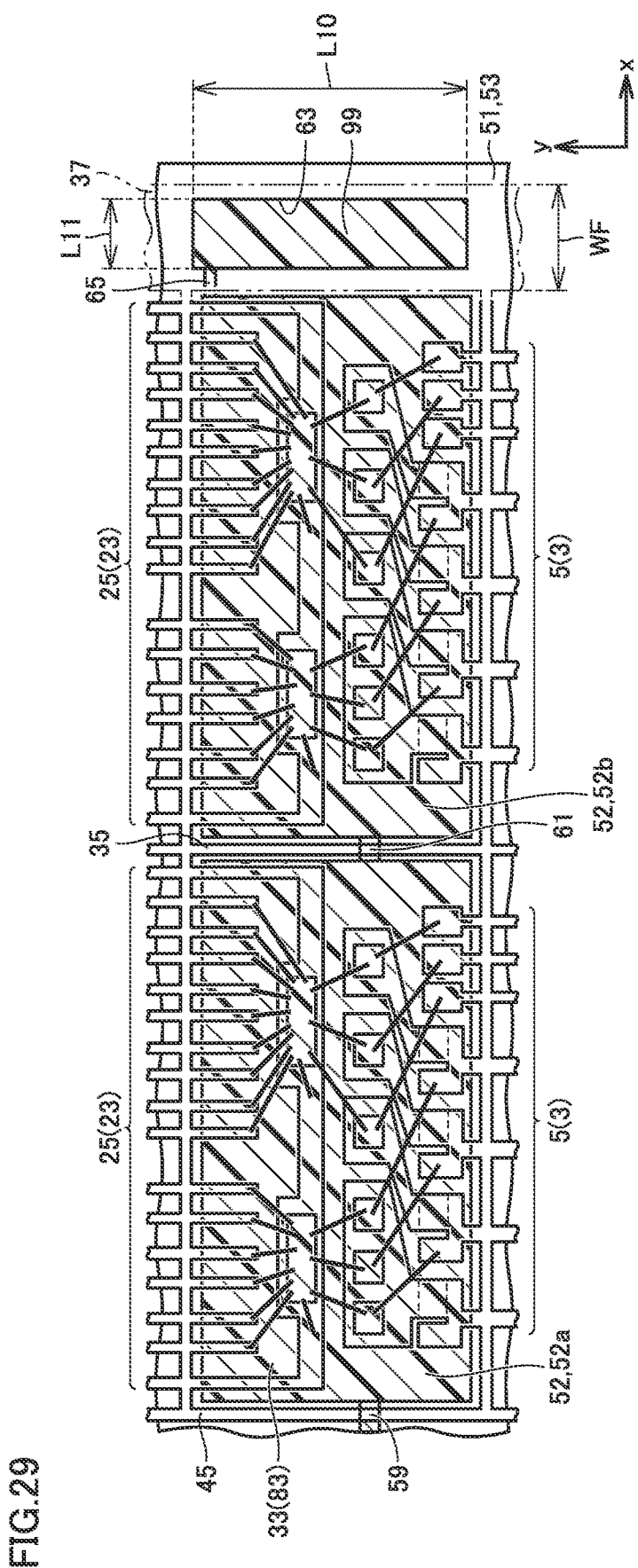
FIG. 29 is a plan view showing a step of the method of manufacturing a semiconductor device using the mold die shown in FIG. 28 in the same embodiment.

Thus, in the step of injecting fluid resin 83 into cavity 52 shown in FIG. 29, even if voids remain in a portion of fluid resin 83 located at region 85 (see FIG. 18 and the like), the voids are eliminated from region 85 (region RC2) reliably while fluid resin 83 flows into resin reservoir 63. As a result, the electrical insulation on the first main surface 33*e* side in mold resin 33 (see FIG. 3 and the like) can be reliably ensured.

When fluid resin (mold resin) is filled, for example, in a plurality of cavities (not shown) also arranged in the Y-axis direction, it is preferable that the length in the Y-axis direction of the resin reservoir is set to a length not exceeding the length of the cavities arranged in the Y-axis direction and the length in the X-axis direction thereof is set to be long. It is assumed that such a mold die 51 is used and lead frame 45 (see FIG. 25) including frame 37 having notch 39 is employed. In this case, it is preferable that the length in the X-axis direction of resin reservoir 63 does not exceed the width (the length in the X-axis direction) of the frame.

Figure 30:
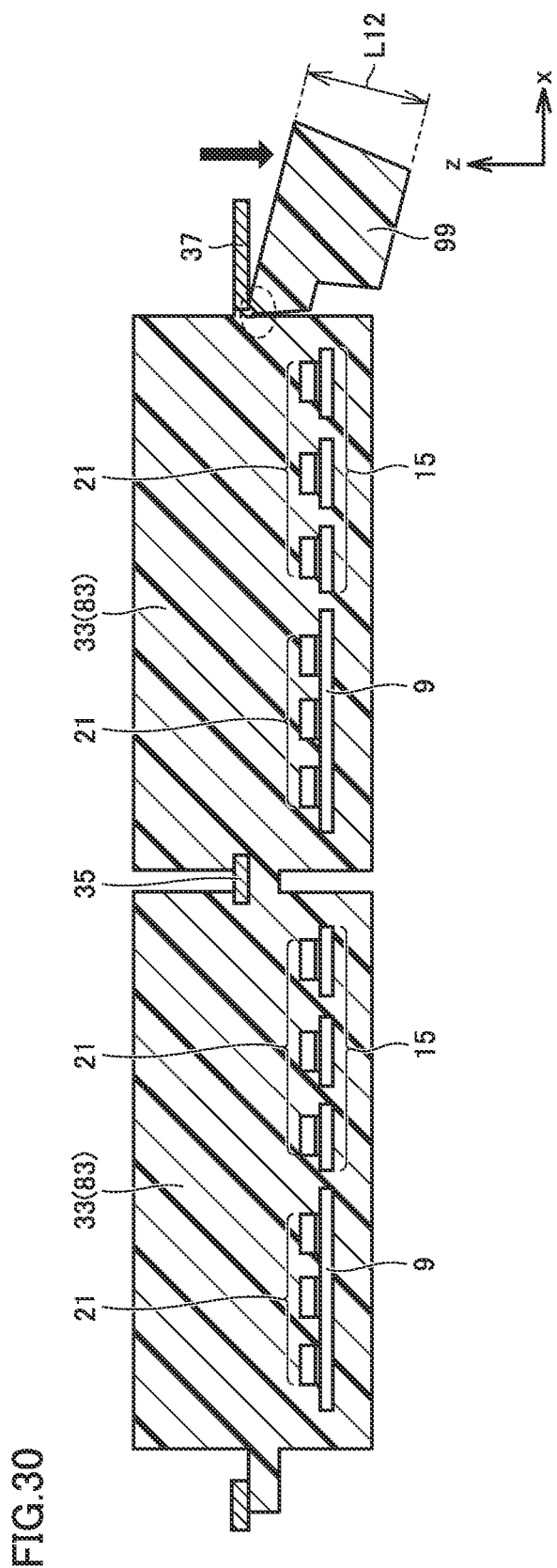
FIG. 30 is a cross-sectional view showing a step of the method of manufacturing a semiconductor device using the mold die according to a third modification in the same embodiment.

On the other hand, the length L11 in the X-axis direction of resin reservoir 63 may exceed the width of frame 37. In this case, as shown in FIG. 30, it is preferable to provide a mechanism that presses mold resin 99 flowing into the resin reservoir and hardened from above and removes mold resin 99 from mold resin 33.

The length L12 (see FIG. 12) in the depth direction of resin reservoir 63 is preferably as long as possible. In order to remove mold resin 99 flowing into resin reservoir 63 and hardened from the lower die well, it is preferable that the bottom of resin reservoir 63 is at a position (height) equal to or higher than the bottom surface of cavity 52.

Figure 31:
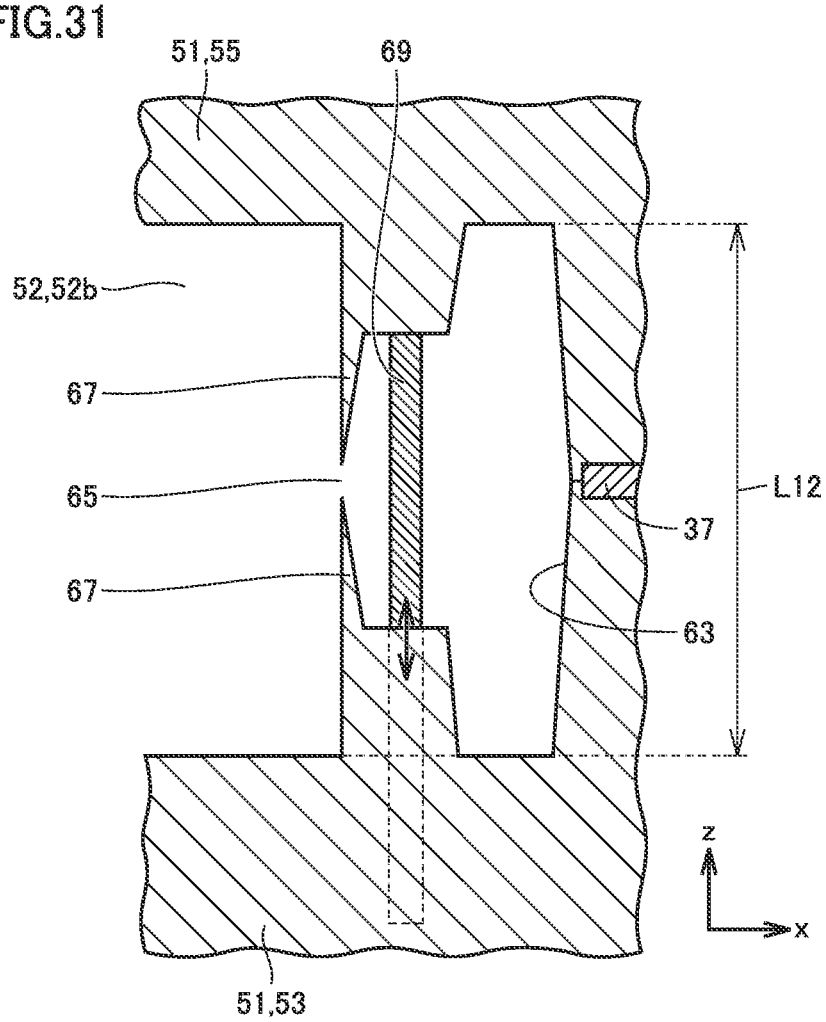
FIG. 31 is a partially-enlarged cross-sectional view of the resin reservoir gate in the mold die according to a fourth modification in the same embodiment.

Furthermore, as shown in FIG. 31, for example, resin reservoir 63 having a region to store fluid resin may also be provided in upper die 55 of mold die 51. In this case, in order to remove mold resin 99 flowing into resin reservoir 63 and hardened from upper die 55 well, it is preferable that the upper surface of resin reservoir 63 is at a position (height) not exceeding the upper surface of cavity 52.

In such a mold die 51, a sufficient capacity of resin reservoir 63 can be ensured, and even if voids remain in a portion of fluid resin 83 located at region 85 (see FIG. 18 and the like), the voids can be reliably eliminated from region 85 while fluid resin 83 attempts to flow into resin reservoir 63.

In the method of manufacturing a semiconductor device, as already explained, since fluid resin 83 attempts to flow into resin reservoir 63 through resin reservoir gate 65, even if voids remain in a portion of fluid resin 83 located at region 85, the voids are eliminated from region RC2. As a result, the electrical insulation on the first main surface 33*e* side of mold resin 33 (see FIG. 3 and the like) can be ensured.

Here, it is assumed that the thickness of mold resin 33 corresponding to the distance L1 (see FIG. 3) from large die pad 9 to first main surface 11*e* is about 500 μm. It is assumed that the thickness in the Z-axis direction of mold resin 33 of semiconductor device 1 is about 3.5 mm.

In manufacturing such a semiconductor device, in order to eliminate voids from region RC2 if voids remain in a portion of fluid resin 83 located at region 85, the volume of resin reservoir 63 need to be about one third of the volume of mold resin 33 of semiconductor device 1.

In the method of manufacturing a semiconductor device described above, mold die 51 has resin reservoir gate 65. The opening cross-sectional area of resin reservoir gate 65 is smaller than the opening cross-sectional area of resin injection gate 59. Furthermore, resin reservoir gate 65 has movable pin 69 for controlling the flow of fluid resin into resin reservoir 63.

This configuration can minimize the amount of fluid resin 83 flowing into resin reservoir 63 and can discharge voids remaining in fluid resin 83. As a result, the electrical insulation of mold resin 33 can be ensured while the amount of discarded mold resin 99 (fluid resin 83) is kept to the minimum. Movable pin 69 may simply have only the function that reliably detaches mold resin 99 from lower die 53.

In the method of manufacturing a semiconductor device described above, fluid resin 83 injected into first cavity 52*a* through resin injection gate 59 flows through runner 61 and is injected into second cavity 52*b*. In order to make the flow of fluid resin 83 in first cavity 52*a* substantially equal to the flow of fluid resin 83 in second cavity 52*b*, it is preferable that the cross-sectional shape of resin injection gate 59 and the cross-sectional shape of runner 61 are the same cross-sectional shape. On the other hand, it is preferable that the cross-sectional shape of resin reservoir gate 65 is smaller than the cross-sectional shape of resin injection gate 59 (runner 61).

With this configuration, the area of resin injection trace 34*a* left on a surface of semiconductor device 1 sealed in first cavity 52*a* and the area of runner trace 34*c* are substantially the same, as already explained (see FIG. 6). The area of resin reservoir trace 34*b* left on a surface of semiconductor device 1 sealed in second cavity 52*b* is smaller than the area of runner trace 34*c* (resin injection trace 34*a*) (see FIG. 1). In this way, resin trace 34 including resin reservoir trace 34*b* is left on a surface of semiconductor device 1 and can be easily recognized from the appearance (mold resin 33) of semiconductor device 1.

(Air Vent in Mold Die)

As described above, the air in cavity 52 is gradually discharged from air vents 79 formed in mold die 51 while cavity 52 is gradually filled with fluid resin 83 (see FIG. 18).

Figure 32:
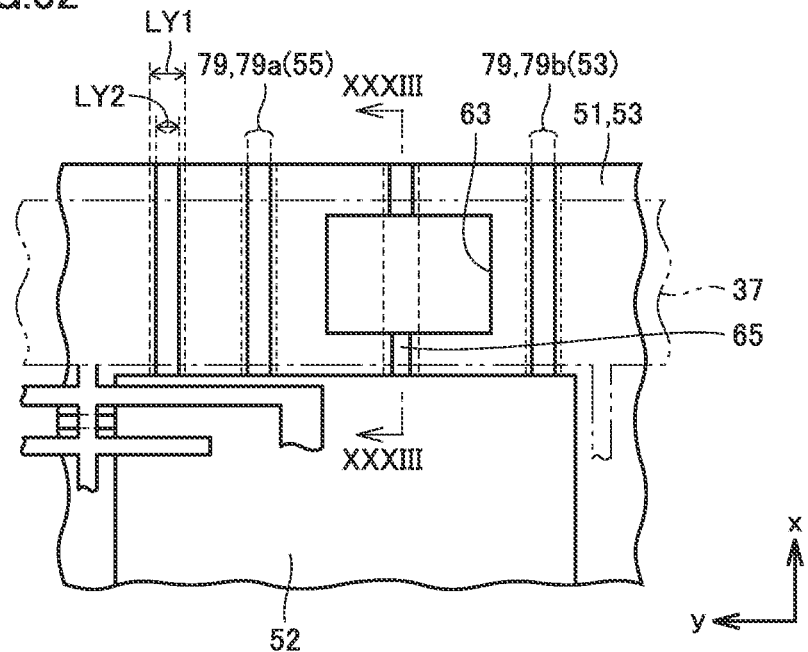
FIG. 32 is a partial plan view of an example of the air vents provided in the mold die in the same embodiment.
Figure 33:
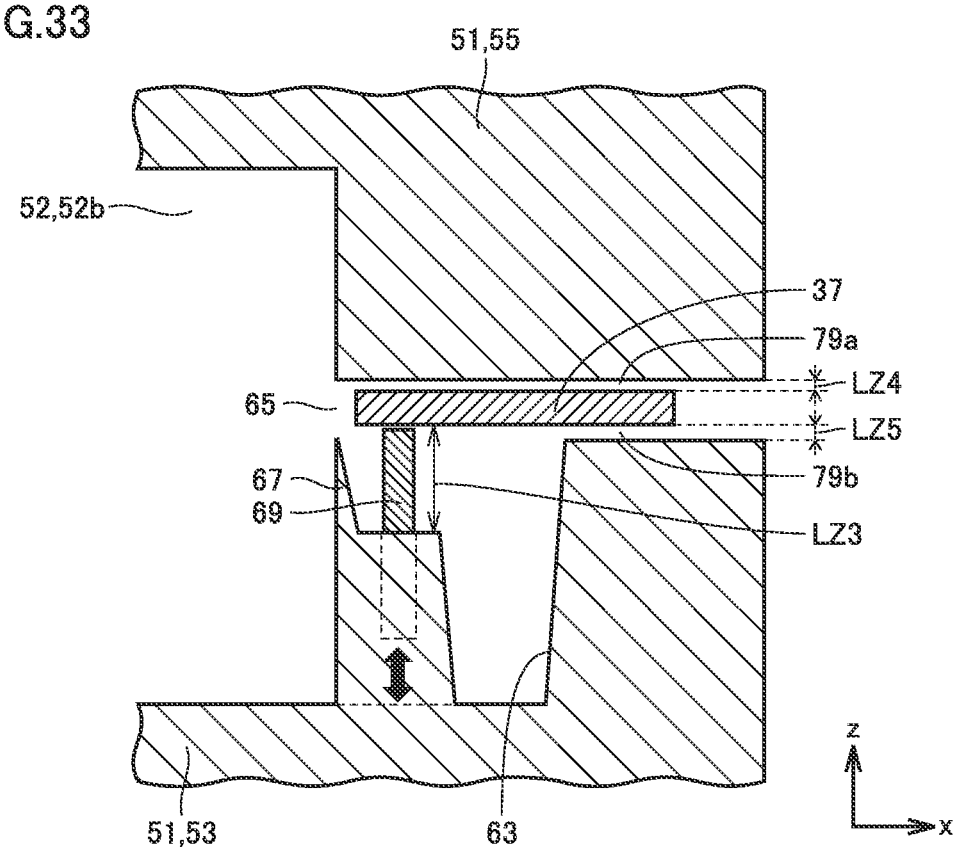
FIG. 33 is a partial cross-sectional view taken along line XXXIII-XXXIII shown in FIG. 32 in the same embodiment.

FIG. 32 and FIG. 33 show air vents 79 located in the vicinity of resin reservoir 63 in mold die 51, as an example of air vents 79. Upper die 55 has an air vent 79*a*. Lower die 53 has an air vent 79*b*. Air vent 79*b* is communicatively connected to resin reservoir 63.

To efficiently discharge the air in cavity 52, the gap serving as air vent 79 need to be large. However, for example, if the height LZ4 of the gap serving as air vent 79*a* provided in upper die 55 is increased, the possibility that the fluid resin excessively flows out becomes high. Then, air vent 79*b* is provided in lower die 53 so as to be opposed to air vent 79*a* in the height direction (Z axis) so that the height of the gap serving as air vent 79 can be ensured.

Furthermore, the provision of resin reservoir 63 accelerates hardening of fluid resin flowing into resin reservoir 63 and prevents leakage of the fluid resin through air vent 79*b* communicatively connected to resin reservoir 63. Thus, the height LZ5 of the gap serving as air vent 79*b* can be increased, compared with when resin reservoir 63 is not provided. As a result, the air in cavity 52 can be discharged to the outside of mold die 51 more efficiently.

In order to ensure a region (area) where lead frame 45 is sandwiched between upper die 55 and lower die 53, it is preferable that air vent 79*a* and air vent 79*b* are arranged at positions opposed to each other in the height direction.

The width LY1 of air vent 79*a* and the width LY2 of air vent 79*b* may be the same width or may be different from each other. The center position in the width direction (the Y-axis direction) of air vent 79*a* and the center position in the width direction (the Y-axis direction) of air vent 79*b* may be the same position or may be shifted from each other.

Second Embodiment

A semiconductor manufacturing apparatus according to a second embodiment will be described. Here, a semiconductor manufacturing apparatus employing a mold die having a plurality of resin reservoirs for one cavity will be described.

(Mold Die)

Figure 34:
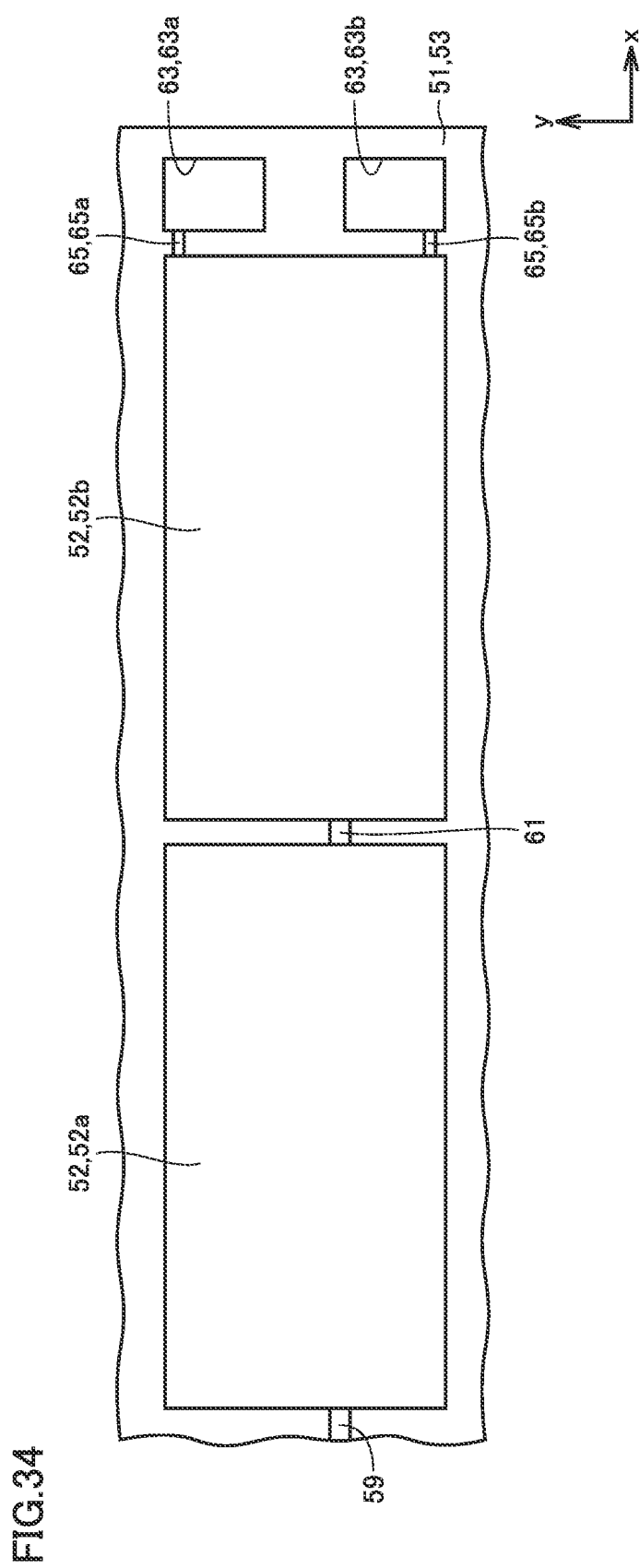
FIG. 34 is a plan view of a structure of the lower die in the mold die according to a second embodiment.

A mold die as a semiconductor manufacturing apparatus will be described. As shown in FIG. 34, mold die 51 (lower die 53) has, for example, a resin reservoir 63*a* and a resin reservoir 63*b* as resin reservoir 63. A resin reservoir gate 65*a* is formed to communicatively connect second cavity 52*b* and resin reservoir 63*a*. A resin reservoir gate 65*b* is formed to communicatively connect second cavity 52*b* and resin reservoir 63*b*.

Resin reservoir gate 65*a* is arranged at a position (the Y-axis direction) away from the position (the Y-axis direction) of runner 61 in the Y-axis positive direction. Resin reservoir gate 65*b* is arranged at a position (the Y-axis direction) away from the position (the Y-axis direction) of runner 61 in the Y-axis negative direction. The other configuration is similar to the configuration of mold die 51 shown in FIG. 7 and FIG. 8, and the same member is denoted by the same reference sign and will not be further elaborated unless necessary.

(Method of Manufacturing Semiconductor Device)

A method of manufacturing a semiconductor device using the mold die described above will now be described.

Figure 35:
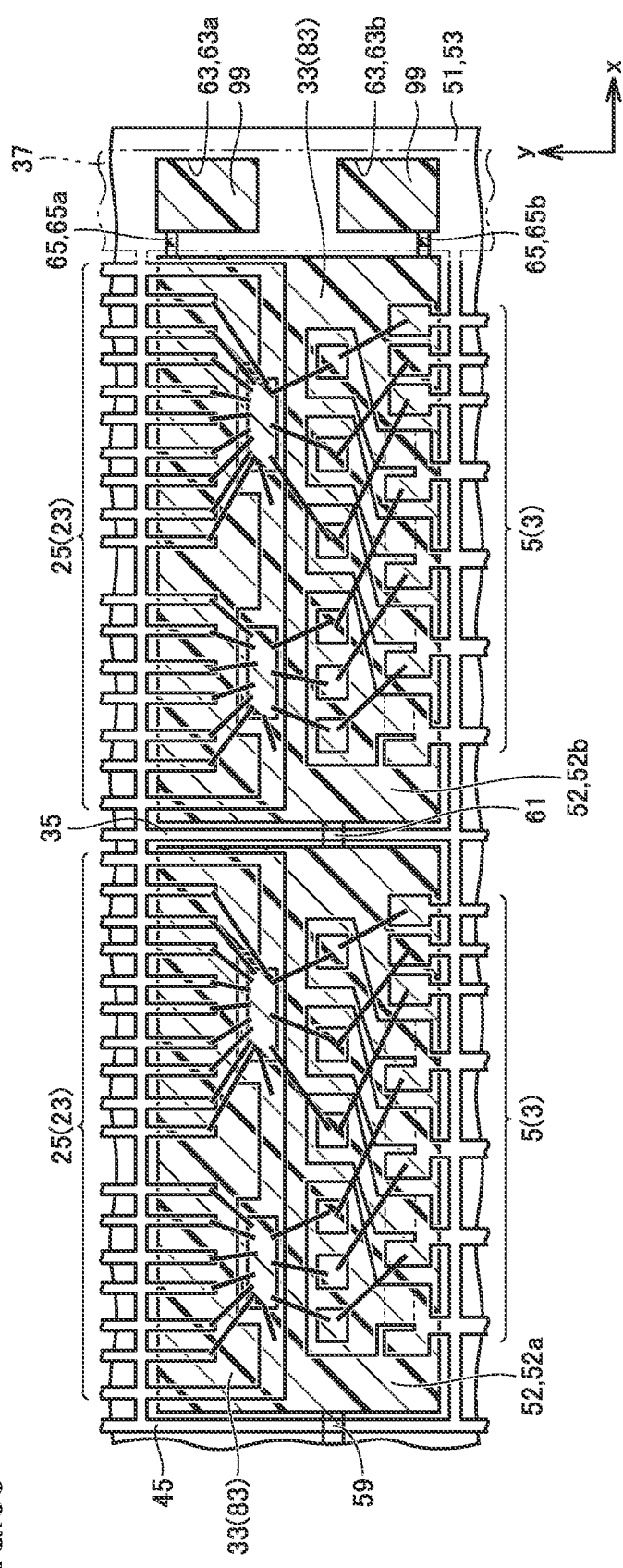
FIG. 35 is a plan view showing a step of the method of manufacturing a semiconductor device using the mold die shown in FIG. 34 in the same embodiment.

First, a plurality of semiconductor devices including a lead frame having power semiconductor elements and the like mounted thereon before sealed with mold resin are formed in the same manner as the method of manufacturing a semiconductor described above. Next, the semiconductor devices are sealed with mold resin by transfer molding. As shown in FIG. 35, lead frame 45 having power semiconductor elements 21 and the like mounted thereon is arranged in mold die 51.

After lower die 53 and the upper die (not shown) are clamped, fluid resin 83 is injected into cavity 52 (52*a*) from resin injection gate 59. Fluid resin 83 injected into first cavity 52*a* flows through runner 61 and is injected into second cavity 52*b* to gradually fill second cavity 52*b*.

Meanwhile, as previously mentioned, fluid resin 83 flowing through region RC1 finally flows from region RC1 into region RC2 and ultimately merges with fluid resin 83 flowing through region RC2 at region 85 (position 87) below small die pad 15 (15C) (see FIG. 17 and FIG. 19).

When fluid resin 83 flowing through region RC1 and fluid resin 83 flowing through region RC2 merge at region 85, the air tends to be trapped in fluid resin 83, and if the trapped air is not collapsed, it may remain as voids in fluid resin 83 (mold resin).

Next, resin reservoir gate 65 (65*a*, 65*b*) is opened in the same manner as the step shown in FIG. 20. With resin reservoir gate 65 (65*a*, 65*b*) opened, fluid resin 83 in second cavity 52*b* attempts to flow into resin reservoir 63*a* through resin reservoir gate 65*a* or attempts to flow into resin reservoir 63*b* through resin reservoir gate 65*b*.

At this time, a portion of fluid resin 83 located at region 85 also flows toward resin reservoir gate 65. Thus, even if voids remain in a portion of fluid resin 83 located at region 85, the voids are eliminated from region 85.

Figure 36:
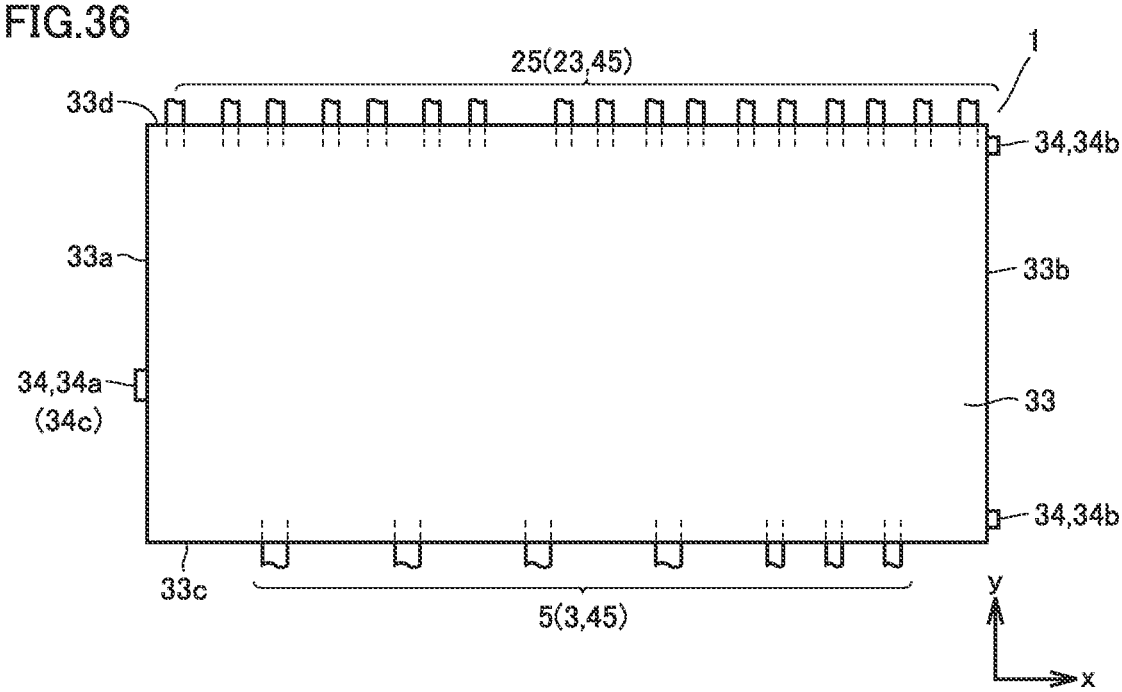
FIG. 36 is a plan view of the appearance of a semiconductor device manufactured using the mold die shown in FIG. 34 in the same embodiment.

Subsequently, the mold die is detached in the same manner as the step shown in FIG. 22 and FIG. 23, resulting in a semiconductor device sealed with mold resin. As shown in FIG. 36, in the completed semiconductor device 1, specifically, two resin reservoir traces 34*b* are left on second side portion 33*b*.

In the method of manufacturing a semiconductor device described above, each resin reservoir gate 65 (65*a*, 65*b*) is arranged at a position (the Y-axis direction) away from the position (the Y-axis direction) of runner 61 in the Y-axis direction (positive or negative). The time taken for fluid resin 83 injected from runner 61 to reach resin reservoir gate 65 is therefore longer, as with mold die 51 shown in FIG. 26.

Therefore, even if voids remain in a portion of fluid resin 83 located at region 85, the voids are eliminated from region 85 (position 87) while fluid resin 83 reaches resin reservoir gate 65 and attempts to flow into the resin reservoir. As a result, the electrical insulation on the first main surface 33*e* side in mold resin 33 (see FIG. 3 and the like) can be reliably ensured.

In mold die 51 described above, a sufficient volume of resin reservoir 63 can be ensured. In manufacturing a semiconductor device, a lead frame may have a positioning hole for a mold die. In such a case, the length in the Y direction of the resin reservoir is limited, and the capacity of the resin reservoir may be insufficient.

In the mold die described above, a sufficient capacity of resin reservoir 65 can be ensured with two resin reservoirs 65*a* and 65*b* while such a positioning hole (not shown) in the frame is circumvented. Since a sufficient capacity of resin reservoir 65 is ensured, voids are eliminated reliably even if voids remain in region 85 (see FIG. 19 and the like).

Furthermore, in mold die 51 described above, wear of a die punch for removing a portion of mold resin flowing into resin reservoir 65 and hardened can be suppressed. Mold die 51 has two resin reservoirs 65*a* and 65*b* as resin reservoir 65. This configuration can reduce the cross-sectional area of the die punch that removes a portion of mold resin flowing into each of resin reservoirs 65*a* and 65*b* and hardened. Therefore, compared with one die punch having a large cross-sectional area, wear of the die punch can be suppressed, thereby contributing to reduction in production cost.

Third Embodiment

A semiconductor manufacturing apparatus according to a third embodiment will be described.
(Mold Die)

Figure 37:
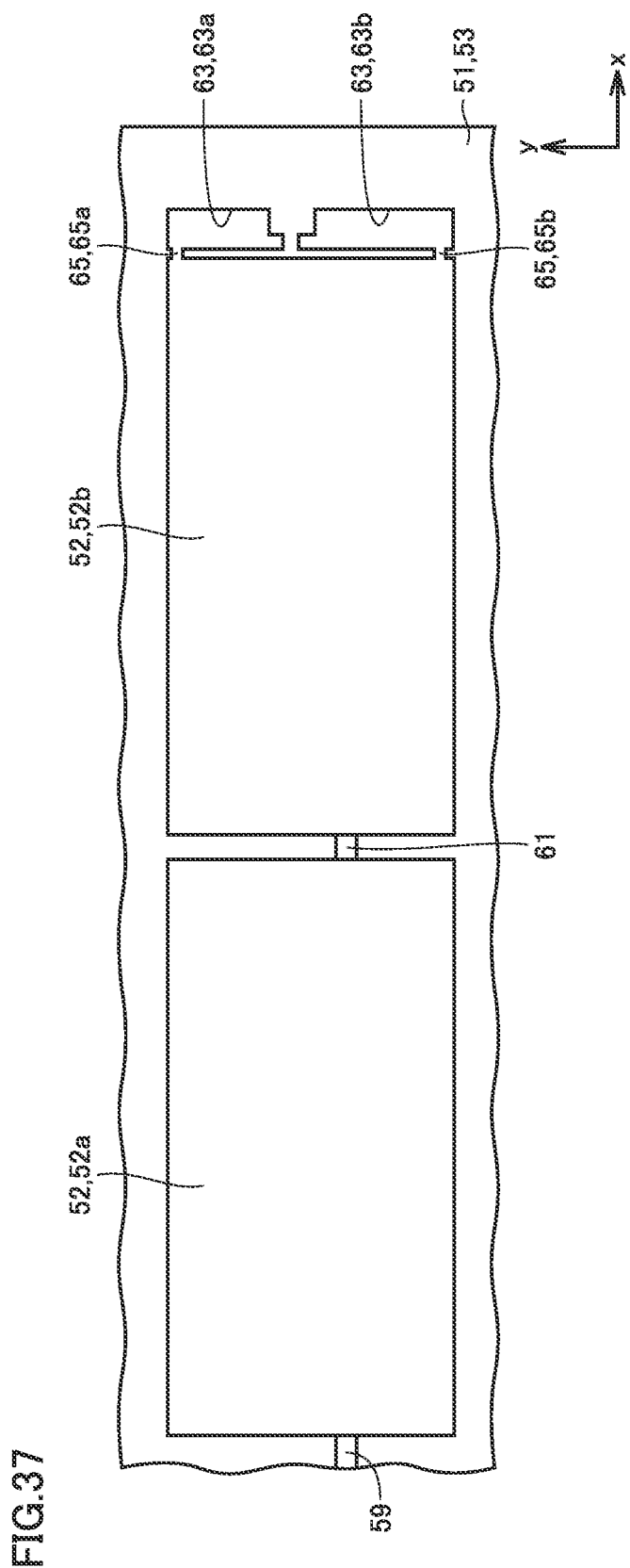
FIG. 37 is a plan view of a structure of the lower die in the mold die according to a third embodiment.

As shown in FIG. 37, mold die 51 (lower die 53) as a semiconductor manufacturing apparatus has, for example, a resin reservoir 63*a* and a resin reservoir 63*b* as resin reservoir 63. A resin reservoir gate 65*a* is formed to communicatively connect second cavity 52*b* and resin reservoir 63*a*. A resin reservoir gate 65*b* is formed to communicatively connect second cavity 52*b* and resin reservoir 63*b*. In each of resin reservoir gate 65*a* and resin reservoir gate 65*b*, a movable pin serving as a shutter is not arranged.

Figure 38:
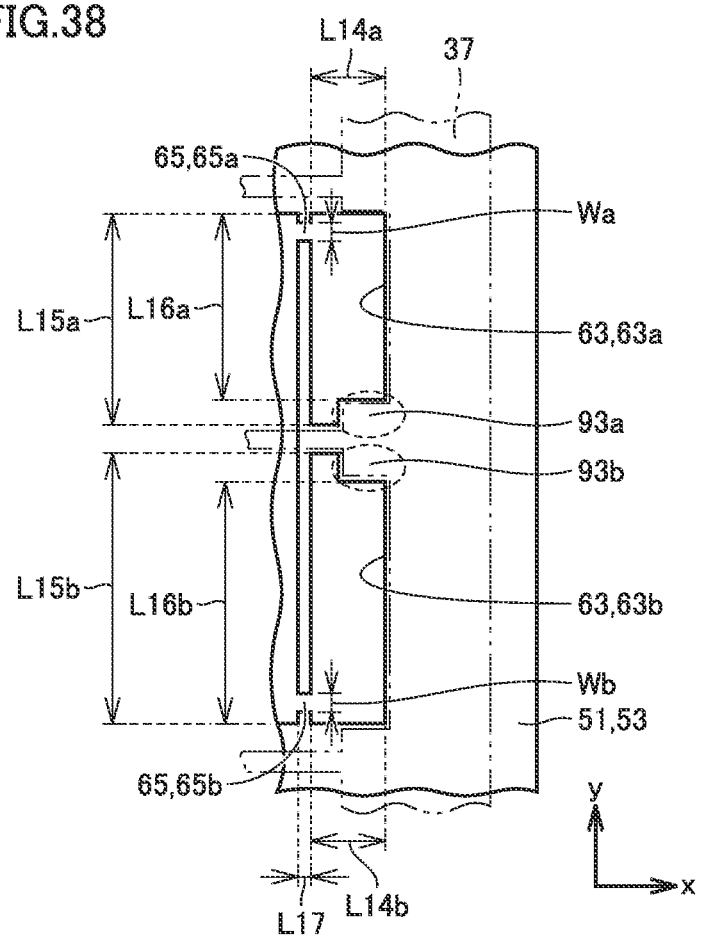
FIG. 38 is a partially-enlarged plan view of the lower die shown in FIG. 37 in the same embodiment.

As shown in FIG. 38, lower die 53 has a protrusion 93*a* protruding toward resin reservoir 63*a* and a protrusion 93*b* protruding toward resin reservoir 63*b*. When a portion of mold resin flowing into resin reservoir 63 and hardened is removed by a die punch, frame 37 is supported from below by a portion of lower die 53 including protrusions 93*a* and 93*b*.

In resin reservoir 63*a*, the length in the Y-axis direction of a portion of resin reservoir 63*a* where protrusion 93*a* is located in the X-axis direction is defined as length L16*a*. The length in the Y-axis direction of a portion of resin reservoir 63*a* where protrusion 93*a* is not located in the X-axis direction is defined as length L15*a*. The length L16*a* is preferably shorter than the length L15*a*.

In resin reservoir 63*b*, the length in the Y-axis direction of a portion of resin reservoir 63*b* where protrusion 93*b* is located in the X-axis direction is defined as length L16*b*. The length in the Y-axis direction of a portion of resin reservoir 63*b* where protrusion 93*b* is not located in the X-axis direction is defined as length L15*b*. The length L16*b* is preferably shorter than the length L15*b*.

The length L15*a* and the length L15*b* may be different lengths or may be the same length. The length L16*a* and the length L16*b* may be different lengths or may be the same length.

In resin reservoir 63*a*, the length in the X-axis direction of a portion of resin reservoir 63*a* where protrusion 93*a* is not located in the Y-axis direction is defined as length L14*a*. In resin reservoir 63*b*, the length in the X-axis direction of a portion of resin reservoir 63*b* where protrusion 93*b* is not located in the Y-axis direction is defined as length L14*b*. It is preferable that the length L14*a* and the length L14*b* are set to a length about half the width of frame 37. This configuration can ensure a region where frame 37 is held down when a portion of mold resin flowing into resin reservoir 63 and hardened is removed by a die punch.

As shown in FIG. 37, resin reservoir gate 65*a* is arranged at a position (the Y-axis direction) away from the position (the Y-axis direction) of runner 61 in the Y-axis positive direction. Resin reservoir gate 65*b* is arranged at a position (the Y-axis direction) away from the position (the Y-axis direction) of runner 61 in the Y-axis negative direction. It is preferable that each of resin reservoir gate 65*a* and resin reservoir gate 65*b* is arranged at a position as far as possible from region 85 (position 87) below small die pad 15 (15C) (see FIG. 19 and the like) in which fluid resin is finally filled when the lead frame is arranged in mold die 51.

It is preferable that resin reservoir gate 65*a* is arranged at a position about 0.5 to 2.0 mm away in the Y-axis negative direction from a portion extending in the X-axis direction (the upper portion in the drawing) in second cavity 52*b*. It is preferable that resin reservoir gate 65*b* is arranged at a position about 0.5 to 2.0 mm away in the Y-axis positive direction from a portion extending in the X-axis direction (the lower portion in the drawing) in second cavity 52*b*. This configuration can prevent chipping of the mold resin of the semiconductor device when a portion of mold resin flowing into resin reservoir 63 and hardened is removed by a die punch.

The length in the Y-axis direction of resin reservoir gate 65*a* is defined as width Wa. The length in the Y-axis direction of resin reservoir gate 65*b* is defined as width Wb. The width Wa and the width Wb are preferably as small as possible. The width Wa and the width Wb are preferably equal to or smaller than about half the width LY1 (see FIG. 9) of resin injection gate 59 and the width of runner 61. The width Wa and the width Wb are preferably, for example, about 0.5 to 15 mm so that a portion of mold resin flowing into resin reservoir 63 and hardened is easily removed from lower die 53.

The length (height) in the Z direction of each of resin reservoir gate 65*a* and resin reservoir gate 65*b* is preferably as small as possible. The length in the Z direction is preferably, for example, about 0.2 to 0.6 mm so that a portion of mold resin flowing into resin reservoir 63 and hardened is easily removed from lower die 53. The length in the X-axis direction of each of resin reservoir gate 65*a* and resin reservoir gate 65*b* is defined as length L17. An appropriate length is set as the length L17 in consideration of the opening cross-sectional area of resin reservoir gate 65 and the like.
(Method of Manufacturing Semiconductor Device)

A method of manufacturing a semiconductor device using the mold die described above will now be described. First, a plurality of semiconductor devices including a lead frame having power semiconductor elements and the like mounted thereon before sealed with mold resin are formed in the same manner as the method of manufacturing a semiconductor described above.

Figure 39:
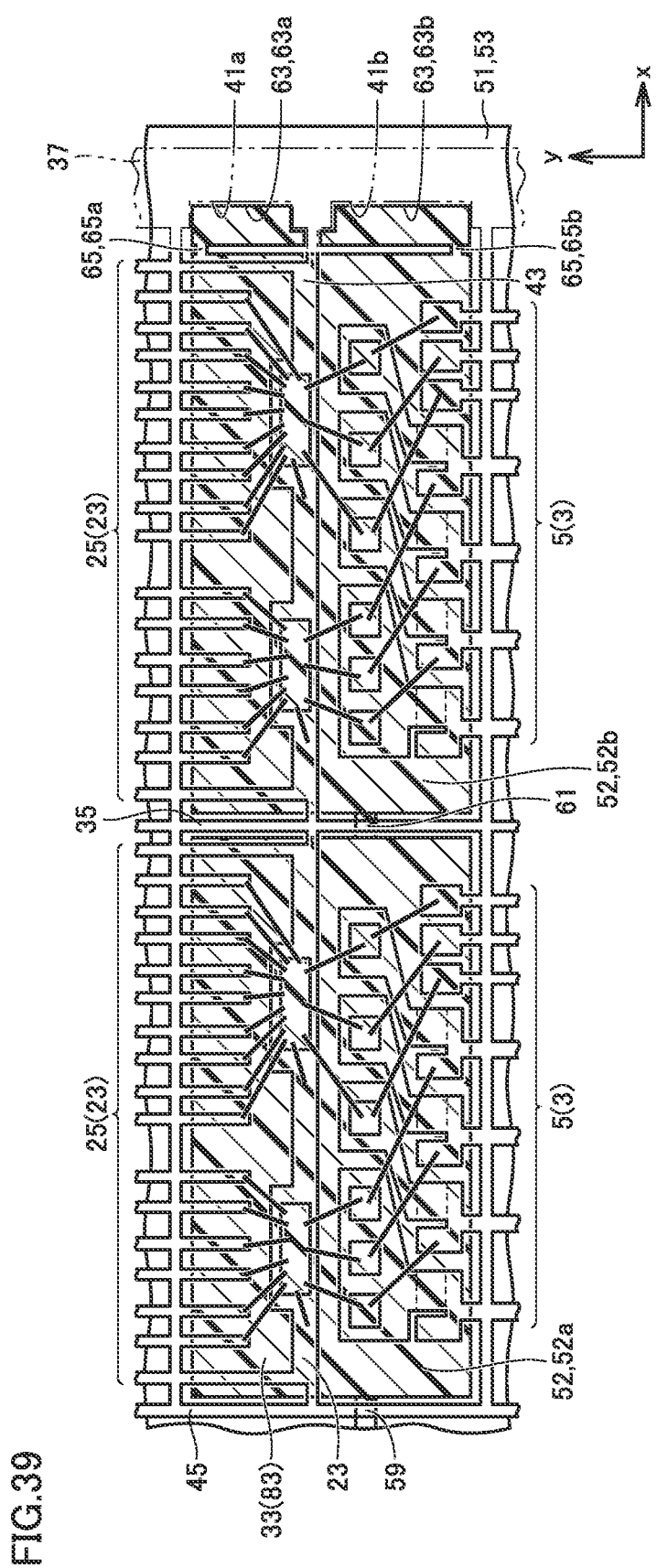
FIG. 39 is a plan view showing a step of the method of manufacturing a semiconductor device using the mold die shown in FIG. 37 in the same embodiment.

Next, the semiconductor devices are sealed with mold resin by transfer molding. As shown in FIG. 39, lead frame 45 having power semiconductor elements 21 and the like mounted thereon is arranged in mold die 51. Here, frame 37 of lead frame 45 has notches 41*a* and 41*b*. Notch 41*a* is formed so as to expose resin reservoir 39*a*. Notch 41*b* is formed so as to expose resin reservoir 39*b*.

Lead frame 45 has a suspender lead 43 connecting IC lead 23 to frame 37 in order to prevent IC lead 23 from being displaced vertically (the Z-axis direction) in cavity 52 when fluid resin is injected.

After lower die 53 and the upper die (not shown) are clamped, fluid resin 83 is injected into cavity 52 (52*a*) from resin injection gate 59. Fluid resin 83 injected into first cavity 52*a* flows through runner 61 and is injected into second cavity 52*b* to gradually fill second cavity 52*b*.

Meanwhile, as previously mentioned, fluid resin 83 flowing through region RC1 finally flows from region RC1 into region RC2 and ultimately merges with fluid resin 83 flowing through region RC2 at region 85 (position 87) below small die pad 15 (15C) (see FIG. 17 and FIG. 19).

When fluid resin 83 flowing through region RC1 and fluid resin 83 flowing through region RC2 merge at region 85, the air tends to be trapped in fluid resin 83, and if the trapped air is not collapsed, it may remain as voids in fluid resin 83 (mold resin).

Next, fluid resin 83 is injected from runner 61, so that fluid resin 83 in second cavity 52*b* attempts to flow into resin reservoir 63*a* through resin reservoir gate 65*a* or attempts to flow into resin reservoir 63*b* through resin reservoir gate 65*b*.

At this time, a portion of fluid resin 83 located at region 85 also flows toward resin reservoir gate 65. Thus, even if voids remain in a portion of fluid resin 83 located at region 85, the voids are eliminated from region RC2.

Subsequently, the mold die is detached in the same manner as in the step shown in FIG. 22 and FIG. 23, resulting in a semiconductor device sealed with mold resin. In the completed semiconductor device 1, two resin reservoir traces 34*b* are left on second side portion 33*b*, in the same manner as semiconductor device 1 shown in FIG. 36.

In the method of manufacturing a semiconductor device described above, each resin reservoir gate 65 (65*a*, 65*b*) is arranged at a position (the Y-axis direction) away from the position (the Y-axis direction) of runner 61 in the Y-axis direction (positive or negative). Therefore, even if voids remain in a portion of fluid resin 83 located at region 85, the voids are eliminated from region 85 (position 87) while fluid resin 83 attempts to flow into resin reservoir 63 through resin reservoir gate 65, in the same manner as described above. As a result, the electrical insulation on the first main surface 33*e* side in mold resin 33 (see FIG. 3) can be reliably ensured.

Furthermore, frame 37 has notches 41*a* and 41*b*. Notch 41*a* is formed so as to expose resin reservoir 39*a*. Notch 41*b* is formed so as to expose resin reservoir 39*b*. With this configuration, when a portion of mold resin flowing into each of resin reservoirs 63*a* and 63*b* and hardened is removed by a die punch, the die punch can be brought into contact with the portion of mold resin and efficiently remove it without coming into contact with frame 37.

Furthermore, since frame 37 has notches 41*a* and 41*b*, the capacity of resin reservoirs 63*a* and 63*b* can be increased by the amount corresponding to the volume of notches 41*a* and 41*b* (the area in the XY plane of notches 41*a* and 41*b*×the thickness of frame 37).

In addition, since frame 37 has notches 41*a* and 41*b*, compared with when no notch is formed, the cross-sectional area of a portion connecting to the air vent (not shown) is increased. With this configuration, more air can be introduced into the air vent, and the amount of air trapped in the fluid resin can be reduced, thereby suppressing remaining voids.

Furthermore, in the method of manufacturing a semiconductor device described above, when suspender lead 43 is stripped by a die punch (not shown), the area where frame 37 is supported by lower die 53 is ensured because of protrusion 93*a* and protrusion 93*b* formed in lower die 53. This configuration ensures that suspender lead 43 is stripped.

Figure 40:
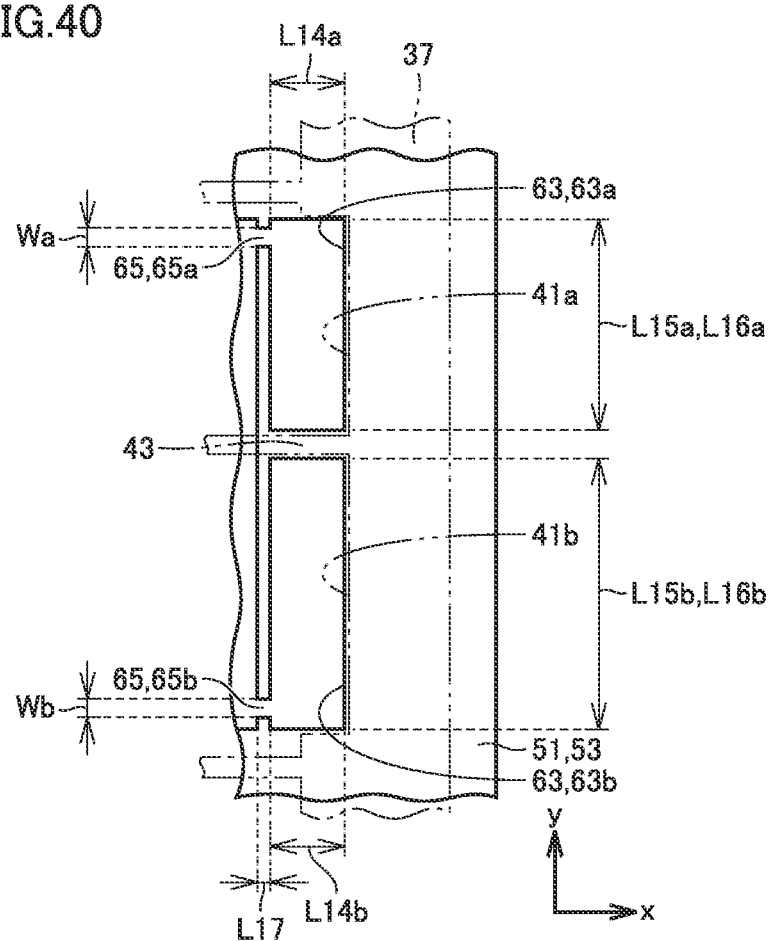
FIG. 40 is a partially-enlarged plan view of the lower die in the mold die according to a first modification in the same embodiment.

In the semiconductor manufacturing apparatus described above, mold die 51 (lower die 53) has protrusion 93*a* and protrusion 93*b*. As shown in FIG. 40, mold die 51 may be mold die 51 that does not have protrusion 93*a* or protrusion 93*b*. In this case, it is preferable that a portion of mold resin flowing into each of resin reservoirs 63*a* and 63*b* and hardened and suspender lead 43 are simultaneously removed by a die punch (not shown).

Figure 41:
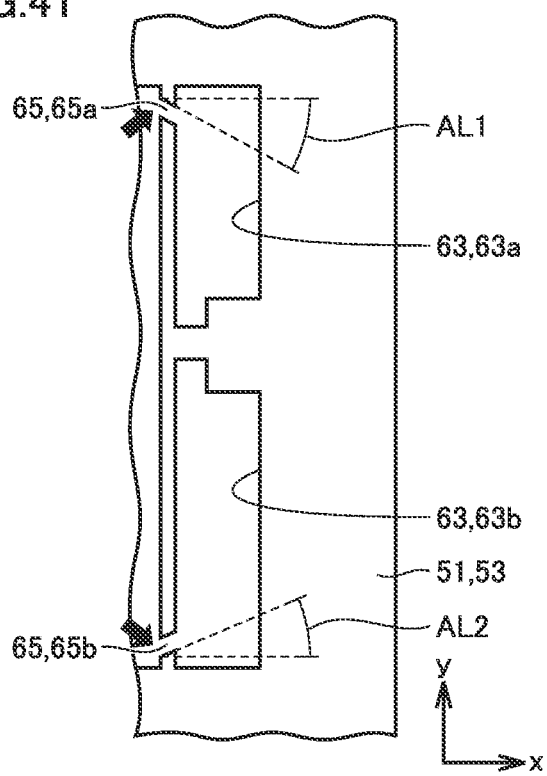
FIG. 41 is a partially-enlarged plan view of the lower die in the mold die according to a second modification in the same embodiment.

In the semiconductor manufacturing apparatus described above, resin reservoir gate 65 (65*a*, 65*b*) extends in the X-axis direction. As shown in FIG. 41, in mold die 51, the direction in which resin reservoir gate 65 (65*a*, 65*b*) extends may be inclined in a direction intersecting the X-axis direction.

Resin reservoir gate 65*a* may be inclined in the Y-axis direction (negative direction), for example, by an angle AL1 relative to the X-axis direction. Resin reservoir gate 65*b* may be inclined in the Y-axis direction (positive direction), for example, by an angle AL2 relative to the X-axis direction.

When such a mold die 51 is employed, the fluid resistance of the fluid resin flowing through resin reservoir gates 65*a* and 65*b* is increased, and remaining voids can be suppressed while the amount of fluid resin flowing into resin reservoirs 63*a* and 63*b* is reduced.

Figure 42:
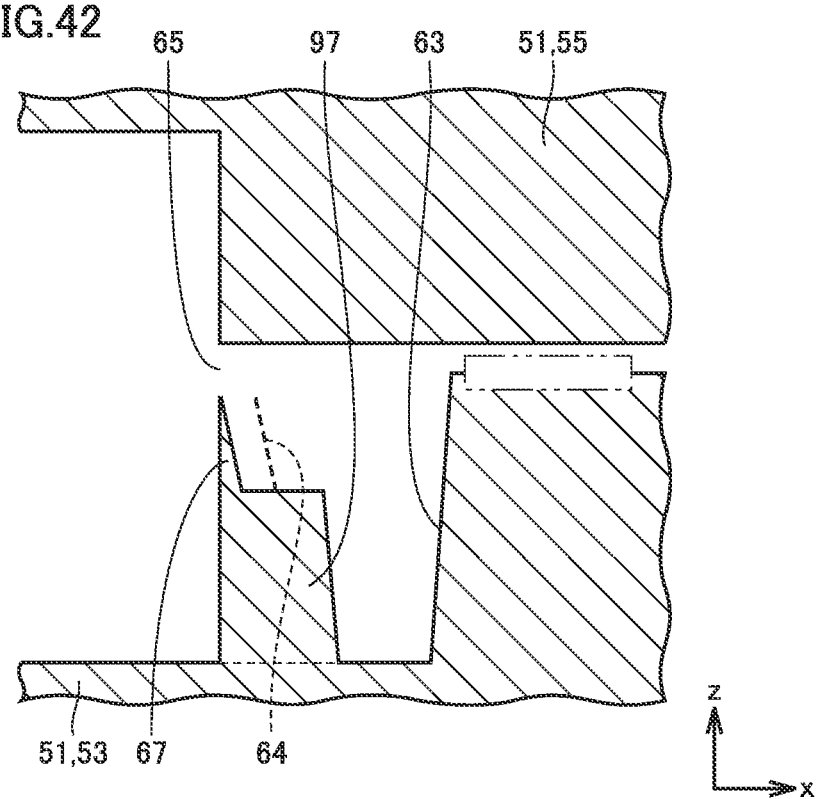
FIG. 42 is a partially-enlarged cross-sectional view of the mold die according to a third modification in the same embodiment.
Figure 43:
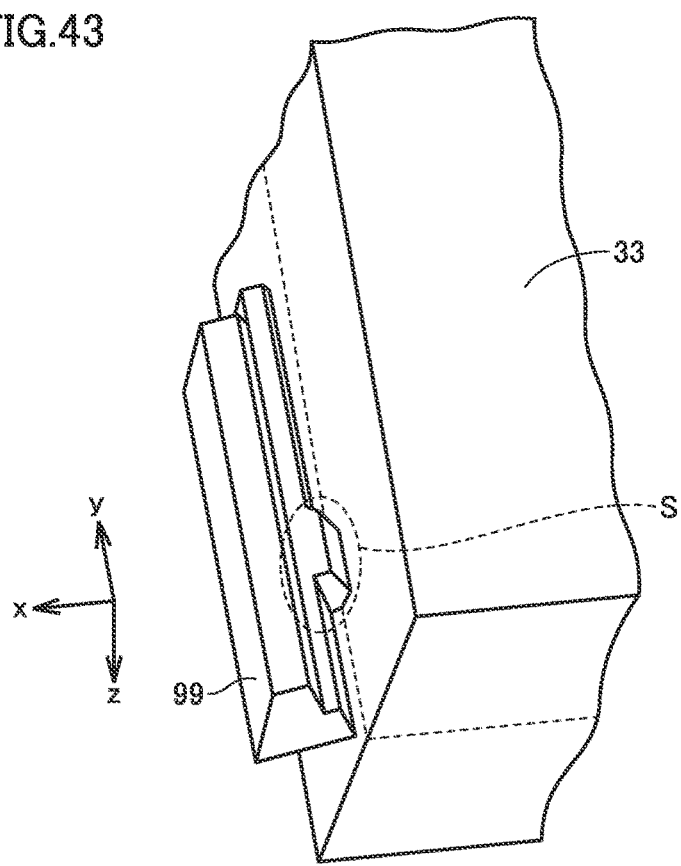
FIG. 43 is a partially-enlarged perspective view of a semiconductor device removed from the mold die shown in FIG. 42 in the same embodiment.

As shown in FIG. 42, a step portion 97 may be provided, together with inclined portion 67 on the side closer to resin reservoir gate 65 at a portion of resin reservoir 63. Such a step portion 97 can widen the gap between mold resin 33 and mold resin 99 flowing into resin reservoir 63 and hardened, as shown in FIG. 43 (dotted frame S). Thus, the hardened mold resin 99 can be easily removed from mold resin 33 by a die punch (not shown).

Figure 44:
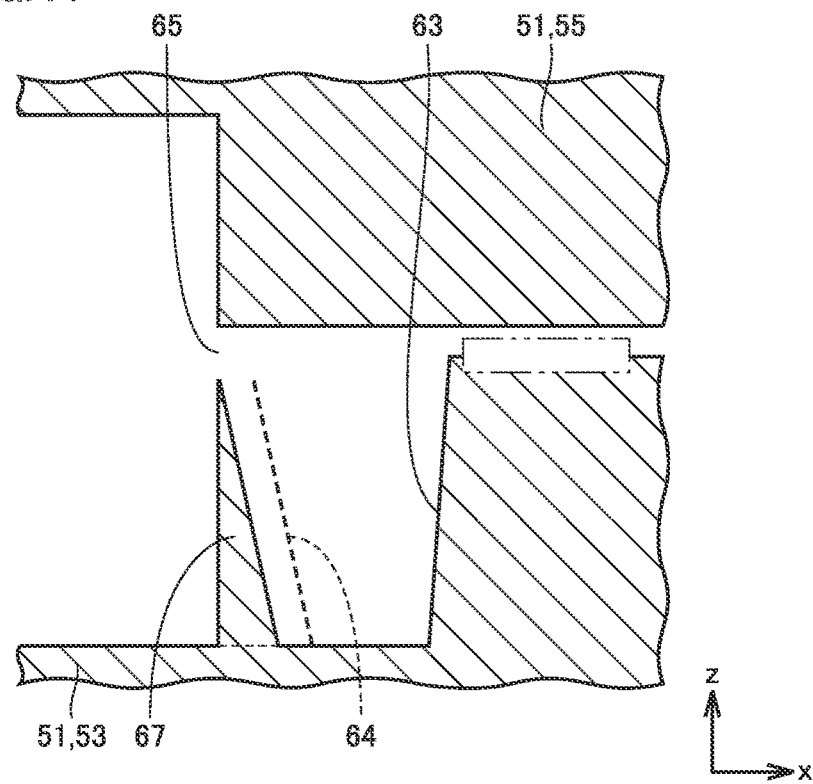
FIG. 44 is a partially-enlarged cross-sectional view of the mold die according to a fourth modification in the same embodiment.

As shown in FIG. 44, mold die 51 does not necessarily have a step portion in terms of keeping the capacity of resin reservoir 63 as much as possible. In each of FIG. 42 and FIG. 44, an inclined portion 64 provided at a portion of resin reservoir 63 in which resin reservoir gate 65 is not located is depicted by a dotted line resin.

In resin reservoir 63 of mold die 51 described above, because of the provision of resin reservoir gate 65 having a smaller opening cross-sectional area and communicatively connected to resin reservoir 63, the flow of fluid resin 83 into resin reservoir 63 is suppressed, compared with the technique in the comparative example (PTL 1). Furthermore, since resin reservoir gate 65*a* and resin reservoir gate 65*b* are provided as resin reservoir gate 65, the flow of fluid resin toward resin reservoir gate 65 is distributed.

With this configuration, even when the capacity of resin reservoir 63 is equivalent to about one tenth of the volume of semiconductor device 1, the time taken for fluid resin 83 to flow into resin reservoir 63 can be prolonged. As a result, even if voids remain in a portion of fluid resin 83 located at region 85 (see FIG. 19), the voids can be eliminated from region 85 (position 87) before fluid resin 83 flows into resin reservoir 63. Furthermore, the amount of fluid resin 83 flowing into resin reservoir 63 can be reduced, thereby contributing to reduction in production cost.

In the completed semiconductor device 1, resin injection trace 34*a* and runner trace 34*c* are left on a surface of semiconductor device 1 sealed in first cavity 52*a*. The area of resin injection trace 34*a* and the area of runner trace 34*c* are substantially the same (see FIG. 6). On the other hand, runner trace 34c and resin reservoir trace 34b are left on a surface of semiconductor device 1 sealed in second cavity 52b. The area of resin reservoir trace 34b is smaller than the area of runner trace 34c (see FIG. 1). The surface of resin trace 34 including resin reservoir trace 34b is coarse and can be easily recognized from the appearance (mold resin 33) of semiconductor device 1.

Fourth Embodiment

A semiconductor manufacturing apparatus according to a fourth embodiment will be described. Here, a semiconductor manufacturing apparatus employing a mold die in which mold resin flowing into resin reservoir 63 and hardened can be used for mounting will be described.

Figure 47:
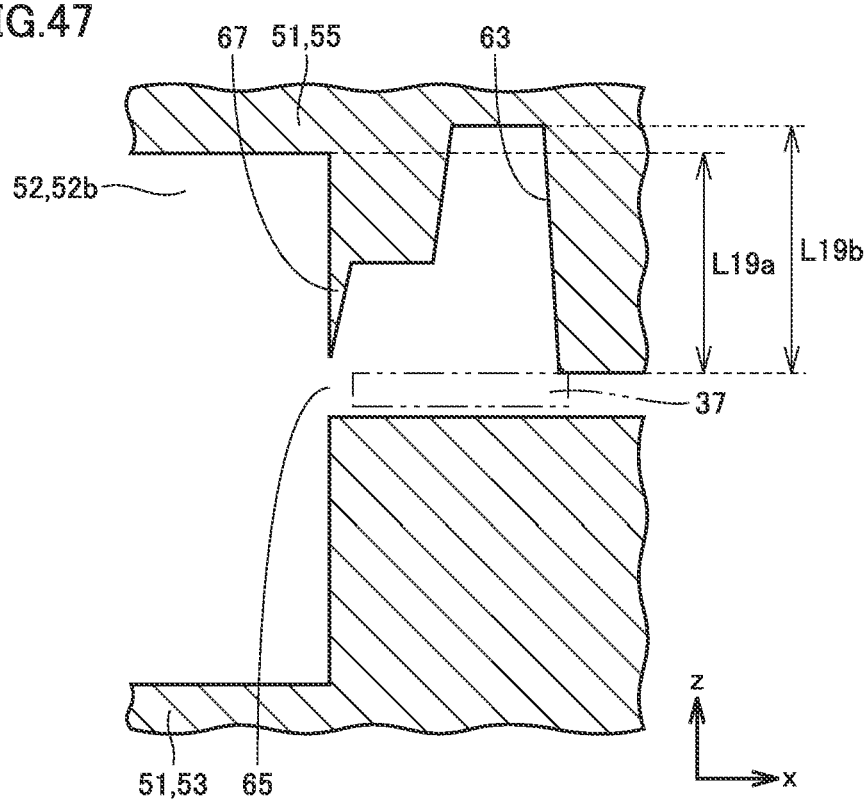
FIG. 47 is a partially-enlarged cross-sectional view of the resin reservoir gate in the mold die according to a fourth embodiment.

First, a mold die will be described. As shown in FIG. 47, in mold die 51, upper die 55 has resin reservoir gate 65 and resin reservoir 63. The position (the Z-axis direction) of the ceiling of resin reservoir 63 is arranged at a position higher than the position (the Z-axis direction) of the ceiling of cavity 52.

The distance from the lower end of upper die 55 to the ceiling of cavity 52 is defined as distance L19a, and the distance from the lower end of upper die 55 to the ceiling of resin reservoir 63 is defined as distance L19b. In mold die 51, resin reservoir 63 is formed in upper die 55 such that the distance L19b is longer than the distance L19a.

A method of manufacturing a semiconductor device using mold die 51 described above will now be described. Lead frame 45 having power semiconductor elements 21 and the like mounted thereon is formed in the same manner as the method of manufacturing a semiconductor device described in the first embodiment (see FIG. 15). Next, lead frame 45 (see FIG. 15) is arranged in mold die 51 shown in FIG. 47.

Next, cavity 52 is gradually filled with fluid resin, in the same manner as in the step shown in FIG. 16 to FIG. 21. In resin reservoir 63, the fluid resin flowing into the resin reservoir 63 is hardened. Subsequently, mold die 51 is detached. At this time, mold resin 99 (see FIG. 48) flowing into resin reservoir 63 and hardened is not removed, and mold resin 99 is left connected to mold resin 33. Thus, semiconductor device 1 (see FIG. 48) is completed with mold resin 99 as a sealing material mass being connected to mold resin 33.

Figure 48:
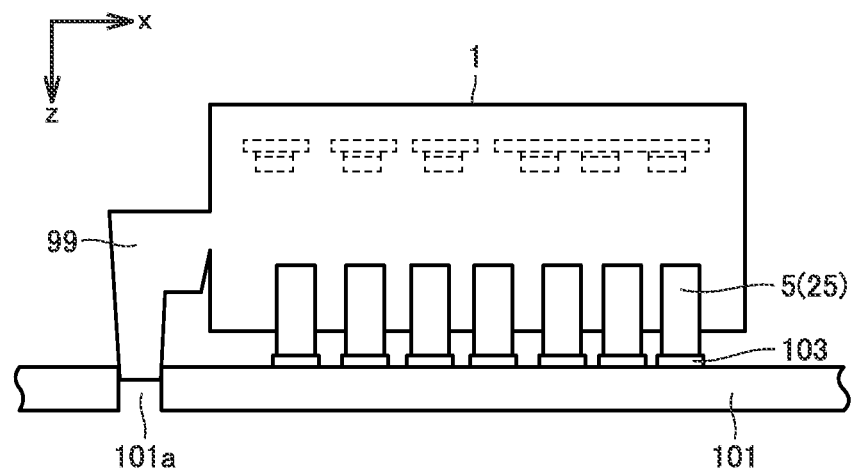
FIG. 48 is a first side view including a partial cross section showing a state in which the semiconductor device formed with the mold die is mounted on an electronic circuit board in the same embodiment.
Figure 49:
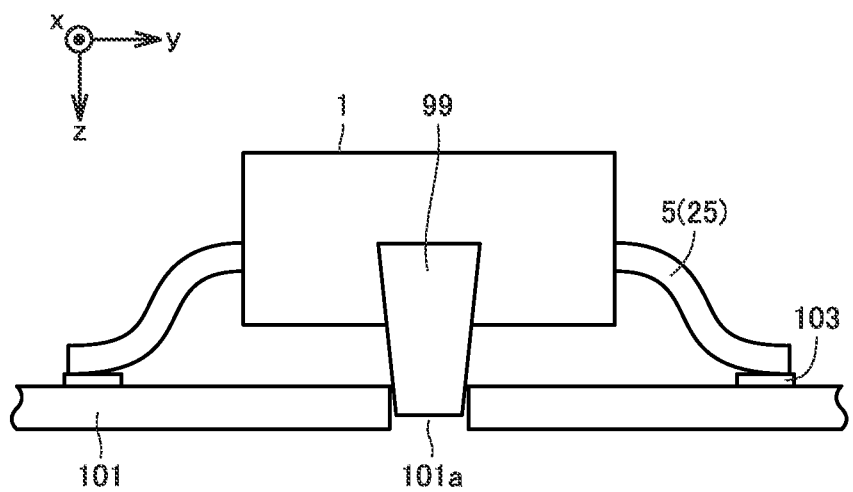
FIG. 49 is a second side view including a partial cross section showing a state in which the semiconductor device formed with the mold die is mounted on an electronic circuit board in the same embodiment.

Next, as shown in FIG. 48 and FIG. 49, semiconductor device 1 is mounted on an electronic circuit board 101. Semiconductor device 1 is arranged on electronic circuit board 101 with conductive adhesive 103 interposed. At this time, mold resin 99 is fitted in an opening 101a provided in advance in electronic circuit board 101. Cream solder, for example, is used as conductive adhesive 103.

Next, conductive adhesive 103 is melted by reflowing and then cooled, whereby conductive adhesive 103 is hardened, resulting in semiconductor device 1 mounted on electronic circuit board 101.

When semiconductor device 1 described above is mounted on electronic circuit board 101, displacement of semiconductor device 1 in the reflowing step can be prevented. This will be described.

The weight of semiconductor device 1 having power semiconductor elements and the like mounted thereon is heavier than the weight of a conventional surface-mounted component mounted on an electronic circuit board. The adhesive force of conductive adhesive 103 before conductive adhesive 103 is hardened is weaker than the bonding force after conductive adhesive 103 is hardened.

In the reflowing step, therefore, the adhesive force of conductive adhesive 103 is unable to keep semiconductor device 1 fixed on electronic circuit board 101, for example, when electronic circuit board 101 is transported, and semiconductor device 1 may be displaced from the mounting position on electronic circuit board 101.

In semiconductor device 1 described above, mold resin 99 is left connected to mold resin 33. Electronic circuit board 101 has opening 101a in which mold resin 99 is fitted. When semiconductor device 1 is arranged on electronic circuit board 101, mold resin 99 is fitted in opening 101a provided in electronic circuit board 101.

Thus, positioning of semiconductor device 1 on electronic circuit board 101 is performed. As a result, displacement of semiconductor device 1 from the mounting position of electronic circuit board 101 can be suppressed in the reflowing step. Furthermore, since displacement of semiconductor device 1 from the mounting position on electronic circuit board 101 is suppressed, the amount of conductive adhesive 103 can be kept to the minimum necessary.

Fifth Embodiment

A semiconductor manufacturing apparatus according to a fifth embodiment will be described. Here, a semiconductor manufacturing apparatus employing a mold die having a plurality of resin reservoirs will be described.

Figure 50:
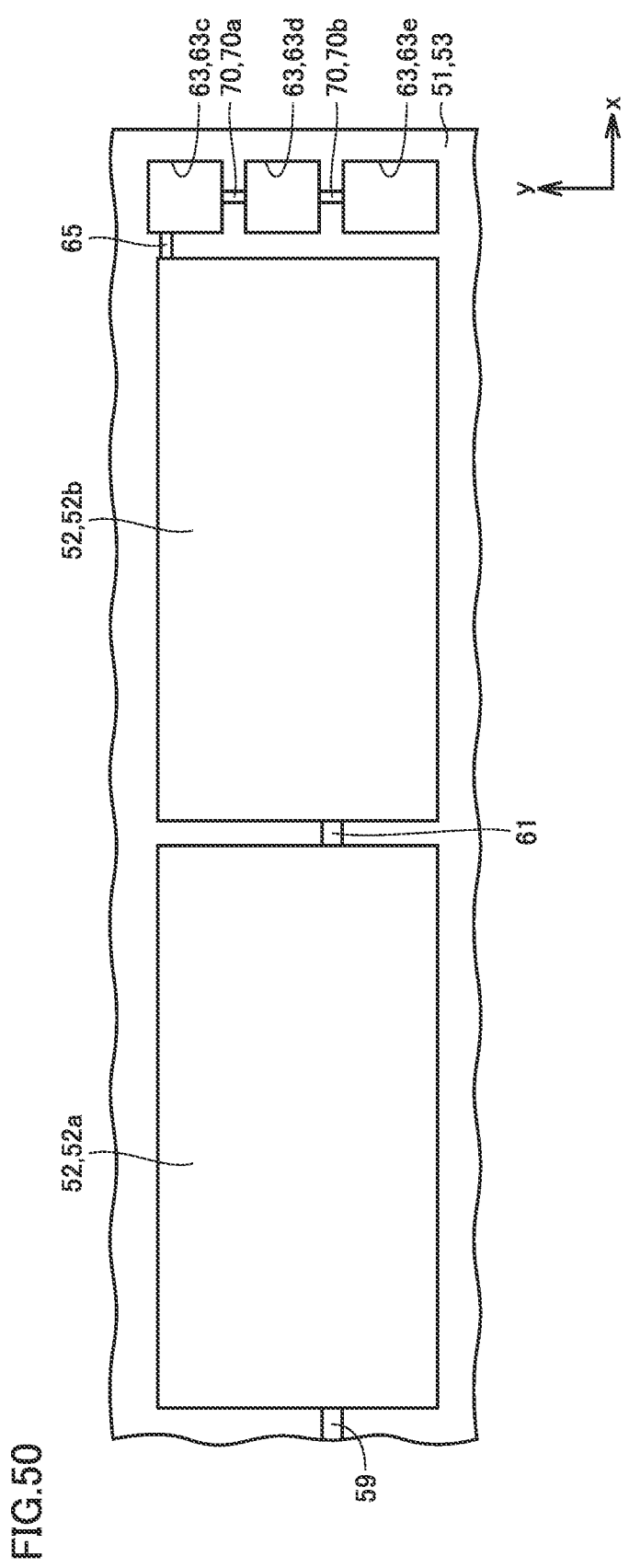
FIG. 50 is a plan view of a structure of the lower die in the mold die according to a fifth embodiment.

First, a mold die will be described. As shown in FIG. 50, mold die 51 (lower die 53) has, for example, a resin reservoir 63c, a resin reservoir 63d, and a resin reservoir 63e as resin reservoir 63. Resin reservoir 63e, resin reservoir 63d, and resin reservoir 63e are connected in series.

A resin reservoir gate 65 is formed to communicatively connect resin reservoir 63c and second cavity 52b. An inter-resin reservoir gate 70 is formed as an inter-sealing material reservoir gate that communicatively connects resin reservoirs 63 to each other. An inter-resin reservoir gate 70a is formed as inter-resin reservoir gate 70 that communicatively connects resin reservoir 63c and resin reservoir 63d. An inter-resin reservoir gate 70b is formed as inter-resin reservoir gate 70 that communicatively connects resin reservoir 63d and resin reservoir 63e. The cross-sectional areas of resin reservoir gate 65 and inter-resin reservoir gates 70a and 70b may be the same or may be different, but preferably are smaller than the cross-sectional area of resin injection gate 59.

The other configuration is similar to the configuration of mold die 51 shown in FIG. 8, and the same member is denoted by the same reference sign and will not be further elaborated unless necessary.

Figure 51:
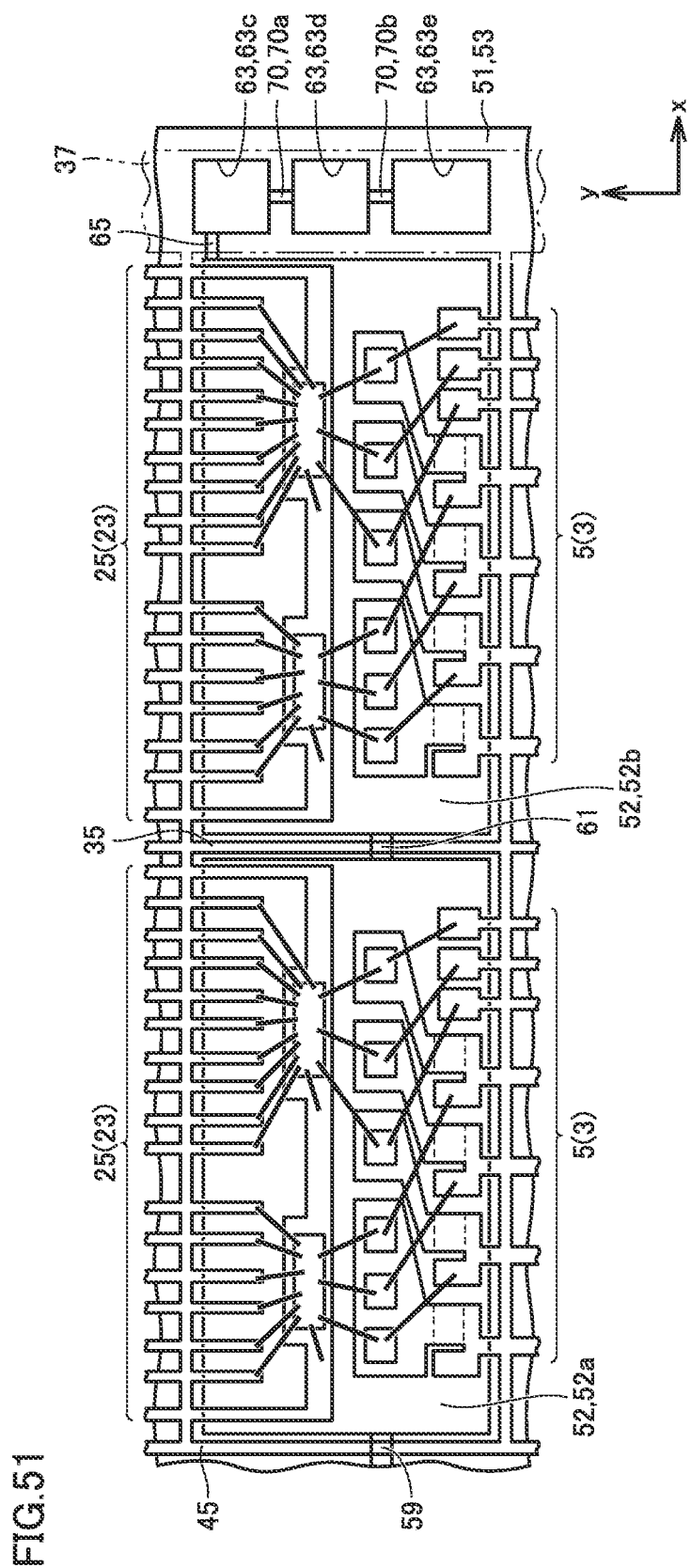
FIG. 51 is a plan view showing a step of the method of manufacturing a semiconductor device using the mold die shown in FIG. 50 in the same embodiment.

A method of manufacturing a semiconductor device using mold die 51 described above will now be described. Lead frame 45 having power semiconductor elements 21 and the like mounted thereon is formed in the same manner as the method of manufacturing a semiconductor device described in the first embodiment (see FIG. 15). Next, as shown in FIG. 51, lead frame 45 is arranged in mold die 51.

Next, cavity 52 is gradually filled with fluid resin, in the same manner as in the step shown in FIG. 16 to FIG. 21. The fluid resin in second cavity 52b flows into resin reservoir 63c through resin reservoir gate 65. When resin reservoir 62 is filled with the fluid resin, the fluid resin flows into resin reservoir 63d through inter-resin reservoir gate 70a. The fluid resin flowing into resin reservoir 63d flows into resin reservoir 63e through inter-resin reservoir gate 70b. After the fluid resin flowing into cavity 52 is hardened, mold die 51 is detached, resulting in a semiconductor device sealed with mold resin.

In the method of manufacturing a semiconductor device described above, mold die 51 has resin reservoir 63*c*, resin reservoir 63*d*, and resin reservoir 63*e* as resin reservoir 63. Resin reservoir 63*c*, resin reservoir 63*d*, and resin reservoir 63*e* are connected in series by inter-resin reservoir gates 70.

Therefore, compared with when a mold die having one resin reservoir having the same capacity as the total capacity of resin reservoir 63*c*, resin reservoir 63*d*, and resin reservoir 63*e* is used, the rate of the fluid resin successively filling resin reservoir 63*c*, resin reservoir 63*d*, and resin reservoir 63*0* is decreased.

Thus, voids in region 85 (see FIG. 17 and the like) in cavity 52 are easily discharged from cavity 52. As a result, the electrical insulation on the first main surface 33*e* side in mold resin 33 (see FIG. 3 and the like) can be ensured.

In the embodiments, power semiconductor elements are taken as an example of semiconductor elements. However, the embodiments can also be applied to semiconductor elements other than power semiconductor elements.

The semiconductor manufacturing apparatuses and the manufacturing methods described in the embodiments can be combined in various ways, if necessary.

The semiconductor device includes the following aspect.
(Note 1)
A semiconductor device comprising:
  a lead terminal;
  a die pad connected to the lead terminal;
  a semiconductor element mounted on the die pad; and
  a sealing material sealing the die pad and the semiconductor element such that a part of the lead terminal is exposed, wherein
  the sealing material has a first side portion and a second side portion opposed to each other at a distance from each other in a first direction,
  the first side portion has a sealing material trace, and
  a sealing material mass protrudes on the second side portion.
(Note 2)
The semiconductor device according to Note 1, further comprising an electronic circuit board having an opening,
  wherein the semiconductor device is mounted on the electronic circuit board with the sealing material mass being fitted in the opening.

Embodiments disclosed here should be understood as being illustrative rather than being limitative in all respects. The scope of the present invention is shown not in the foregoing description but in the claims, and it is intended that all modifications that come within the meaning and range of equivalence to the claims are embraced here.

INDUSTRIAL APPLICABILITY

The present disclosure is effectively utilized in a semiconductor device manufactured by transfer molding and a method of manufacturing the same.

REFERENCE SIGNS LIST

1 power semiconductor device, 3 power lead, 5 power lead terminal, 7, 7*a*, 7*b* lead step portion, 9 large die pad, 11*a*, 11*b*, 11*c* terminal end, 13 bending portion, 15, 15*a*, 15*b*, 15*c* small die pad, 17*a*, 17*b*, 17*c* distal end, 19 conductive adhesive, 21 power semiconductor element, 23 IC lead, 25 IC lead terminal, 27 conductive adhesive, 29 IC element, 31 wire, 33 mold resin, 33*a* first side portion, 33*b* second side portion, 33*c* third side portion, 33*d* fourth side portion, 33*0* first main surface, 33*f* second main surface, 34 resin trace, 34*a* resin injection trace, 34*b* resin reservoir trace, 34*c* runner trace, 35 tie bar, 37 frame, 39, 41*a*, 41*b* notch, 43 suspender lead, 45 lead frame, 51 mold die, 52 cavity, 52*a* first cavity, 52*b* second cavity, 53 lower die, 53*a* upper surface, 55 upper die, 55*a* lower surface, 57 plunger, 59 resin injection gate, 61 runner, 63, 63*a*, 63*b*, 63*c*, 63*d*, 63*e* resin reservoir, 64 inclined portion, 65, 65*a*, 65*b*, 65*c*, 65*d* resin reservoir gate, 66*a*, 66*b* portion, 67 inclined portion, 67*a* top portion, 69 movable pin, 79, 79*a*, 79*b* air vent, 70, 70*a*, 70*b* inter-resin reservoir gate, 81 tablet resin, 83 fluid resin, 85 region, 87 position, 93*a*, 93*b* protrusion, 97 step, 99 mold resin, D diameter, W, Wa, Wb width, AL1, AL2 angle, L10, L11, L12, L14*a*, L14*b*, L15*a*, L15*b*, L16*a*, L16*b*, L17 length, L18 distance, L19*a*, L19*b* length, LZ4, LZ5 height, LY1, LY2 width, 101 electronic circuit board, 101*a* opening, 103 conductive adhesive.

The invention claimed is:

1. A semiconductor manufacturing apparatus, in which a cavity extending in a first direction is formed with a mold die including a lower die and an upper die, a lead frame provided with a semiconductor element and having a large die pad and a small die pad is arranged in the cavity, and a sealing material is injected into the cavity to seal the lead frame together with the semiconductor element, the semiconductor manufacturing apparatus comprising:
  a sealing material injection gate through which the sealing material is injected into the cavity in the first direction;
  at least one sealing material reservoir arranged on an other side at a distance in the first direction from one side on which the sealing material injection gate is arranged with the cavity interposed, the sealing material reservoir storing the sealing material flowing through the cavity; and
  a sealing material reservoir gate communicatively connecting the cavity and the sealing material reservoir, wherein
  the sealing material injection gate has a first opening cross-sectional area,
  the sealing material reservoir gate has a second opening cross-sectional area,
  the second opening cross-sectional area is smaller than the first opening cross-sectional area, and
  the sealing material injection gate is located at a position closer to the large die pad than to the small die pad.

2. The semiconductor manufacturing apparatus according to claim 1, wherein the sealing material reservoir gate and the sealing material reservoir are provided in at least one of the lower die and the upper die.

3. The semiconductor manufacturing apparatus according to claim 1, wherein
  the sealing material reservoir gate has
    a first part located on a side closer to the cavity and having the second opening cross-sectional area, and
    a second part located on a side closer to the sealing material reservoir than the first part and having a third opening cross-sectional area larger than the second opening cross-sectional area.

4. The semiconductor manufacturing apparatus according to claim 3, further comprising an inclined portion inclined from the first part toward the second part.

5. The semiconductor manufacturing apparatus according to claim 1, wherein the sealing material reservoir gate is arranged at a position closest to the sealing material injection gate.

6. The semiconductor manufacturing apparatus according to claim 1, wherein the sealing material reservoir gate is arranged at a position away in a second direction intersecting the first direction from a position closest to the sealing material injection gate.

7. The semiconductor manufacturing apparatus according to claim 1, wherein
the sealing material reservoir includes
a first sealing material reservoir and
a second sealing material reservoir, and
the sealing material reservoir gate has
a first sealing material reservoir gate communicatively connecting the cavity and the first sealing material reservoir and
a second sealing material reservoir gate communicatively connecting the cavity and the second sealing material reservoir.

8. The semiconductor manufacturing apparatus according to claim 1, wherein the sealing material reservoir gate communicatively connects the cavity and the sealing material reservoir in a direction intersecting the first direction.

9. The semiconductor manufacturing apparatus according to claim 1, wherein
the sealing material reservoir at least includes one sealing material reservoir and another sealing material reservoir,
the sealing material reservoir gate communicatively connects the cavity and the one sealing material reservoir, and
the one sealing material reservoir and the other sealing material reservoir are communicatively connected by an inter-sealing material reservoir gate.

10. A method of manufacturing a semiconductor device, comprising the steps of:
preparing a lead frame having a large die pad and a small die pad;
mounting a semiconductor element on the lead frame;
preparing a mold die including a lower die and an upper die and having a cavity extending in a direction formed with the lower die and the upper die;
arranging the lead frame provided with the semiconductor element in the mold die;
injecting a sealing material into the cavity; and
detaching the mold die; wherein
the step of preparing a mold die includes the step of preparing the mold die including
a sealing material injection gate located at a position closer to the large die pad than to the small die pad, having a first opening cross-sectional area and passing the sealing material to inject the sealing material toward the cavity in the direction of the cavity,
at least one sealing material reservoir provided on a second side opposite to a first side on which the sealing material injection gate is arranged with the cavity interposed, the sealing material reservoir storing the sealing material flowing through the cavity, and
a sealing material reservoir gate having a second opening cross-sectional area smaller than the first opening cross-sectional area, and communicatively connecting the cavity and the sealing material reservoir, and
the step of injecting the sealing material into the cavity includes the step of injecting the sealing material until the sealing material filling the cavity flows into the sealing material reservoir.

11. The method of manufacturing a semiconductor device according to claim 10, wherein
the step of detaching a mold die includes the steps of:
removing a portion of the sealing material flowing into the sealing material reservoir from the sealing material filling the cavity; and
removing a portion of the sealing material located at the sealing material injection gate from the sealing material filling the cavity.

12. The method of manufacturing a semiconductor device according to claim 10, wherein
the step of preparing the lead frame includes the step of preparing a portion serving as a lead terminal, and a height position of one or more of the large die pad and the small die pad being different from a height position of the portion serving as a lead terminal,
the step of mounting the semiconductor element on the lead frame includes the step of mounting at least one semiconductor element on the large die pad and at least one semiconductor element on the small die pad,
the step of arranging the lead frame in the mold die includes the step of arranging the lead frame such that a first filling space having a first distance in a height direction is formed between the die pad and a portion of the lower die forming the cavity and that a second filling space having a second distance longer than the first distance in the height direction is formed between the die pad and a portion of the upper die forming the cavity, and
the step of injecting a sealing material includes the step of filling the first filling space and the second filling space with the sealing material.

13. The method of manufacturing a semiconductor device according to claim 10, wherein the step of preparing a lead frame includes the step of preparing the lead frame having a notch not covering a region where the sealing material reservoir is located in a state in which the lead frame is arranged in the mold die.

14. A semiconductor device comprising:
a large die pad on which one semiconductor element is mounted;
a small die pad on which another semiconductor element different from the one semiconductor element is mounted; and
a sealing material sealing the large die pad, the small die pad, the one semiconductor element, and the other semiconductor element, wherein
the sealing material has a first side portion and a second side portion opposed to each other at a distance from each other in a first direction,
the first side portion has a first sealing material trace,
the second side portion has at least one second sealing material trace, the first sealing material trace and the least one second sealing material trace being convex or concave,
the second sealing material trace is smaller in area than the first sealing material trace, and
the first sealing material trace is left at a position closer to the large die pad than to the small die pad.

15. The semiconductor device according to claim 14, wherein the second sealing material trace is left at a position opposed to the first sealing material trace in the first direction in the second side portion.

16. The semiconductor device according to claim 14, wherein
the sealing material includes
a first sealing material portion covering a side on which the one semiconductor element is mounted on the large die pad, and
a second sealing material portion covering a side opposite to the side on which the one semiconductor element is mounted on the large die pad, and
the second sealing material portion has a thickness smaller than a thickness of the first sealing material portion.

17. The semiconductor device according to claim 14, wherein the second sealing material trace is left at a position at a distance along the second side portion from a position opposed to the first sealing material trace in the first direction, in the second side portion.

18. The semiconductor manufacturing apparatus according to claim 1, further comprising:
at least one air vent on a periphery of the cavity.

* * * * *